United States Patent
Lee et al.

(10) Patent No.: US 12,376,243 B2
(45) Date of Patent: Jul. 29, 2025

(54) SLIDABLE ELECTRONIC APPARATUS AND METHOD FOR USING TRANSPARENT DISPLAY IN SAID ELECTRONIC APPARATUS

(71) Applicant: SAMSUNG ELECTRONICS CO., LTD., Suwon-si (KR)

(72) Inventors: Wonho Lee, Suwon-si (KR); Junyoung Choi, Suwon-si (KR); Yongjin Kwon, Suwon-si (KR); Taeyang Song, Suwon-si (KR); Sungho Ahn, Suwon-si (KR); Jonghwa Lee, Suwon-si (KR); Nakhyun Choi, Suwon-si (KR); Yangwook Kim, Suwon-si (KR); Hojin Jung, Suwon-si (KR); Hyunju Hong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 232 days.

(21) Appl. No.: 18/116,040

(22) Filed: Mar. 1, 2023

(65) Prior Publication Data
US 2023/0217614 A1 Jul. 6, 2023

Related U.S. Application Data

(63) Continuation of application No. PCT/KR2021/008353, filed on Jul. 1, 2021.

(30) Foreign Application Priority Data

Sep. 3, 2020 (KR) .......................... 10-2020-0112123
Mar. 22, 2021 (KR) .......................... 10-2021-0036773

(51) Int. Cl.
*H05K 5/02* (2006.01)

(52) U.S. Cl.
CPC .................................. *H05K 5/0217* (2013.01)

(58) Field of Classification Search
CPC .............. H05K 5/0217; H04M 1/0241; H04M 2250/52; H04M 2250/58; H04M 1/0214;
(Continued)

(56) References Cited

U.S. PATENT DOCUMENTS

| 10,708,395 B1 | 7/2020 | Han |
| 11,860,694 B2 * | 1/2024 | Shin ...................... G06F 1/1637 |

(Continued)

FOREIGN PATENT DOCUMENTS

| EP | 2891941 | 7/2015 |
| EP | 3254448 | 12/2017 |

(Continued)

OTHER PUBLICATIONS

International Search Report for PCT/KR2021/008353 mailed Oct. 12, 2021, 5 pages.

(Continued)

*Primary Examiner* — Anthony M Haughton
*Assistant Examiner* — Hung Q Dang
(74) *Attorney, Agent, or Firm* — Nixon & Vanderhye P.C.

(57) ABSTRACT

According to an embodiment of the present disclosure, an electronic apparatus may comprise: a first housing; a second housing configured to slide with respect to the first housing; a display comprising a first display area and a second display area extending from the first display area, positioned on the first housing and the second housing; and a rotating support configured to support the display, the rotating support being rotatably connected to the second housing.

19 Claims, 45 Drawing Sheets

(58) Field of Classification Search
CPC . H04M 1/0237; H04M 1/0268; G06F 1/1616; G06F 1/1652; G06F 1/1677; G06F 1/1624
See application file for complete search history.

(56) References Cited

U.S. PATENT DOCUMENTS

| | | | |
|---|---|---|---|
| 11,910,549 B2* | 2/2024 | Ko | G06F 1/1624 |
| 11,994,910 B2* | 5/2024 | Cho | G06F 1/1652 |
| 12,019,479 B2* | 6/2024 | Han | G06F 1/1652 |
| 2011/0115713 A1 | 5/2011 | Altman et al. | |
| 2013/0150032 A1 | 6/2013 | Pattaswamy et al. | |
| 2015/0094071 A1 | 4/2015 | Hang et al. | |
| 2015/0373480 A1 | 12/2015 | Park | |
| 2016/0029222 A1 | 1/2016 | Su et al. | |
| 2016/0070303 A1 | 3/2016 | Lee et al. | |
| 2017/0243526 A1 | 8/2017 | Lim | |
| 2018/0007602 A1 | 1/2018 | Jamadagni et al. | |
| 2018/0164852 A1* | 6/2018 | Lim | H04M 1/0214 |
| 2018/0198896 A1 | 7/2018 | Kang et al. | |
| 2018/0242446 A1 | 8/2018 | Cho et al. | |
| 2019/0243424 A1 | 8/2019 | Lee et al. | |
| 2020/0033913 A1* | 1/2020 | Yang | H04M 1/0268 |
| 2020/0117245 A1* | 4/2020 | Ou | H04M 1/0216 |
| 2020/0133340 A1 | 4/2020 | Ou et al. | |
| 2020/0249722 A1* | 8/2020 | Cha | G06F 1/1681 |
| 2020/0253069 A1* | 8/2020 | Cha | G06F 1/1681 |
| 2020/0371558 A1 | 11/2020 | Kim et al. | |
| 2022/0039273 A1 | 2/2022 | Zhang et al. | |
| 2023/0389243 A1* | 11/2023 | Cho | H05K 7/20963 |

FOREIGN PATENT DOCUMENTS

| | | |
|---|---|---|
| KR | 10-2015-0146355 | 12/2015 |
| KR | 10-2016-0037405 | 4/2016 |
| KR | 10-2017-0006055 | 1/2017 |
| KR | 10-1784880 | 10/2017 |
| KR | 10-2018-0097356 | 8/2018 |
| KR | 10-2019-0086305 | 7/2019 |
| WO | 2016/125985 | 8/2016 |

OTHER PUBLICATIONS

Written Opinion of the ISA for PCT/KR2021/008353 mailed Oct. 12, 2021, 4 pages.
Extended European Search Report dated Apr. 24, 2024 issued in European Patent Application No. 21864507.5.
Extended European Search Report dated Jan. 19, 2024 issued in European Patent Application No. 21864507.5.

* cited by examiner

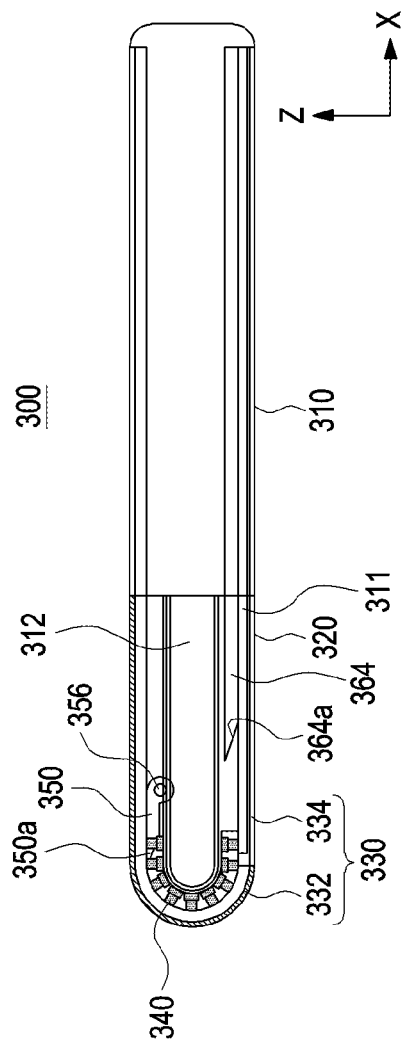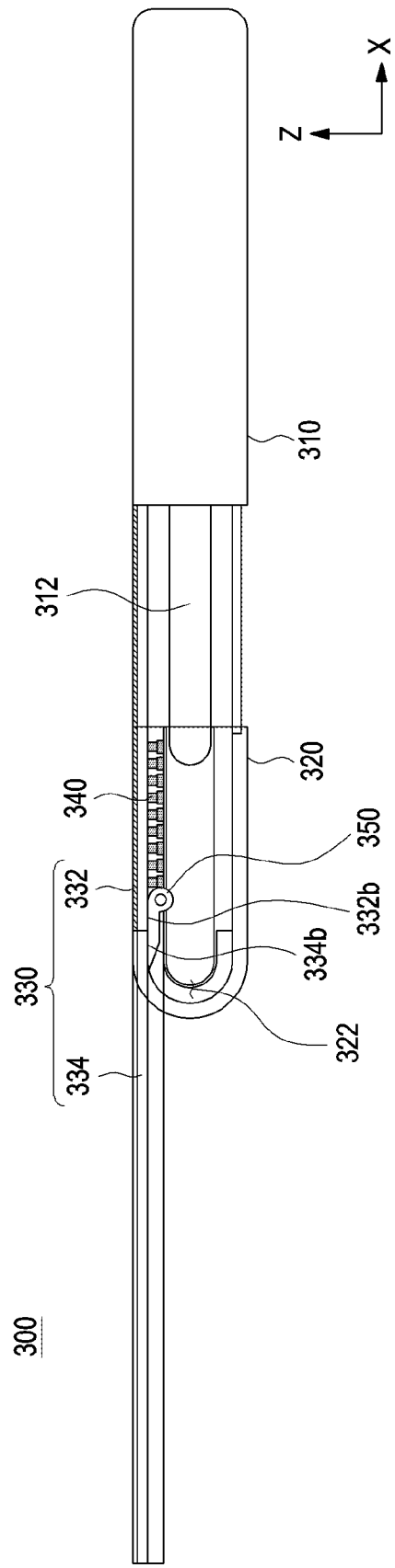

SLIDABLE ELECTRONIC APPARATUS AND METHOD FOR USING TRANSPARENT DISPLAY IN SAID ELECTRONIC APPARATUS

CROSS-REFERENCE TO RELATED APPLICATIONS

This application is a continuation of International Application No. PCT/KR2021/008353, filed Jul. 1, 2021, designating the United States, in the Korean Intellectual Property Receiving Office, and claiming priority to Korean Patent Application No. 10-2020-0112123, filed Sep. 3, 2020, in the Korean Intellectual Property Office, and to Korean Patent Application No. 10-2021-0036773, filed Mar. 22, 2021, in the Korean Intellectual Property Office, the disclosures of all of which are incorporated by reference herein in their entireties.

BACKGROUND

Field

The disclosure relates to a slidable electronic apparatus and a method for using a transparent display in the electronic apparatus.

Description of Related Art

In line with development of information/communication technologies and semiconductor technologies, various functions tend to be integrated in a single portable electronic apparatus. For example, electronic apparatuses may implement not only a communication function, but also an entertainment function (for example, gaming), a multimedia function (for example, music/video playback), communication and security functions for mobile banking and the like, a scheduling function, and an electronic wallet function. Such electronic apparatuses have become compact such that users can conveniently carry the same.

Mobile communication services have been extended to multimedia service areas, and electronic apparatuses need to have sufficiently increased display sizes such that, in addition to voice communication or short message services, users can sufficiently use multimedia services. However, there is a trade-off between the display size of an electronic apparatus and the compactness of the electronic apparatus.

An electronic apparatus (for example, portable terminal) includes a display having a planar shape or having planar and curved shapes. In the case of an electronic apparatus including a display, there may be a restriction on implementing a screen larger than the size of the electronic apparatus, due to the fixed display structure. Therefore, there has been research regarding electronic apparatuses including foldable or rollable displays.

In connection with implementing a foldable or rollable electronic apparatus, there may be difficulty in securing mechanical stability while enabling structures of the electronic apparatus to move (for example, slide) relative to each other. For example, it may be difficult to secure a stable operating structure in a rollable electronic apparatus while securing the portability of the electronic apparatus through compactness.

In addition, no method has been proposed, in connection with an electronic apparatus including a foldable or rollable transparent display, such that the transparent display can be utilized variously.

SUMMARY

Embodiments of the disclosure may provide an electronic apparatus including a display which can be expanded, based on a sliding movement of housings of the electronic apparatus.

Embodiments of the disclosure may provide an electronic apparatus including a pin structure and a rotating member such that an operation of unfolding or folding a display can be implemented stably.

Embodiments of the disclosure may provide a method wherein a transparent display can be used in an electronic apparatus configured such that the transparent display can be used variously according to a function executed in the electronic apparatus.

Problems addressed by the disclosure are not limited to the above-mentioned problems, and may be variously expanded without deviating from the idea and scope of the disclosure.

According to an example embodiment of the disclosure, an electronic apparatus may include: a first housing, a second housing configured to slide with respect to the first housing, a display including a display area located on the first housing and the second housing and a second display area extending from the first display area, and a rotation support rotatably connected to the second housing and configured to support the display.

According to an example embodiment, an electronic apparatus may include: a first housing, a second housing including at least one first reception groove and configured to slide with respect to the first housing, a display including a first display area disposed on the first housing and the second housing, a second display area extending from the first display area, and a display support including a flexible area configured to support the first display area and a rigid area configured to support the second display area, at least one pin structure disposed under the flexible area and configured to slide along the at least one first reception groove, and a rotation support slidably connected to the second housing, aligned to correspond to the at least one first reception groove, and includes at least one second groove configured to receive the at least one pin structure.

An electronic apparatus according to an example embodiment of the present disclosure may include: a flexible display including a first display area and a second display area that is transparent, a camera module including a first camera module and a second camera module, each camera module including a camera, and a processor, wherein the processor may be configured to: execute a camera module application in a first state in which the second display area covers the first camera module, and, based on a property of a first transparent area being changed by adjusting an electrical signal with respect to the first transparent area of the second display area abutting the first camera module, reflect a changed property of the first transparent area on an image received from the first camera module to be displayed on a second transparent area of the second display area or the first display area.

According to an example embodiment of the disclosure, a method for using a transparent display in an electronic apparatus in a flexible display including a first display and a transparent second display area, may comprise: executing a camera module application in a first state in which the second display area covers a first camera module of a camera module, and, based on a property of a first transparent area being changed by adjusting an electrical signal with respect to the first transparent area of the second display area abutting the first camera module, and reflecting a changed property of the first transparent area on an image received from the first camera module to be displayed on a second transparent area of the second display area or the first display area.

An electronic apparatus according to an example embodiment of the disclosure may use a display which can be folded or unfolded, based on a sliding movement of a housing, such that a screen larger than the size of the electronic apparatus can be implemented while securing portability of the electronic apparatus through compactness.

An electronic apparatus according to an example embodiment of the disclosure may support a display using a rotating member and a sliding structure capable of receiving a pin structure protruding from the display.

An electronic apparatus according to an example embodiment of the disclosure may provide convenience such that a transparent display can be used variously according to a function executed in the electronic apparatus.

BRIEF DESCRIPTION OF THE DRAWINGS

The above and other aspects, features and advantages of certain embodiments of the present disclosure will be more apparent from the following detailed description, taken in conjunction with the accompanying drawings, in which:

FIG. 17 is a sectional view illustrating an electronic apparatus including a second rotation member in a folded state according to various embodiments;

FIG. 18 is a sectional view illustrating an electronic apparatus including a second rotation member in an unfolded state according to various embodiments;

DETAILED DESCRIPTION

Figure 1:
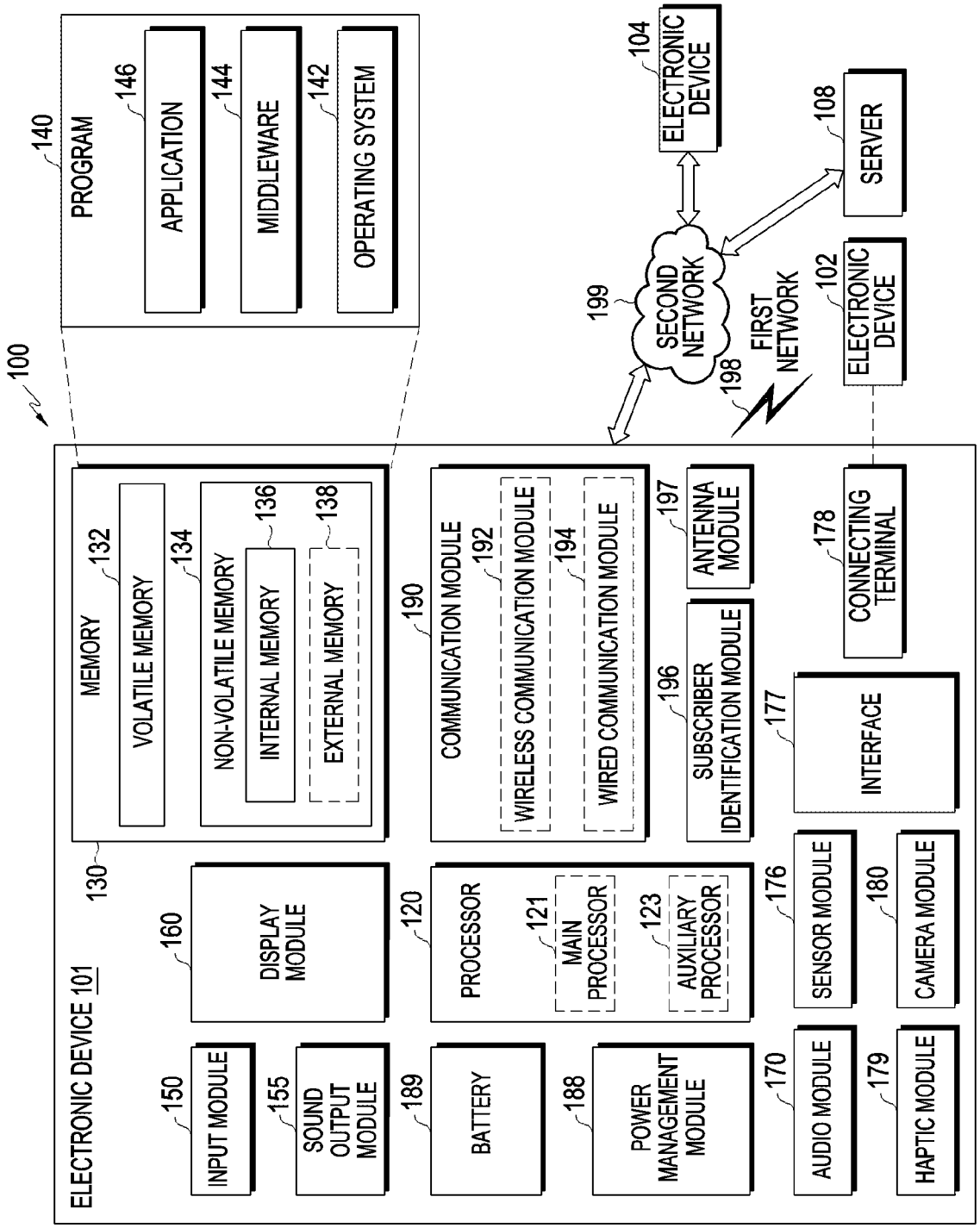
FIG. 1 is a block diagram illustrating an example electronic apparatus in a network environment according to various embodiments.

FIG. 1 is a block diagram illustrating an example electronic apparatus in a network environment according to an embodiment of the disclosure.

Referring to FIG. 1, the electronic apparatus 101 in the network environment 100 may communicate with an electronic apparatus 102 via a first network 198 (e.g., a short-range wireless communication network), or an electronic apparatus 104 or a server 108 via a second network 199 (e.g., a long-range wireless communication network). According to an embodiment, the electronic apparatus 101 may communicate with the electronic apparatus 104 via the server 108. According to an embodiment, the electronic apparatus 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In various embodiments, at least one of the components (e.g., the connecting terminal 178) may be omitted from the electronic apparatus 101, or one or more other components may be added in the electronic apparatus 101. In various embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic apparatus 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic apparatus 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control, for example, at least some of functions or states related to at least one component (e.g., the display module 160, the sensor module 176, or the communication module 190) among the components of the electronic apparatus 101, instead of the main processor 121 while the main processor 121 is in an inactive (e.g., sleep) state, or together with the main processor 121 while the main processor 121 is in an active (e.g., executing an application) state. According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic apparatus 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN0), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic apparatus 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic apparatus 101, from the outside (e.g., a user) of the electronic apparatus 101. The input module 150 may include, for example, a microphone, a mouse, a keyboard, a key (e.g., a button), or a digital pen (e.g., a stylus pen).

The sound output module 155 may output sound signals to the outside of the electronic apparatus 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic apparatus 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or an external electronic apparatus (e.g., an electronic apparatus 102 (e.g., a speaker or a headphone)) directly or wirelessly coupled with the electronic apparatus 101.

The sensor module 176 may detect an operational state (e.g., power or temperature) of the electronic apparatus 101 or an environmental state (e.g., a state of a user) external to the electronic apparatus 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic apparatus 101 to be coupled with the external electronic apparatus (e.g., the electronic apparatus 102) directly or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic apparatus 101 may be physically connected with the external electronic apparatus (e.g., the electronic apparatus 102). According to an embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic apparatus 101. According to an embodiment, the power management module 188 may be implemented as at least part of, for example, a power management integrated circuit (PMIC).

The battery 189 may supply power to at least one component of the electronic apparatus 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic apparatus 101 and the external electronic apparatus (e.g., the electronic apparatus 102, the electronic apparatus 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic apparatus via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify or authenticate the electronic apparatus 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic apparatus 101, an external electronic apparatus (e.g., the electronic apparatus 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic apparatus) of the electronic apparatus 101. According to an embodiment, the antenna module may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 from the plurality of antennas. The signal or the power may then be transmitted or received between the communication module 190 and the external electronic apparatus via the selected at least one antenna. According to an embodiment, another component (e.g., a radio frequency integrated circuit (RFIC)) other than the radiating element may be additionally formed as part of the antenna module 197.

According to an embodiment, the antenna module 197 may form a mmWave antenna module. According to an embodiment, the mmWave antenna module may include a printed circuit board, an RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic apparatus 101 and the external electronic apparatus 104 via the server 108 coupled with the second network 199. Each of the external electronic apparatuses 102 and 104 may be a device of a same type as, or a different type, from the electronic apparatus 101. According to an embodiment, all or some of operations to be executed at the electronic apparatus 101 may be executed at one or more external devices of the external electronic apparatuses 102, 104, or 108. For example, if the electronic apparatus 101 should perform a function or a service automatically, or in response to a request from a user or another device, the electronic apparatus 101, instead of, or in addition to, executing the function or the service, may request the one or more external electronic apparatuses to perform at least part of the function or the service. The one or more external electronic apparatuses receiving the request may perform the at least part of the function or the service requested, or an additional function or an additional service related to the request, and transfer an outcome of the performing to the electronic apparatus 101. The electronic apparatus 101 may provide the outcome, with or without further processing of the outcome, as at least part of a reply to the request. To that end, a cloud computing, distributed computing, mobile edge computing (MEC), or client-server computing technology may be used, for example. The electronic apparatus 101 may provide ultra low-latency services using, e.g., distributed computing or mobile edge computing. In an embodiment, the external electronic apparatus 104 may include an internet-of-things (IoT) device. The server 108 may be an intelligent server using machine learning and/or a neural network. According to an embodiment, the external electronic apparatus 104 or the server 108 may be included in the second network 199. The electronic apparatus 101 may be applied to intelligent services (e.g., smart home, smart city, smart car, or healthcare) based on 5G communication technology or IoT-related technology.

Figure 2:
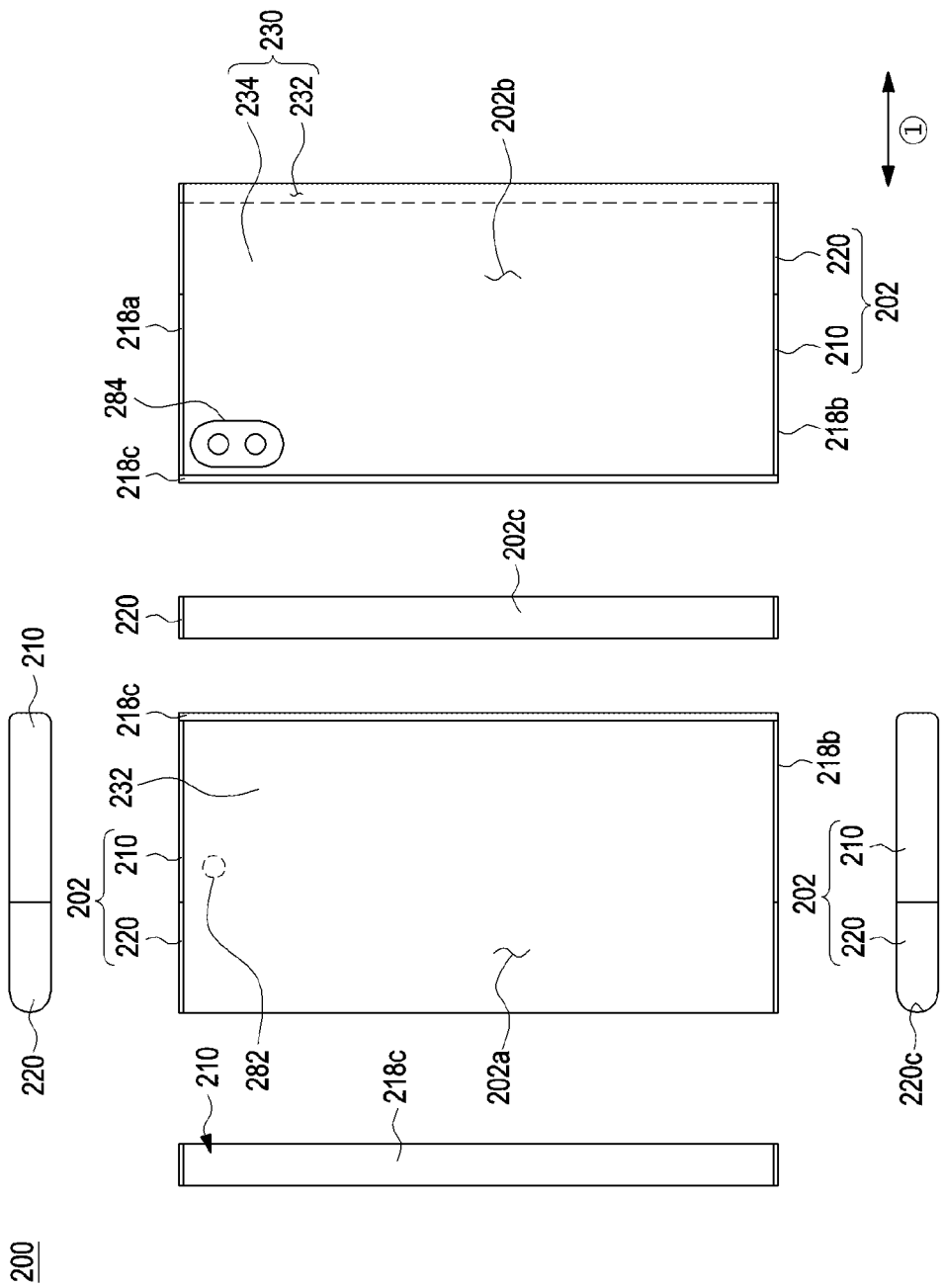
FIG. 2 is a diagram illustrating a closed state of a display according to various embodiments.
Figure 3:
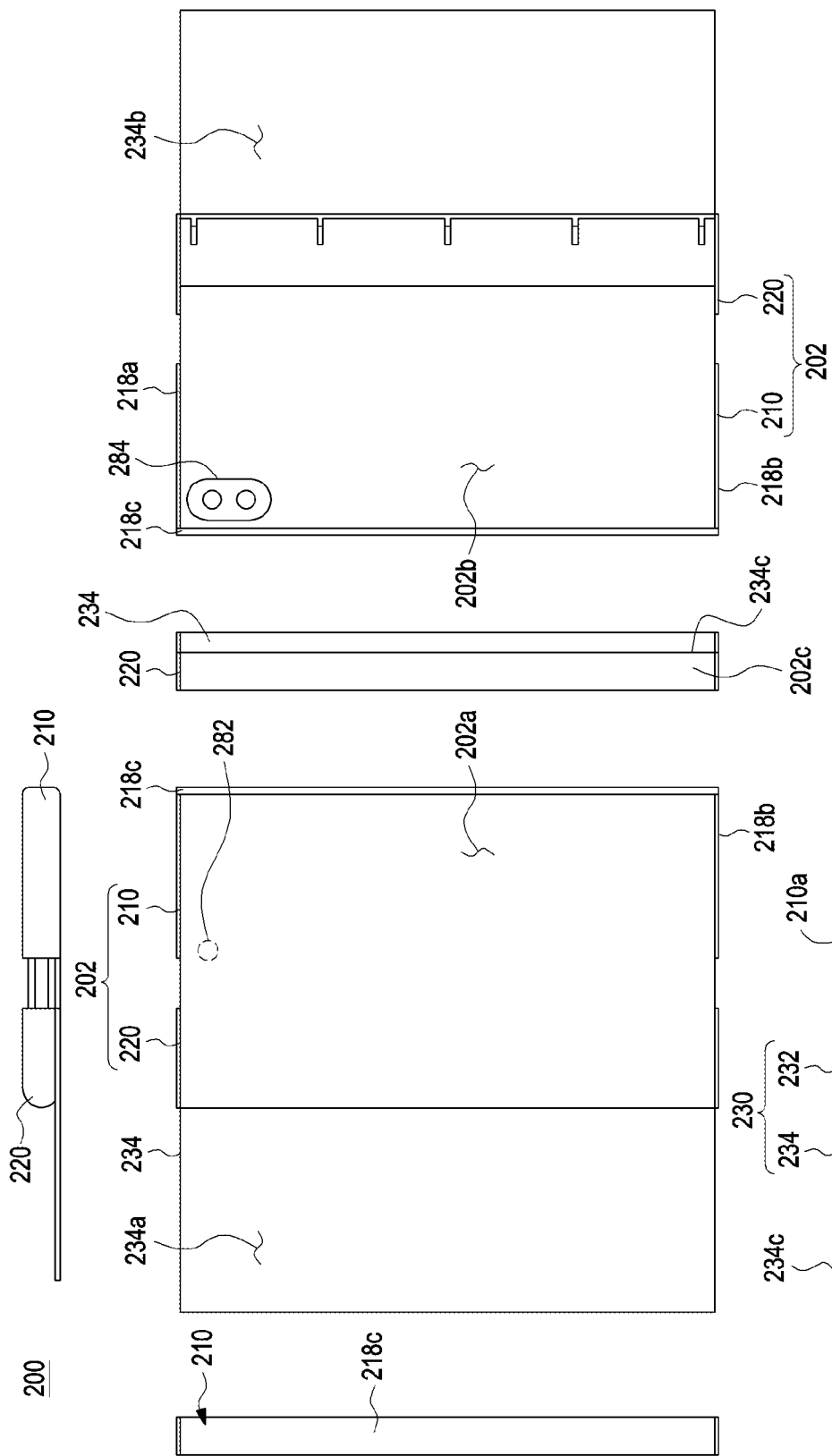
FIG. 3 is a diagram illustrating an opened state of a display according to various embodiments.

FIG. 2 is a diagram illustrating a closed state of a display according to various embodiments. FIG. 3 is a diagram illustrating an opened state of a display according to various embodiments.

A state shown in FIG. 2 may be defined or referred to as a state in which a second housing 220 is closed with respect to a first housing 210 or a display 230 is folded, and a state shown in FIG. 3 may be referred to as a state in which the second housing 220 is opened with respect to the first housing 210 or the display 230 is unfolded. According to an embodiment, a "closed state" or a "opened state" may be referred to as a state in which an electronic apparatus 200 is closed or opened.

Referring to FIG. 2 and FIG. 3, the electronic apparatus 200 may include a housing 202 and a display 230. The configurations of the display 230 of FIG. 2 and FIG. 3 may be entirely or partially identical to that of the display module 160 of FIG. 1.

According to an embodiment, the housing 202 is a component configured to form at least a portion of an exterior of the electronic apparatus 200 and may include a front surface 202*a*, a rear surface 202*b*, and a lateral surface 202*c* surrounding at least a portion of a space between the front surface and the rear surface.

According to an embodiment, the housing 202 may include a first housing 210 and a second housing 220 movable with respect to the first housing 210. In an embodiment, it may be understood as a structure that the first housing 210 is slidably disposed on the second structure 220 in the electronic apparatus 200. According to an embodiment, the second housing 220 may be disposed to be capable of reciprocating by a predetermined (e.g., specified) distance in a direction shown in the drawing, for example, a direction indicated by arrow η, based on the first housing 210.

According to an embodiment, the first housing 210 may be referred to as, for example, a first structure, a main part, or a main housing and may receive various electrical and electronic components, such as a main circuit board and a battery. The second housing 220 may be referred to as a second structure, a slide part, or a sliding housing, and may be disposed to be capable of reciprocating with respect to the first housing 210. According to an embodiment, the second housing 220 may be received (e.g., a slide-in operation) in the inside of the first housing 210 or exposed (e.g., a slide-out operation) to the outside of the first housing 210.

According to an embodiment, the first housing 210 may include a connection area 212 insertable into a reception groove (e.g., a fourth reception groove 224 in FIG. 14) of the second housing 220. According to an embodiment, the connection area 212 may be an area extending from a first surface 210*a* of the first housing 210 in a width direction of the electronic apparatus 200.

According to an embodiment, the first housing 210 may include a rear plate 211 disposed in the housing 202. According to an embodiment, the rear plate 211 may cover a space between the first housing 210 and the second housing formed by a slide operation of the second housing 220. For example, the rear plate 211 may be fixed to the first housing 210 and the second housing 220 may slide with respect to the rear plate 211. According to an embodiment, in a state in which the electronic apparatus 200 is opened (e.g., FIG. 3), a portion of the rear plate 211 may be exposed to the outside of the electronic apparatus 200. According to an embodiment (not shown), the rear plate 211 may form at least a portion of a rear surface 200*b* and/or a lateral surface 200*c* of the electronic apparatus 200.

According to an embodiment, the first housing 210 may be formed to have a shape having one open side to receive (or surround) at least a portion of the second housing 220. For example, the first housing 210 may include a lateral wall 218a, 218b, or 218c configured to surround at least a portion of the display 230 or the second housing 220. According to an embodiment, the lateral wall 218a, 218b, or 218c may include a first lateral wall 218a extending from the first surface 210a of the first housing 210, a second lateral wall 218b extending from the first surface 210a and parallel with the first lateral wall 218a, and a third lateral wall 218c connected to the first lateral wall 218a and the second lateral wall 218b. According to an embodiment, the lateral wall 218a, 218b, or 218c may form at least a portion of the lateral surface 202c of the electronic apparatus 200. According to an embodiment, the first lateral wall 218a, the second lateral wall 323b, and/or the third lateral wall 323c may be formed as separate housings and coupled or combined together. According to an embodiment, the first lateral wall 218a, the second lateral wall 323b, and/or the third lateral wall 323c may be integrally formed.

According to an embodiment, the display 230 may include a first display area 232, a second display area 234 extending from the first display area 232.

According to an embodiment, the first display area 232 may be located on the first housing 210 and the second housing 220. For example, a portion (e.g., a first end part 232d in FIG. 4) of the first display area 232 may be coupled to the third lateral wall 218c of the first housing 210 and another portion thereof may move on the lateral surface 220c of the second housing 220 and/or the front surface 220b of the second housing 220 along a direction indicated by arrow η based on slide movement of the second housing 220. For another example, a rear surface (e.g., a rear surface 232c in FIG. 4) of a portion of the first display area 232 may be disposed on or coupled to the first surface 210a of the first housing 210 and another portion of the first display area 232 may slide with respect to the front surface 220b of the second housing 220 or the lateral surface 220c.

According to an embodiment, the second display area 234 may be supported by the housing 202 based on slide movement of the second housing 220. According to an embodiment, in a state in which the electronic apparatus 200 is closed (e.g., FIG. 2), the housing 202 may support the second display area 234. For example, in a state in which the electronic apparatus 200 is closed, the second display area 234 may be located on the rear surface 202b of the housing 202 and at least a portion thereof may be surrounded by the lateral wall 218a, 218b, or 218c. According to an embodiment, in a state in which the electronic apparatus 200 is opened (e.g., FIG. 3), the second display area 234 may not be in direct contact with the housing 202. For example, the first display area 232 may be supported by the housing 202 and the second display area 234 extending from the first display area 232 may be spaced apart from the front surface 202a of the housing 202. According to an embodiment, the second display area 234 may include a front surface 234a which may be visually exposed through the front surface 202a of the electronic apparatus 200 and a rear surface 234b opposite to the front surface 234a. According to an embodiment, the second display area 234 may include an end part 234c and the end part 234c may be adjacent to the first housing 210 in a state in which the electronic apparatus 200 is closed and spaced apart from the first housing 210 in a state in which the electronic apparatus 200 is opened. For example, in a state in which the electronic apparatus 200 is closed, the end part 234c of the second display area 234 may be located on the rear surface 202b of the first housing 210, and in a state in which the electronic apparatus 200 is opened, the end part 234c of the second display area 234 may protrude or extend to the outside of the housing 202.

According to an embodiment, the electronic apparatus 200 may include a camera module 282 and 284. According to an embodiment, the camera module 282 and 284 may be located in the first housing 210. The electronic apparatus 200 may include multiple camera modules 282 and 284. For example, the electronic apparatus 200 may include a front camera 282 located on the front surface 202a of the housing 202 and a rear camera module 284 located on the rear surface 202b of the housing 202. For example, the camera module 282 and 284 may include at least one of a wide angle camera, a telephoto camera, or a close-up camera, and may include, according to an embodiment, an infrared projector and/or an infrared receiver to measure a distance to a subject. The camera module 282 and 284 may include one or more of lenses, an image sensor, and/or an image signal processor. According to an embodiment, the front camera 282 may be disposed on an area around the first display area 232 or on an area overlapping the first display area 232 and in case of being disposed on an area overlapping the first display area 232, may photograph a subject through the first display area 232. According to an embodiment, the rear camera module 284 may be covered by the second display area 234 and may photograph a subject through the second display area 234. The camera module 282 and 284 of FIG. 2 and FIG. 3 may be entirely or partially identical to the camera module 180 of FIG. 1 in terms of configuration.

According to an embodiment, the electronic apparatus 200 may include a key input device (not shown), a connector hole (not shown), an audio module (not shown), an indicator (e.g., an LED device), or various sensor modules (not shown).

According to an embodiment, the key input device may be disposed on the lateral wall 218a, 218b, or 218c of the first housing 210. Depending on the appearance and the state of use, the key input device may be omitted. According to an embodiment, the electronic apparatus 200 may include a home key button or a touch pad disposed around the home key button.

According to an embodiment, the connector hole may be omitted according to an embodiment, and may include a connector (for example, a USB connector) for transmitting or receiving power and/or data to or from an external electronic apparatus. Although not shown in the drawing, the electronic apparatus 200 may include multiple connector holes, and a portion of the multiple connector holes may function as a connector hole for transmitting or receiving an audio signal to or from an external electronic apparatus. The connector hole may be disposed on the lateral wall 218a, 218b, or 218c of the first housing 210.

According to an embodiment, the audio module may include a speaker hole or a microphone hole. One speaker hole may be provided as a receiver hole for calling and another one may be provided as an external speaker hole. The electronic apparatus 200 may include a microphone for acquiring a sound and the microphone may acquire a sound from the outside of the electronic apparatus 200 through a microphone hole. According to an embodiment, the electronic apparatus 200 may include multiple microphones to detect a direction of a sound. According to an embodiment, a speaker hole and a microphone hole may be integrated into one hole and a speaker may be included without a speaker hole (e.g., a piezo speaker). According to an embodiment, the speaker hole (e.g., the external speaker hole) or the microphone hole 247a or 247b may be disposed on the lateral wall 218a, 218b, or 218c of the first housing 210.

According to an embodiment, the indicator (not shown) of the electronic apparatus 200 may be disposed on the first housing 210 or the second housing 220 and may include a light-emitting diode to provide state information of the electronic apparatus 200 in a form of visual signal. The sensor module (not shown) of the electronic apparatus 200 may generate an electrical signal or a data value corresponding to an internal operation state or external environment state of the electronic apparatus 200. The sensor module may include, for example, a proximity sensor, a fingerprint sensor, or a biosensor (for example, an iris/face recognition sensor or an HRM sensor). In an embodiment, the sensor module may further include at least one from among, for example, a gesture sensor, a gyro sensor, an air pressure sensor, a magnetic sensor, an acceleration sensor, a grip sensor, a color sensor, an infrared (IR) sensor, a temperature sensor, a humidity sensor, or an illuminance sensor.

Figure 4:
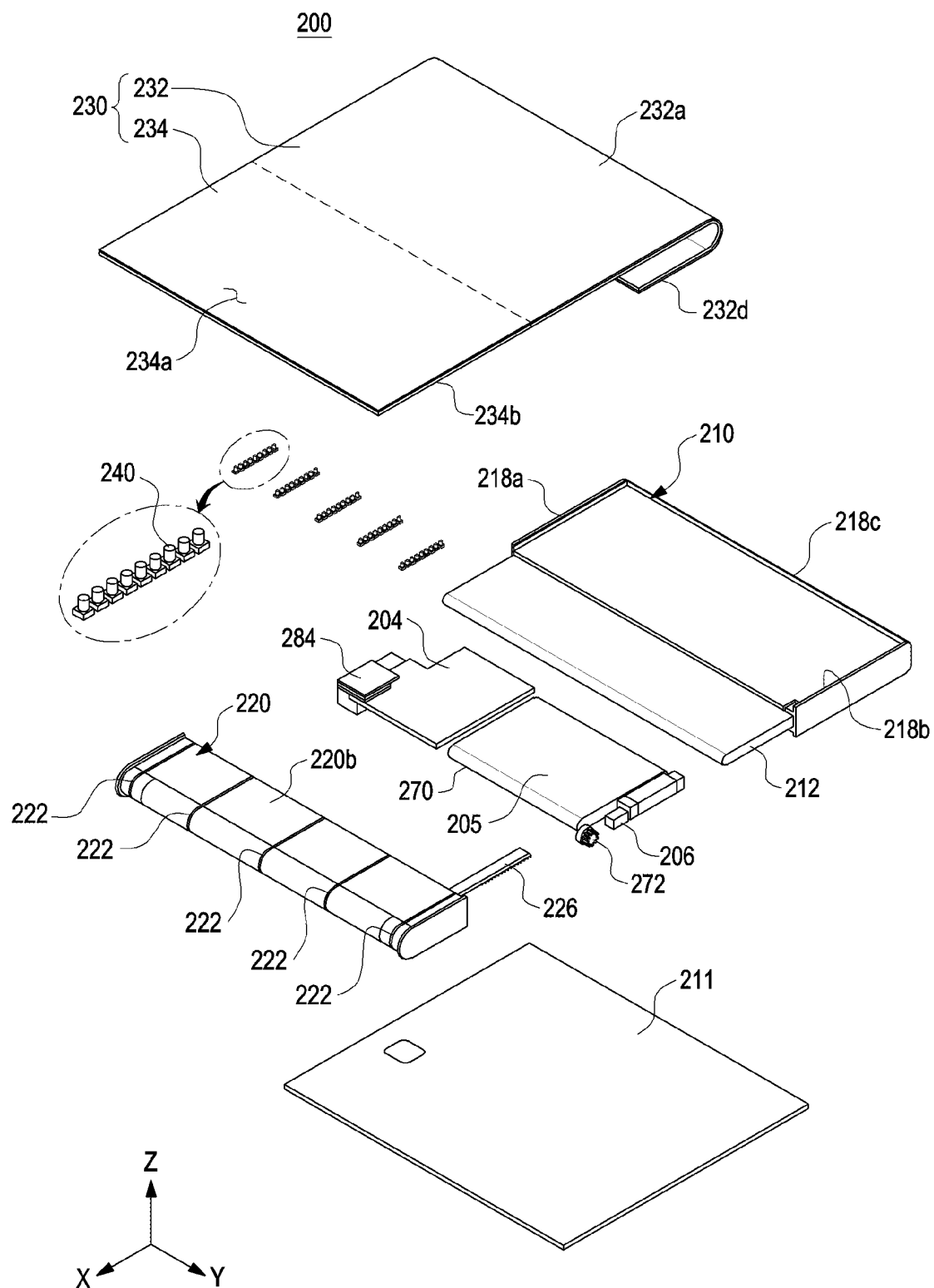
FIG. 4 is an exploded perspective view of an electronic apparatus according to various embodiments.

FIG. 4 is an exploded perspective view of an electronic apparatus according to various embodiments.

Referring to FIG. 4, the electronic apparatus 200 may include a first housing 210, a rear plate 211, a second housing 220, a display 230, and a pin structure 240. The configuration of the first housing 210, the rear plate 211, the second housing 220, the display 230, and the pin structure 240 of FIG. 4 may be entirely or partially identical to that of the first housing 210, the second housing 220, the display 230, and the pin structure 240 of FIG. 2 and FIG. 3.

According to an embodiment, the electronic apparatus 200 may include a main circuit board 204 received in the first housing 210. For example, at least a portion of the main circuit board 204 may be disposed on a connection area 212 of the first housing 210 or in the connection area 212. According to an embodiment, at least one of a processor (e.g., the processor 120 in FIG. 1), a battery 205 (e.g., the battery 189 in FIG. 1), a connector 206 (e.g., the connection terminal 178 in FIG. 1), a camera module 284 (e.g., the rear camera module 284 in FIG. 2), or a motor module 270 may be mounted on or connected to the main circuit board 204.

According to an embodiment, the second housing 220 may include a rack gear 226. According to an embodiment, the rack gear 226 may be connected to a gear structure 272 connected to the motor module 270 and may move in a width direction (e.g., the X-axis direction) of the electronic apparatus 200 according to driving of the motor module 270.

According to an embodiment, the second housing 220 may include at least one first reception groove 222. According to an embodiment, the first reception groove 222 is a groove or a recess formed on the lateral surface 220c and the front surface 220b of the second housing 220 and may receive the pin structure 240 therein. According to an embodiment, the second housing 220 may include various numbers of first reception grooves 222. For example, five first reception grooves 222 are shown in FIG. 4 but are not limited thereto. According to an embodiment, the first reception groove 222 may be formed along a sliding direction (e.g., the X-axis direction) of the second housing 220.

According to an embodiment, the pin structure 240 may guide movement of the display 230 with respect to the first housing 210 or the second housing 220. For example, the pin structure 240 may be coupled to the display 230 and slide with respect to the second housing 220. According to an embodiment, the pin structure 240 may be disposed under the first display area 232. For example, the pin structure 240 may be coupled to a flexible area (e.g., the flexible area 261 in FIG. 9) of a display support member (e.g., the display support member 260 in FIG. 11A) and may protrude toward the second housing 220. According to an embodiment, at least a portion of the pin structure 240 may be located in the first reception groove 222 and slide along the first reception groove 222. According to an embodiment, the electronic apparatus 200 may include various numbers of pin structures 240. For example, five pin structures 240 are shown in FIG. 4 but are not limited thereto.

According to an embodiment, the electronic apparatus 200 may include the motor module 270. According to an embodiment, the motor module 270 may include a motor core (not shown) configured to generate driving power and a gear structure 272 configured to transfer the driving power generated from the motor core to other configurations. According to an embodiment, the gear structure 272 may rotate while being in contact with the rack gear 226 of the second housing 220 to move the second housing 220 with respect to the first housing 210.

Figure 5:
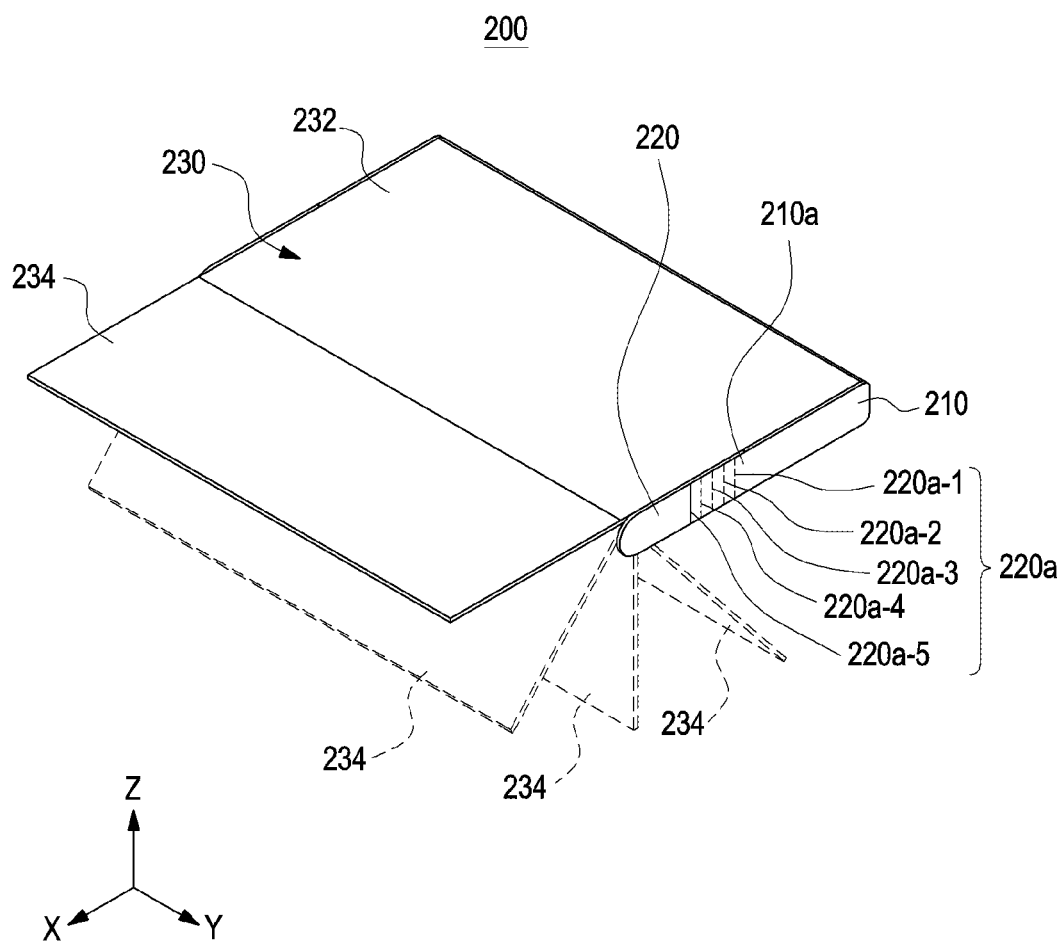
FIG. 5 is a perspective view of an electronic apparatus illustrating movement of a second housing and a display according to various embodiments.

FIG. 5 is a perspective view of an electronic apparatus illustrating movement of a second housing and a display according to various embodiments. FIG. 6A, FIG. 6B, FIG. 6C, FIG. 6D, and FIG. 6E are diagrams illustrating movement of a second housing and a display of an electronic apparatus according to various embodiments.

Referring to FIG. 5, FIG. 6A, FIG. 6B, FIG. 6C, FIG. 6D, and FIG. 6E, the second housing 220 may slide with respect to the first housing 210 and a portion (e.g., the first display area 232) of the display 230 may move with respect to the first housing 210 or the second housing 220 while being guided by the pin structure 240. The configuration of the first housing 210, the second housing 220, the display 230, and the pin structure 240 of FIG. 5, FIG. 6A, FIG. 6B, FIG. 6C, FIG. 6D, and/or FIG. 6E may be entirely or partially identical to that of the first housing 210, the second housing 220, the display 230, and the pin structure 240 of FIG. 4.

According to an embodiment, the pin structure 240 may slide in the first reception groove 222 of the second housing 220. For example, the pin structure may slide in the first reception groove 222 of the second housing 220 based on slide movement of the second housing 220. As the pin structure 240 slides, the display 230 connected to the pin structure 240 may be gradually or continuously unfolded or folded.

According to an embodiment, the second housing 220 may slide with respect to the first housing 210 in a width direction (e.g., the X-axis direction) of the electronic apparatus 200. For example, in a state in which the electronic apparatus 200 is closed (e.g., the first state Si in FIG. 2), the first surface 210a of the first housing 210 and the second surface 220a of the second housing 220 may face each other while being in contact with each other. According to an embodiment, in a state in which the electronic apparatus 200 is closed, the first surface 210a may be located at a first point 220a-1 facing the second surface 220a and the first surface 210a may gradually move in the width direction (the X-axis direction) as the electronic apparatus 200 is opened. For example, the second surface 220a of the second housing 220 may be located at a second point 220a-2 spaced farther than the first point 220a-1 from the first surface 210a in a state in which the display 230 is opened about 45 degrees (e.g., a second state s2), located at a third point 220a-3 spaced farther than the second point 220a-2 from the first surface 210a in a state in which the display 230 is opened about 90 degrees (e.g., a third state s3), located at a fourth point 220a-4 spaced farther than the third point 220a-3 from the first surface 210a in a state in which the display 230 is opened about 135 degrees (e.g., a fourth state s4), and located at a fifth point 220a-5 spaced farther than the fourth point 220a-4 from the first surface 210a in a state in which the display 230 is opened about 180 degrees (e.g., a fifth state s5). According to an embodiment, the display 230 may be unfolded or folded based on slide movement of the second housing 220. According to an embodiment, the second housing 220 may be understood to be a structure sliding based on rotation of the second display area 234.

According to an embodiment, a second distance d2 between the pin structure 240 and the second surface 220a of the second housing 220 may be changed based on slide movement of the second housing 220. For example, the second distance d2 may be reduced as a first distance d1 between the first surface 210a of the first housing 210 and the second surface 220a of the second housing 220 increases. According to an embodiment, the second distance d2 may be a distance between the second surface 220a and a portion of a pin structure 240 which is most adjacent to the second surface 220a among multiple pin structures 240. The first display area 232 may form at least a portion of the front surface 202a of the housing 202 and the second display area 234 may form at least a portion of the rear surface 202b of the housing 202. According to an embodiment, in a state in which the electronic apparatus 200 is opened (e.g., the second state s2, the third state s3, the fourth state s4, or the fifth state s5), the first surface 210a of the first housing 210 and the second surface 220a of the second housing 220 may be spaced a first distance d1-1, d1-2, d1-3, or d1-4 apart from each other. In a state in which the electronic apparatus 200 is closed, in case that the first distance d1-1, d1-2, d1-3, or d1-4 increases, the display 230 may be gradually or continuously unfolded. For example, as the first distance d1 increases, a first angle xl between the first display area 232 and the second display area 234 may increase. For example, a (1-1)th distance d1-1 may be shorter than a (1-2)th distance d1-2, the (1-2)th distance d1-3 shorter than a (1-3)th distance d1-3, and the (1-3)th distance d1-3 shorter than a (1-4)th distance d1-4.

According to an embodiment, in a state in which the electronic apparatus 200 is opened, the first surface 210a of the first housing 210 and the second surface 220a of the second housing 220 may be spaced apart from each other and the first display area 232 and the second display area 234 may be located on the front surface 202a of the housing 202. According to an embodiment, the second display area 234 may cover the rear camera module 284 in a closed state (e.g., FIG. 2). For example, the rear camera module 284 may acquire light penetrating the second display area 234.

According to an embodiment, a location of the display 230 with respect to the first housing 210 or the second housing 220 may be changed based on slide movement of the second housing 220. According to an embodiment, the first angle xl between the first display area 232 and the second display area 234 may be changed based on slide movement of the second housing 220. For example, the first angle xl may be reduced as the first distance d1-1, d1-2, d1-3, or d1-4 between the first surface 210a of the first housing 210 and the second surface 220a of the second housing 220 increases. According to an embodiment, the first angle xl may be an angle between the front surface 234a of the second display area 234 and the front surface 232a of the first display area 232. For another example, the first angle xl may be an angle between the front surface 234a of the second display area 234 and the first housing 210 or the second housing 220.

Figure 7:
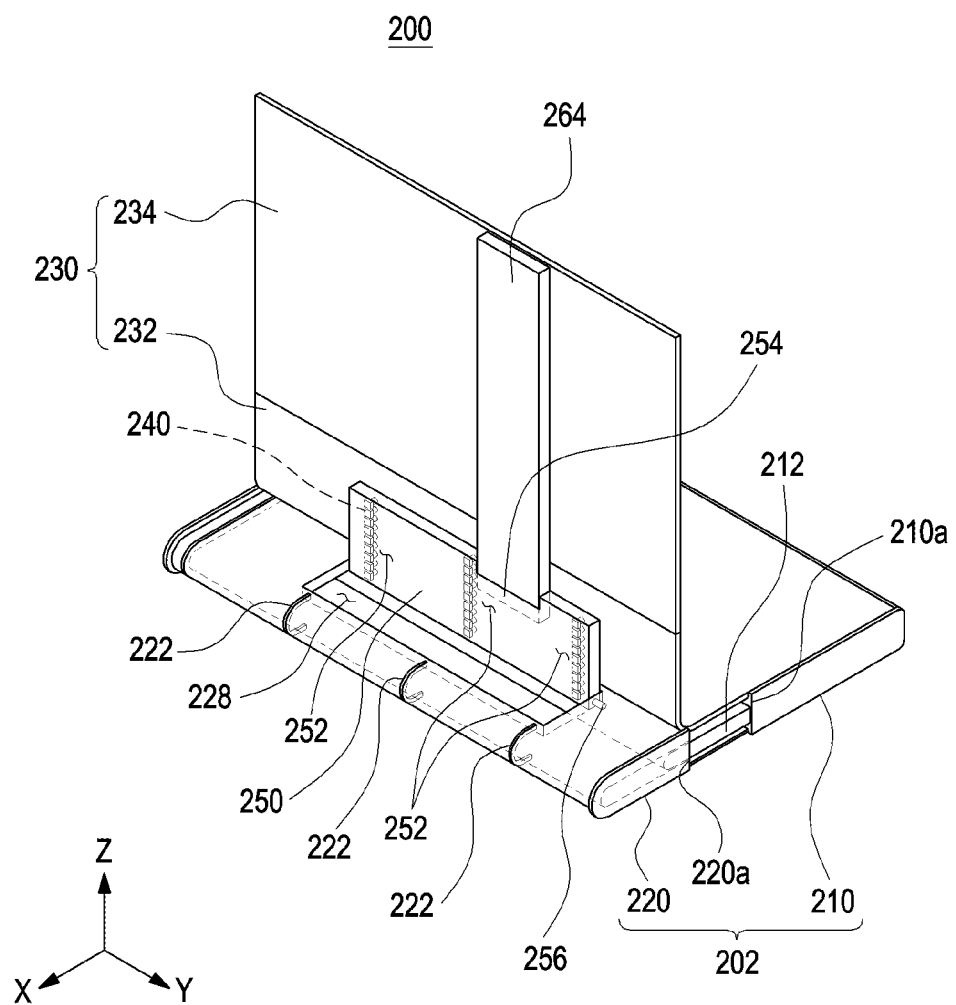
FIG. 7 is a perspective view illustrating an electronic apparatus in which a second display area is inclined with respect to a first housing according to various embodiments.

FIG. 7 is a perspective view of an electronic apparatus illustrating a second display area inclined with respect to a first housing according to various embodiments. FIG. 8A, FIG. 8B, FIG. 8C, and FIG. 8D are diagrams illustrating an example operation in which a second display area is tilted based on slide movement of a second housing according to various embodiments.

Referring to FIG. 7, FIG. 8A, FIG. 8B, FIG. 8C, and FIG. 8D, the second housing 220 may slide with respect to the first housing 210 and a portion (e.g., the second display area 234) of the display 230 may be inclined with respect to the first housing 210 or the second housing 220. The configuration of the first housing 210, the second housing 220, the display 230, and the pin structure 240 of FIG. 7, FIG. 8A, FIG. 8B, FIG. 8C, and/or FIG. 8D may be entirely or partially identical to that of the first housing 210, the second housing 220, the display 230, and the pin structure 240 of FIG. 5, FIG. 6A, FIG. 6B, FIG. 6C, FIG. 6D, and/or FIG. 6E.

According to an embodiment, the electronic apparatus 200 may include a rotation member 250 capable of receiving the pin structure 240. For example, the rotation member 250 may include at least one second reception groove 252 configured to receive the pin structure 240. According to an embodiment, the second reception groove 252 may be arranged to correspond to at least a portion of the first reception groove 222 formed on the second housing 220. For example, the second reception groove 252 may be a groove extending with respect to the first reception groove 222 in a width direction (e.g., the X-axis direction) of the electronic apparatus 200.

According to an embodiment, the rotation member 250 may be rotatably connected to the second housing 220. For example, the rotation member 250 may be connected to the second housing 220 using a rotation axis structure 256 configured to be rotatable along a lengthwise direction (e.g., the Y-axis direction) of the electronic apparatus 200.

According to an embodiment, the rotation member 250 may support the display 230. For example, the rotation member 250 may be located under the first display area 232 of the display 230 and may support the first display area 232.

According to an embodiment, whether an angle of the display 230 with respect to the first housing 210 or the second housing 220 is changeable may be determined based on a location of the pin structure 240. For example, the location of the pin structure 240 may be changed based on slide movement of the second housing 220 and the pin structure 240 may be located on at least a portion of the first reception groove 222 or the second reception groove 252.

According to an embodiment (e.g., a sixth state s6), at least a portion of the pin structure 240 may be received in the first reception groove 222 of the second housing 220 and another portion of the pin structure 240 may be received in the second reception groove 252 of the rotation member 250. For example, in an unfolded state, a first pin structure 240-1 of the pin structure 240, which is located farthest from the second surface 220a, may be received in the first reception groove 222 and remaining pin structure 240 may be received in the second reception groove 252. In case that the pin structure 240 is located in the first reception groove 222 and the second reception groove 252, angle change of the rotation member 250 with respect to the second housing 220 may be delimited by the pin structure 240. For example, the first pin structure 240-1 is connected to the second housing 220 and the other portion of the pin structure 240 is connected to the rotation member 250 so that the rotation member 250 may not rotate with respect to the second housing 220. According to an embodiment, the sixth state s6 may be substantially identical to the fifth state s5 in which the second housing 220 of FIG. 6E slides with respect to the first housing 210 so that the second display area 234 and the first display area 232 form substantially the same surface.

According to an embodiment (e.g., a seventh state s7, an eighth state s8, or a ninth state s9), the pin structure 240 may deviate from the first reception groove 222 and may be located in the second reception groove 252. For example, in case that the second housing 220 is spaced farther apart from the first housing 210 (e.g., the seventh state s7) than the fifth state (e.g., the fifth state s5 in FIG. 6E), the pin structure 240 may be located in the second reception groove 252. In case that the pin structure 240 deviates from the first reception groove 222 and is located in the second reception groove 252, the rotation member 250 may rotate with respect to the second housing 220 with reference to the rotation axis structure 256.

According to an embodiment, the second housing 220 may include a fifth reception groove 228 formed to face a front surface (e.g., the front surface 220b in FIG. 4). The fifth reception groove 228 may receive at least a portion of the rotation member 250. According to an embodiment, in case that a distance between the second housing 220 and the first housing 210 is within a predetermined distance (e.g., the seventh state s7), the rotation member 250 may be located in the fifth reception groove 228. According to an embodiment, in case that the second housing 220 is spaced farther apart from the first housing 210 in the seventh state s7 (e.g., the eight state s8 or the ninth state s9) and the rotation member 250 is inclined with respect to the second housing 220, at least a portion of the rotation member 250 may be exposed to the outside of the fifth reception groove 228.

According to an embodiment, the display 230 may include a protrusion structure 264 to be insertable into the rotation member 250. According to an embodiment, the protrusion structure 264 may extend from the second display area 234 and a portion of the protrusion structure 264 may be located under the first display area 234. For example, the protrusion structure 264 may extend from a rigid area (e.g., the rigid area 262 in FIG. 9) of a display support member (e.g., the display support member 260 in FIG. 9). According to an embodiment, the rotation member 250 may receive the protrusion structure 264. For example, the rotation member 250 may include a third reception groove 254 to receive the protrusion structure 264. According to an embodiment, in a state in which the second housing 220 slides and the display 230 is unfolded (e.g., the sixth state s6), the protrusion structure 264 may be located in the third reception groove 254.

Figure 9:
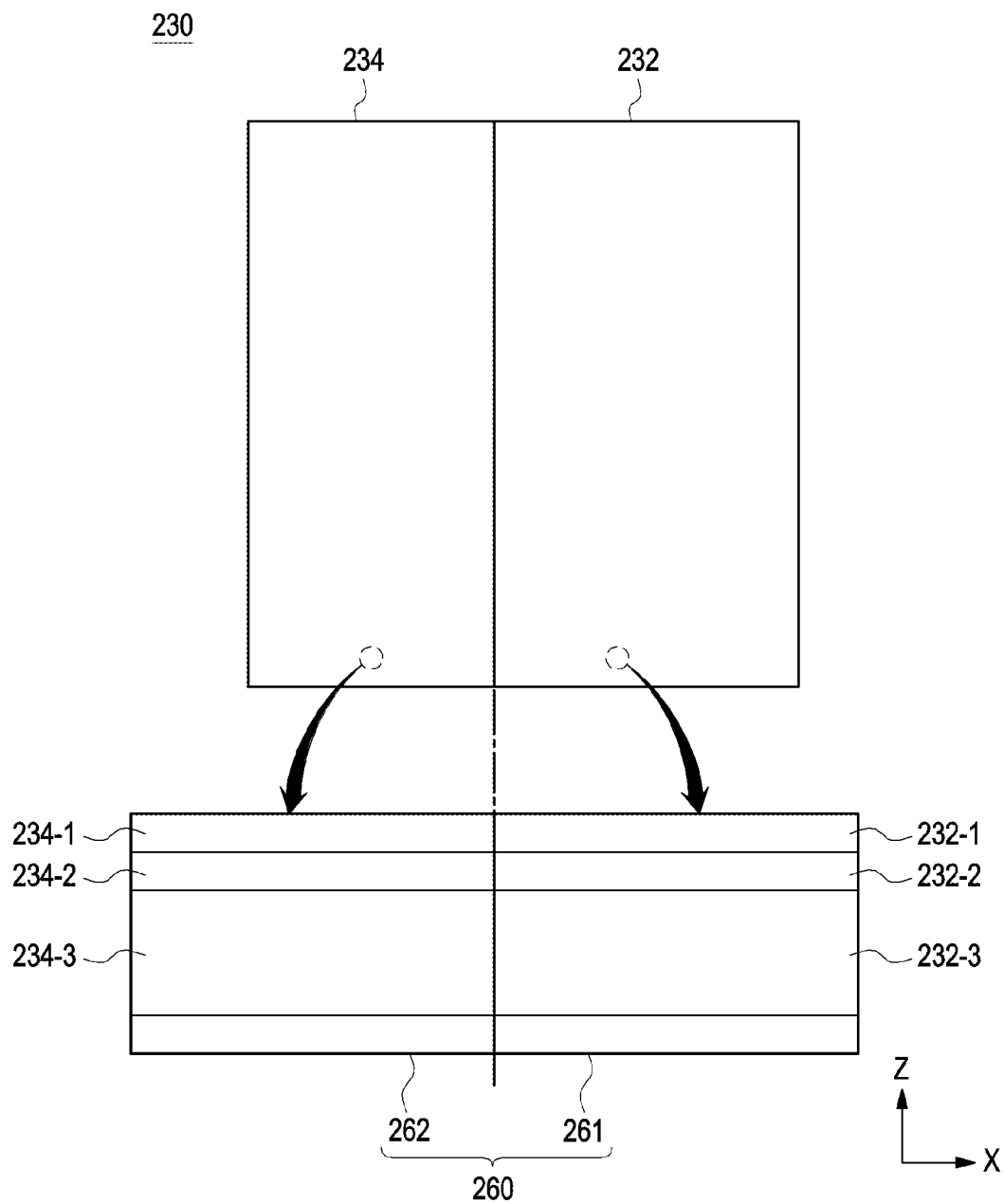
FIG. 9 is a diagram illustrating a front view of a display according to various embodiments.

FIG. 9 is a diagram illustrating a front view of a display according to various embodiments.

Referring to FIG. 9, the display 230 may include the first display area 232 and the second display area 234. The configuration of the display 230, the first display area 232, and the second display area 234 of FIG. 9 may be entirely or partially identical to that of the display 230, the first display area 232, and the second display area 234 in FIG. 2 and FIG. 3.

According to an embodiment, the display 230 may include a window member 232-1 and 234-1. According to an embodiment, the window member 232-1 and 234-1 may protect at least a portion of the display 230. According to an embodiment, the window member 232-1 and 234-1 is a substantially transparent component and at least a portion of light emitted from a display panel 232-3 and 234-3 may penetrate the window member 232-1 and 234-1. For example, the display 230 may include a first window member 232-1 configured to form at least a portion of a front surface (e.g., the front surface 232a of the first display area 232 in FIG. 6E) of the first display area 232 and a second window member 234-1 configured to form at least a portion of a front surface (e.g., the front surface 234a of the second display area 234 in FIG. 6E) of the second display area 234. According to an embodiment, the first window member 232-1 and the second window member 234-1 may be integrally formed.

According to an embodiment, the display 230 may include a polarizing plate 232-2 and 234-2 configured to transmit light in a predetermined direction. For example, the display 230 may include the first polarizing plate 232-2 disposed in the first display area 232 and a second polarizing plate 234-2 disposed in the second display area 234.

According to an embodiment, the display 230 may include a display panel 232-3 and 234-3 configured to output an image/or a video. For example, the display 230 may include the first display panel 232-3 disposed in the first display area 232 and a second display panel 234-3 disposed in the second display area 234.

According to an embodiment, the display 230 may include the display support member 260. According to an embodiment, the display support member 260 may support the display panel 232-3 and 234-3. For example, the display support member 260 may be disposed under the display panel 232-3 and 234-3. According to an embodiment, the display 230 may include a flexible area 261 configured to support the first display area 232 (e.g., the first display panel 232-3) and a rigid area 262 configured to support the second display area 234 (e.g., the second display panel 234-3).

According to an embodiment, at least a portion of the display 230 may be substantially transparent. According to an embodiment, at least a portion of the display 230 may be changed to be transparent based on an operation of a processor (e.g., the processor 120 in FIG. 1). For example, at least a portion of the first display area 232 or the second display area 234 may be changed to be transparent based on a signal transmitted from the processor 120. According to an embodiment, at least a portion of the second display area 234 may be formed to be substantially transparent. For example, at least a portion of the second polarizing plate 234-2, at least a portion of the second display panel 234-3, and at least a portion of the display support member 260 may be formed to be substantially transparent. For example, a distance between light-emitting elements of the second display panel 234-3 may be larger than a distance between light-emitting elements of the first display panel 232-3.

Figure 10:
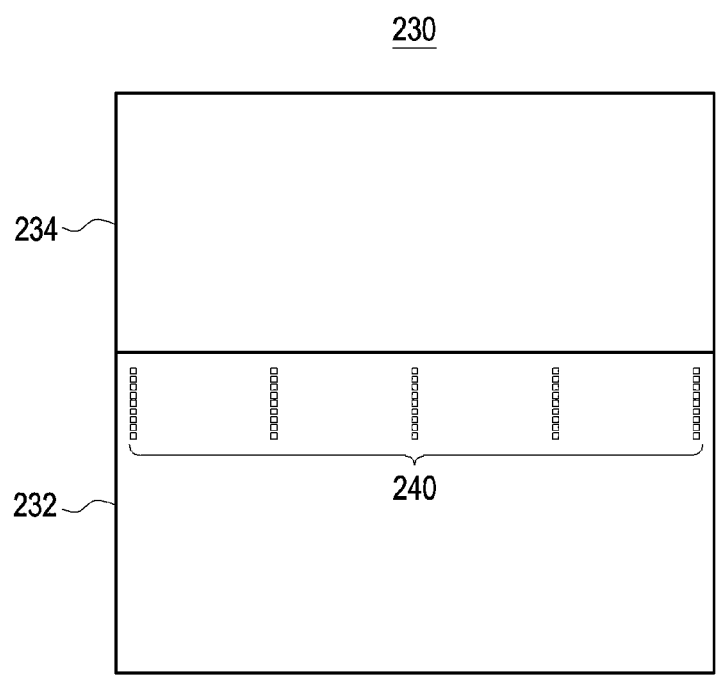
FIG. 10 is a diagram illustrating rear view of a display on which a pin structure is disposed according to various embodiments.
Figure 11A:
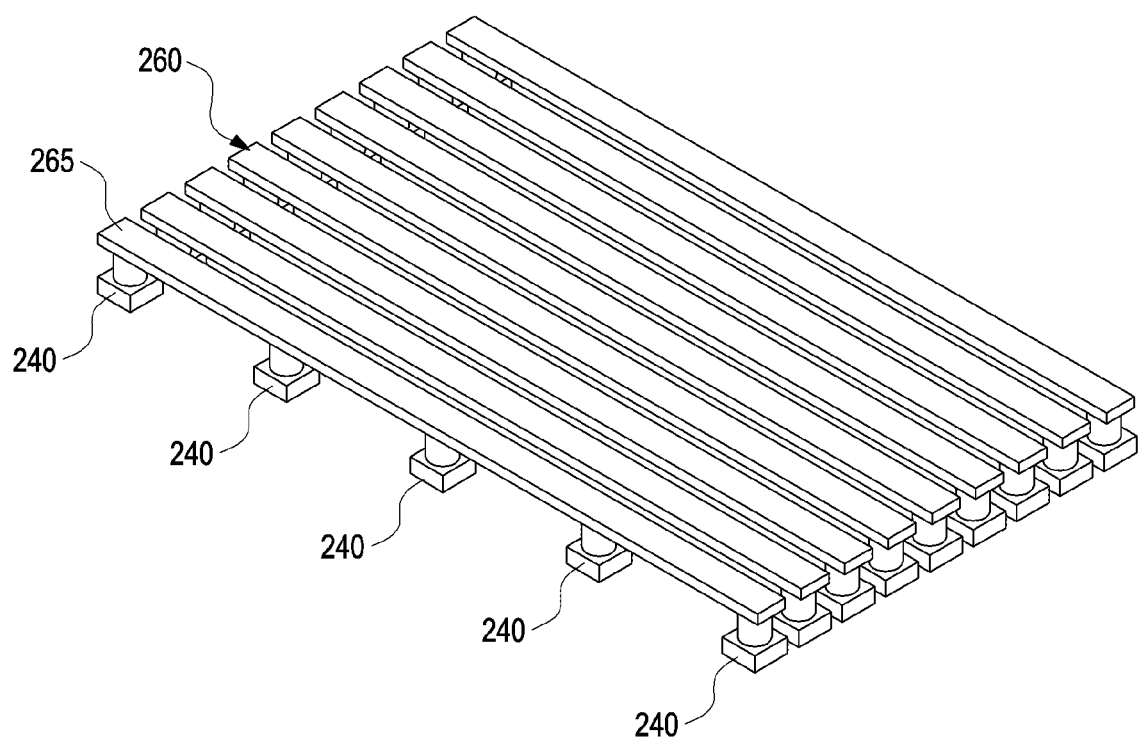
FIG. 11A and FIG. 11B are perspective views illustrating a display support member on which a pin structure is disposed according to various embodiments.
Figure 11B:
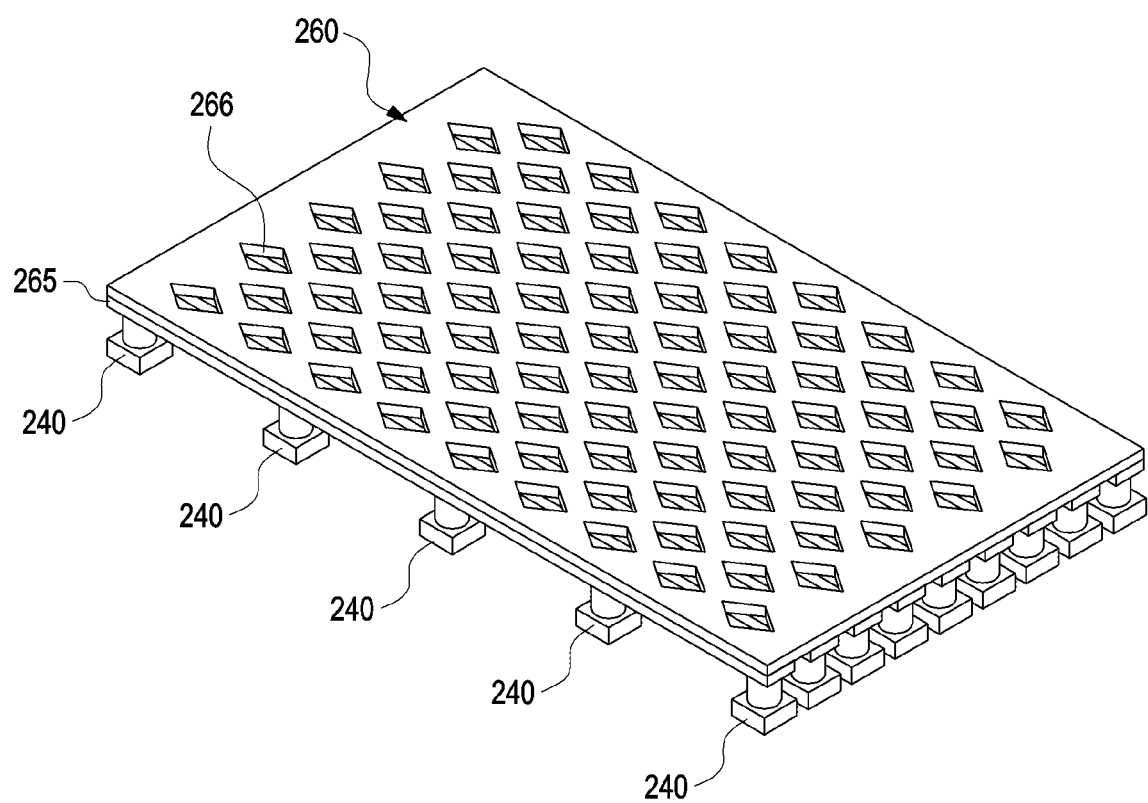

FIG. 10 is a diagram illustrating rear view of a display on which a pin structure is disposed according to various embodiments. FIG. 11A and FIG. 11B are perspective views illustrating a display support member on which a pin structure is disposed according to an embodiment of the disclosure.

Referring to FIG. 10, FIG. 11A, and FIG. 11B, the pin structure 240 may be arranged under the display 230. For example, the pin structure 240 may be coupled to the display support member 260. The configuration of the display 230, the pin structure 240, and the display support member 260 of FIG. 10, FIG. 11A, and/or FIG. 11B may be entirely or partially identical to that of the display 230, the pin structure 240, and the display support member 260 of FIG. 4.

According to an embodiment, the pin structure 240 may be disposed under the first display area 232. For example, the pin structure 240 may be coupled to a flexible area (e.g., the flexible area 261 in FIG. 9) of the support member 260. According to an embodiment, the pin structure 240 may slide within a first reception groove (e.g., the first reception groove 222 in FIG. 7) or a second reception groove (e.g., the second reception groove 252 in FIG. 7), and the first display area 232 may move with respect to a second housing (e.g., the second housing 220 in FIG. 7) based on movement of the pin structure 240.

According to an embodiment, at least a portion (e.g., the flexible area 261 in FIG. 9) of the display support member 260 may be bent based on movement of the display 230. For example, at least a portion of the flexible area 261 may move along an end part of the second housing 220 (e.g., the lateral surface 220c of the second housing 220 in FIG. 4) based on movement of the second housing 220. According to an embodiment (e.g., FIG. 11A), at least a portion (e.g., the flexible area 261 in FIG. 9) of the display support member 260 may be formed to have a multi joint multi bar structure. For example, the flexible area 261 of the display support member 260 may include multiple bars 265. The multiple bars 265 may be arranged in parallel with a lengthwise direction (e.g., the Y-axis direction) of an electronic apparatus (e.g., the electronic apparatus 200 in FIG. 4). According to an embodiment (e.g., FIG. 11B), the display support member 260 may be formed to have a bendable integrated plate shape. For example, the flexible area 261 of the display support member 260 may include multiple through-holes 266. The multiple through-holes 266 may be arranged in a lattice structure to improve flexibility of the display support member 260. According to an embodiment, the flexible area 261 of the display support member 260 may include multiple through-holes 266 and the multiple bars 265 may be arranged under the display support member 260.

Figure 12:
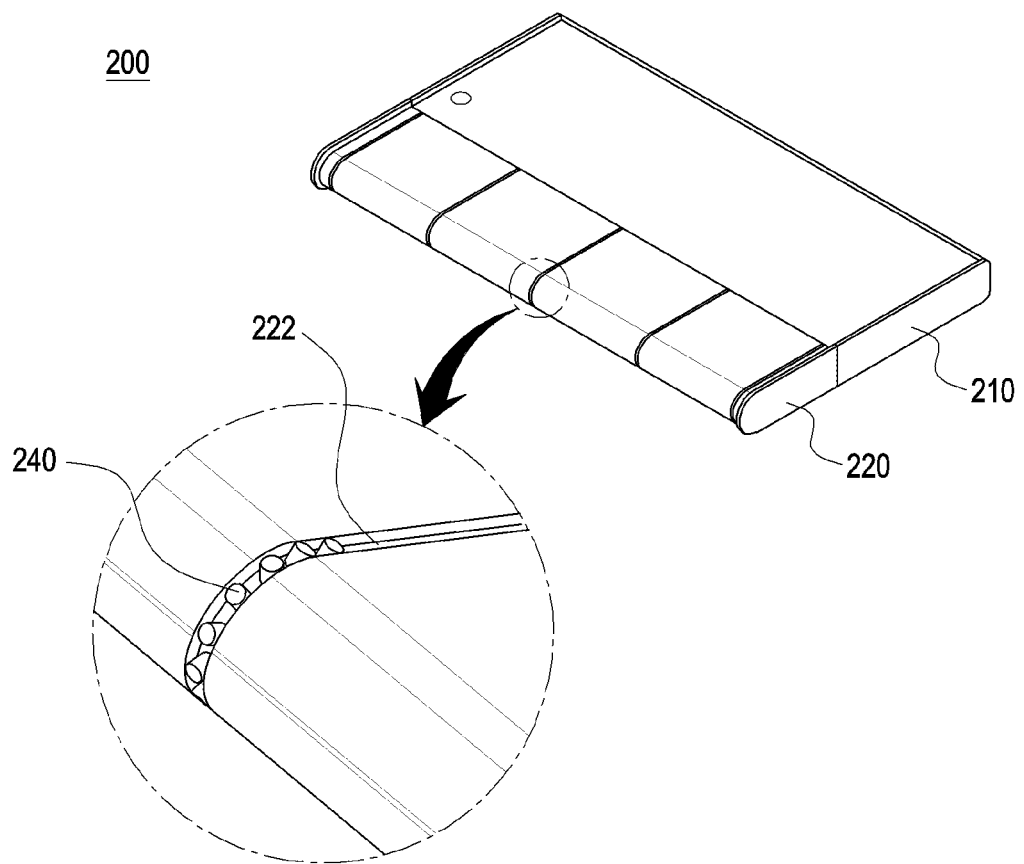
FIG. 12 is a perspective view illustrating an electronic apparatus in a state in which a display is removed, according to various embodiments.
Figure 13:
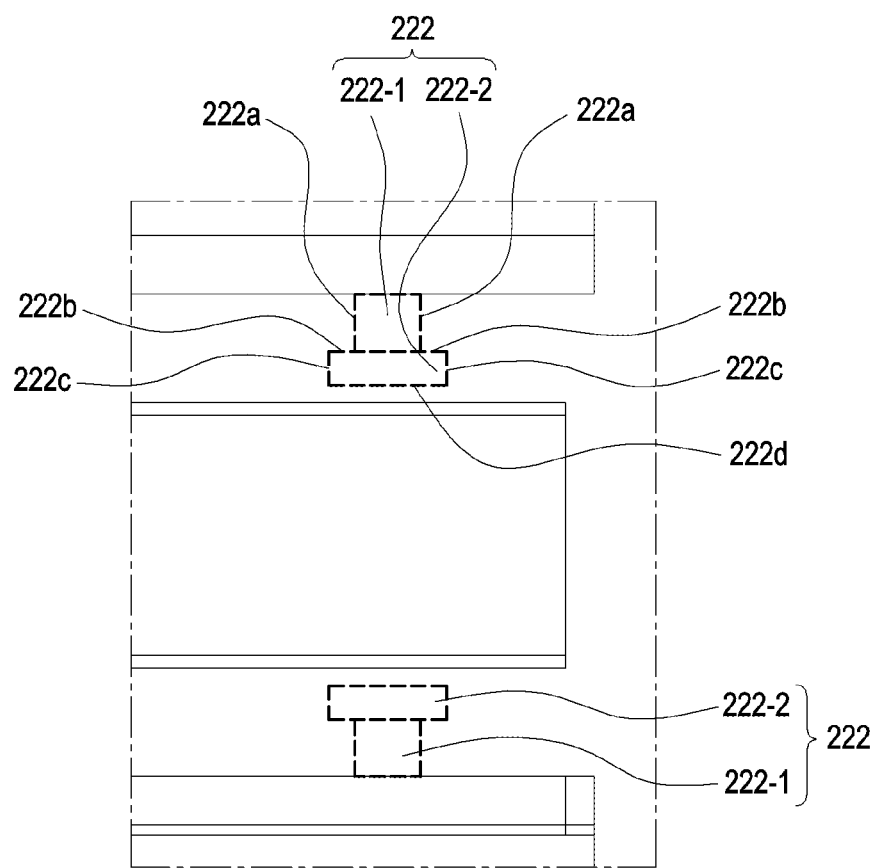
FIG. 13 is a diagram illustrating a housing including a first reception groove according to various embodiments.

FIG. 12 is a perspective view illustrating an electronic apparatus in a state in which a display is removed, according to various embodiments. FIG. 13 is a sectional view illustrating a second housing including a first reception groove according to various embodiments.

Referring to FIG. 12 and FIG. 13, the first reception groove 222 may receive a pin structure 240. The configuration of the first housing 210, the second housing 220, and the pin structure 240 of FIG. 12 and FIG. 13 may be entirely or partially identical to that of the first housing 210, the second housing 220, and the pin structure 240 of FIG. 4.

According to an embodiment, the first reception groove 222 may be formed as a structure to prevent and/or reduce the pin structure 240 from deviating with respect to the second housing 220. For example, the first reception groove 222 may include a first recess area 222-1 extending from the lateral surface 220c and/or the second surface 220b of the second housing 220 and a second recess area 222-2 extending from the first recess area 222-2 in a lengthwise direction (e.g., the Y-axis direction) of the electronic apparatus 200. A sectional area of the second recess area 222-2 may be larger than that of the first recess area 222-2. According to an embodiment, the first reception groove 222 may include a (1-1)th reception groove surface 222a extending from the lateral surface 220c and/or the second surface 220b of the second housing 220, a (1-2)th reception groove surface 222b extending from the (1-1)th reception groove surface 222a and parallel with the front surface 220b and/or the lateral surface 220c, a (1-3)th reception groove surface 222c extending from the (1-2)th reception groove surface 222b and parallel with the (1-1)th reception groove surface 222a, and a (1-4)th reception groove surface 222d extending from the (1-3)th reception groove surface 222c and parallel with the front surface 220b and/or the lateral surface 220c.

Figure 14:
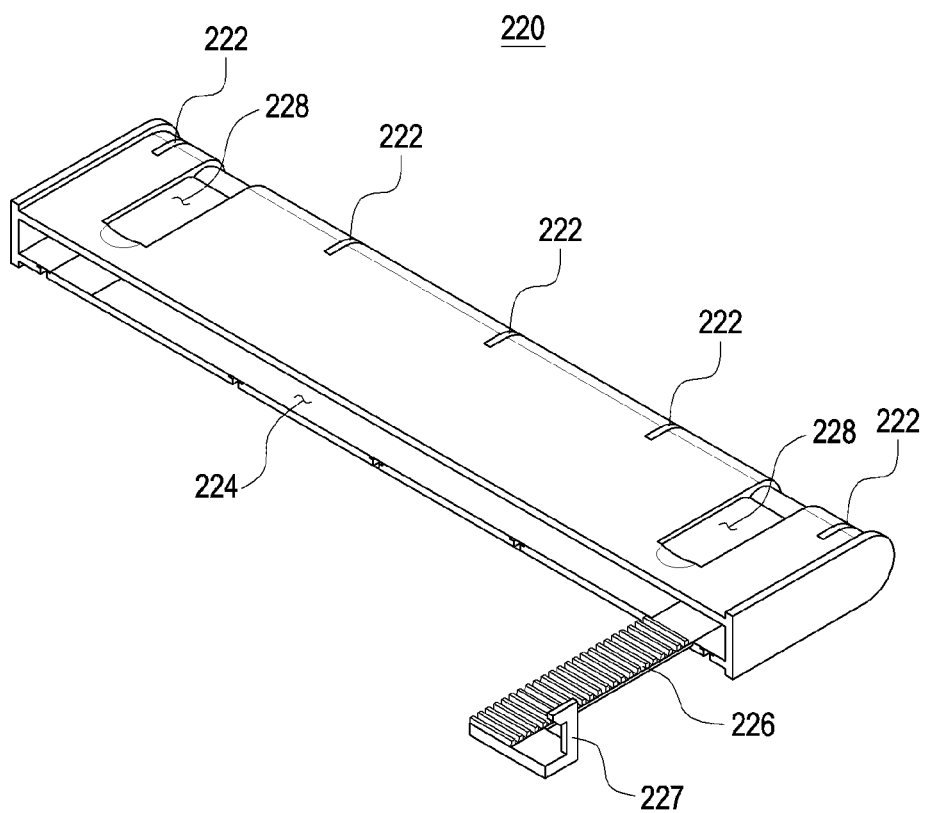
FIG. 14 is a perspective view illustrating a second housing according to various embodiments.
Figure 15:
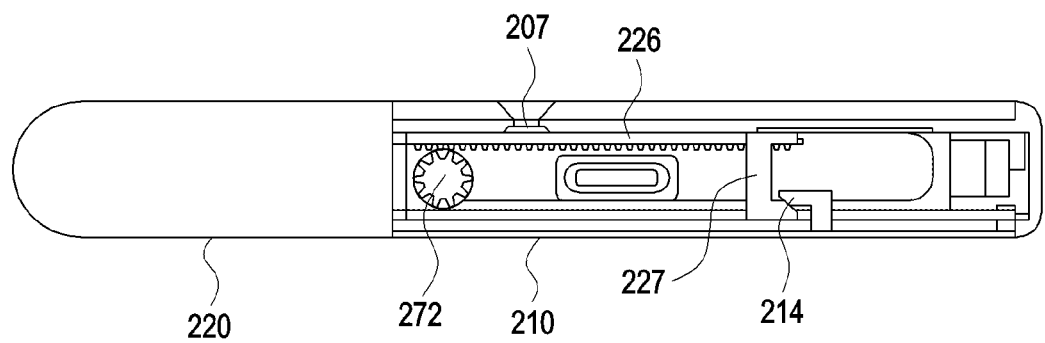
FIG. 15 is a sectional view illustrating an inside of an electronic apparatus according to various embodiments.

FIG. 14 is a perspective view illustrating a second housing according to various embodiments. FIG. 15 is a sectional view illustrating the inside of an electronic apparatus according to various embodiments.

Referring to FIG. 14 and FIG. 15, the second housing 220 may include the first reception groove 222, a fourth reception groove 224, a fifth reception groove 228, a rack gear 226, and a second hook structure 227, and the first housing 210 may include a first hook structure 214. The electronic apparatus 200 may include a gear structure 272 connected to the rack gear 226. The configuration of the first housing 210, the second housing 220, and the gear structure 272 of FIG. 14 and/or FIG. 15 may be entirely or partially identical to that of the first housing 210, the second housing 220, and the gear structure 272 of FIG. 4 and/or FIG. 7.

According to an embodiment, the second housing 220 may slide with respect to the first housing 210 using the rack gear 226. For example, the rack gear 226 may allow the second housing 220 to slide with respect to the gear structure 272 coupled to a motor module (e.g., the motor module 270 in FIG. 4). According to an embodiment, the gear structure 272 may be coupled to the first housing 210 and the rack gear 226 may extend from the second housing 220. According to an embodiment, the gear structure 272 may include a pinion gear configured to be interlocked with the rack gear 226 of the second housing 220.

According to an embodiment, the second housing 220 may include a second hook structure 227 extending from the rack gear 226 and the first housing 210 may include a first hook structure 214 to be connected to the second hook structure 227. According to an embodiment, coupling force between the first housing 210 and the second housing 220 in a state in which the electronic apparatus 200 is closed (e.g., FIG. 2) may be increased by the hook structures 214 and 227. For example, in a closed state, the first hook structure 214 and the second hook structure 227 are coupled by interference fit or hook so that the first housing 210 and the second housing 220 may be prevented and/or reduced from spacing apart from each other due to an external force unintended by a user.

According to an embodiment, the second housing 220 may include a fourth reception groove 224 facing the first housing 210. According to an embodiment, the fourth reception groove 224 may receive at least a portion (e.g., the connection area 212 in FIG. 4) of the first housing 210. For example, the fourth reception groove 224 may surround at least a portion of the connection member 212.

According to an embodiment, the electronic apparatus 200 may include a detection sensor 207 configured to measure a distance between the second housing 220 and the first housing 210. According to an embodiment, the detection sensor 207 may be disposed on the rack gear 226 and may detect a location of the rack gear 226 with respect to the first housing 210. However, the detection sensor 207 is not limited thereto. For example (not shown), the detection sensor 207 may be disposed in a motor module (e.g., the motor module 270 in FIG. 4). The configuration of the display 270 may be entirely or partially identical to that of the sensor module 176 of FIG. 1. According to an embodiment, a processor (e.g., the processor 120 in FIG. 1) may determine a distance between the second housing 220 and the first housing 210 based on information acquired by the detection sensor 207. According to an embodiment, the processor 120 may determine a distance between the second housing 220 and the first housing 210 based on a rotation amount of a motor module (not shown).

Figure 16:
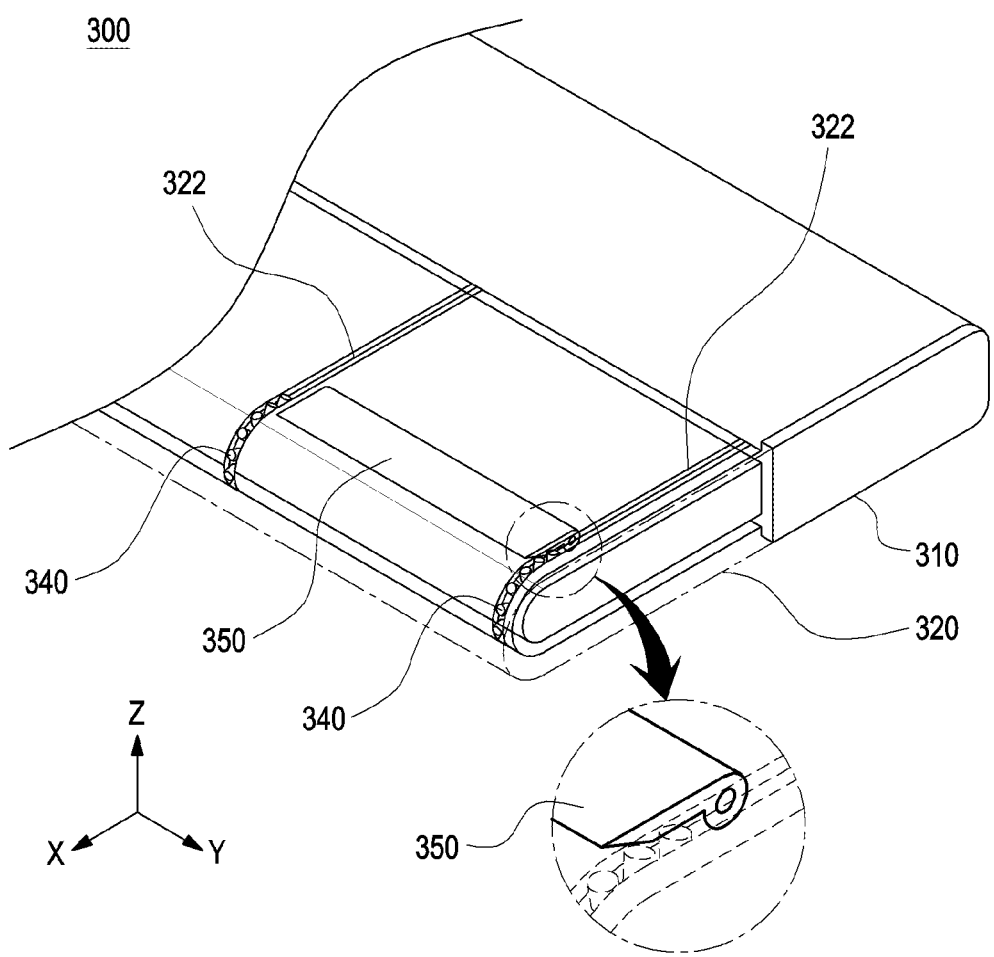
FIG. 16 is a perspective view illustrating an electronic apparatus including a second rotation member in a state in which a display is removed according to various embodiments.

FIG. 16 is a perspective view illustrating an electronic apparatus including a second rotation member in a state in which a display is removed, according to various embodiments. FIG. 17 is a sectional view of an electronic apparatus including a second rotation member in a folded state according to various embodiments. FIG. 18 is a sectional view of an electronic apparatus including a second rotation member in an unfolded state according to various embodiments. Referring to FIG. 16, FIG. 17 and FIG. 18 (which may be referred to as FIG. 16 to FIG. 18), an electronic apparatus 300 may include a first housing 310, a second housing 320, a display 330, and a pin structure 340. The configuration of the electronic apparatus 300, the first housing 310, the second housing 320, the display 330, and the pin structure 340 of FIG. 16 to FIG. 18 may be entirely or partially identical to that of the electronic apparatus 200, the first housing 210, the second housing 220, the display 230, and the pin structure 240 of FIG. 4.

According to an embodiment, the electronic apparatus 300 may include a second rotation member 350. According to an embodiment, the second rotation member 350 may be rotatably connected to the second housing 320. For example, the second rotation member 350 may be connected to the second housing 320 using a rotation axis structure 356 configured to be rotatable along a lengthwise direction (e.g., the Y-axis direction) of the electronic apparatus 300. According to an embodiment, the second rotation member 350 may support at least one of a rear surface 332b of a first display area 332 or a rear surface 334b of a second display area 334. The configuration of the second rotation member 350 of FIG. 16 and FIG. 18 may be entirely or partially identical to that of the rotation member 250 of FIG. 4.

According to an embodiment, the display 330 may include a protrusion structure 364 located under the second display area 334. According to an embodiment, the protrusion structure 364 may include a first protrusion structure surface 364a facing the second rotation member 350. For example, in case that the second housing 320 is spaced a predetermined distance apart from the first housing 310 so that the electronic apparatus 300 is opened (e.g., FIG. 18), the protrusion structure 364 may receive a portion of the second rotation member 350 and reduce or prevent movement of the second rotation member 350.

According to an embodiment, the second rotation member 350 may be spaced apart from the pin structure 340. According to an embodiment, the second rotation member 350 may be disposed between multiple second reception grooves 322 and multiple pin structures 340 may slide at a location spaced apart from the second rotation member 350. For example, the pin structure 340 may not overlap the second rotation member 350.

According to an embodiment, the second rotation member 350 may support the display 330. For example, in a state in which the electronic apparatus 300 is opened (e.g., FIG. 18), the second rotation member 350 may support the display 330 under the first display area 332 and the second display area 334. According to an embodiment, the second rotation member 350 may be inserted into the protrusion structure 364. For example, the second rotation member 350 may include a (2-1)th rotation member surface 350a facing a first protrusion structure surface 364a of the protrusion structure 364. In case that the second housing 320 is spaced a predetermined distance or more apart from the first housing 310, the second rotation member 350 may rotate with respect to the second housing 320 in a state in which the (2-1)th rotation member surface 350a is in contact with the first protrusion structure surface 364a of the protrusion structure 364.

Figure 19:
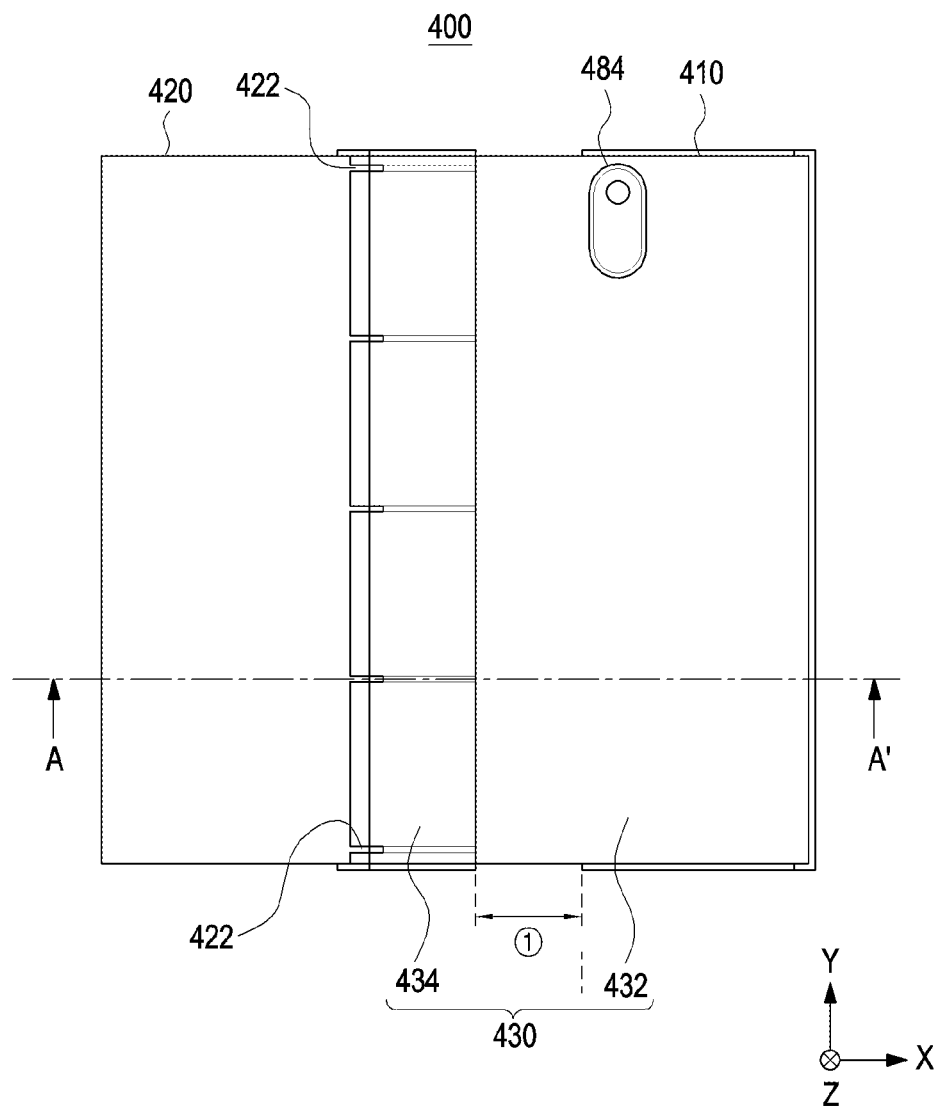
FIG. 19 is a diagram illustrating a rear view of an electronic apparatus in a state in which a third housing is received in a first housing according to various embodiments
Figure 20:
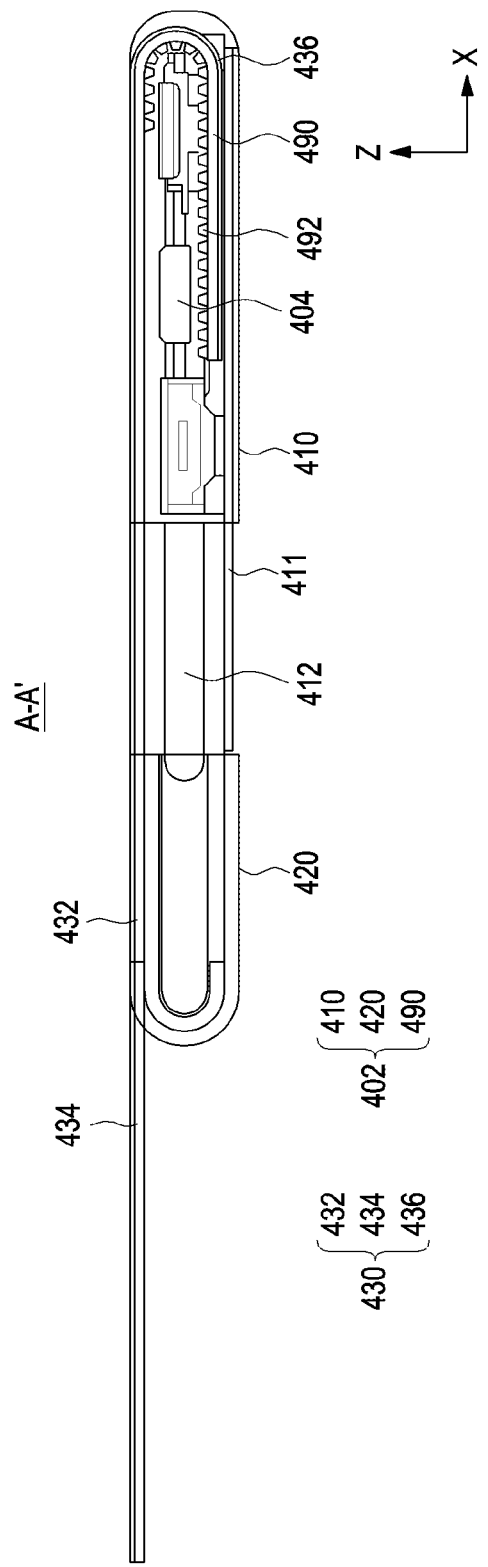
FIG. 20 is a sectional view of the electronic apparatus of FIG. 19 taken along A-A' according to various embodiments.
Figure 21:
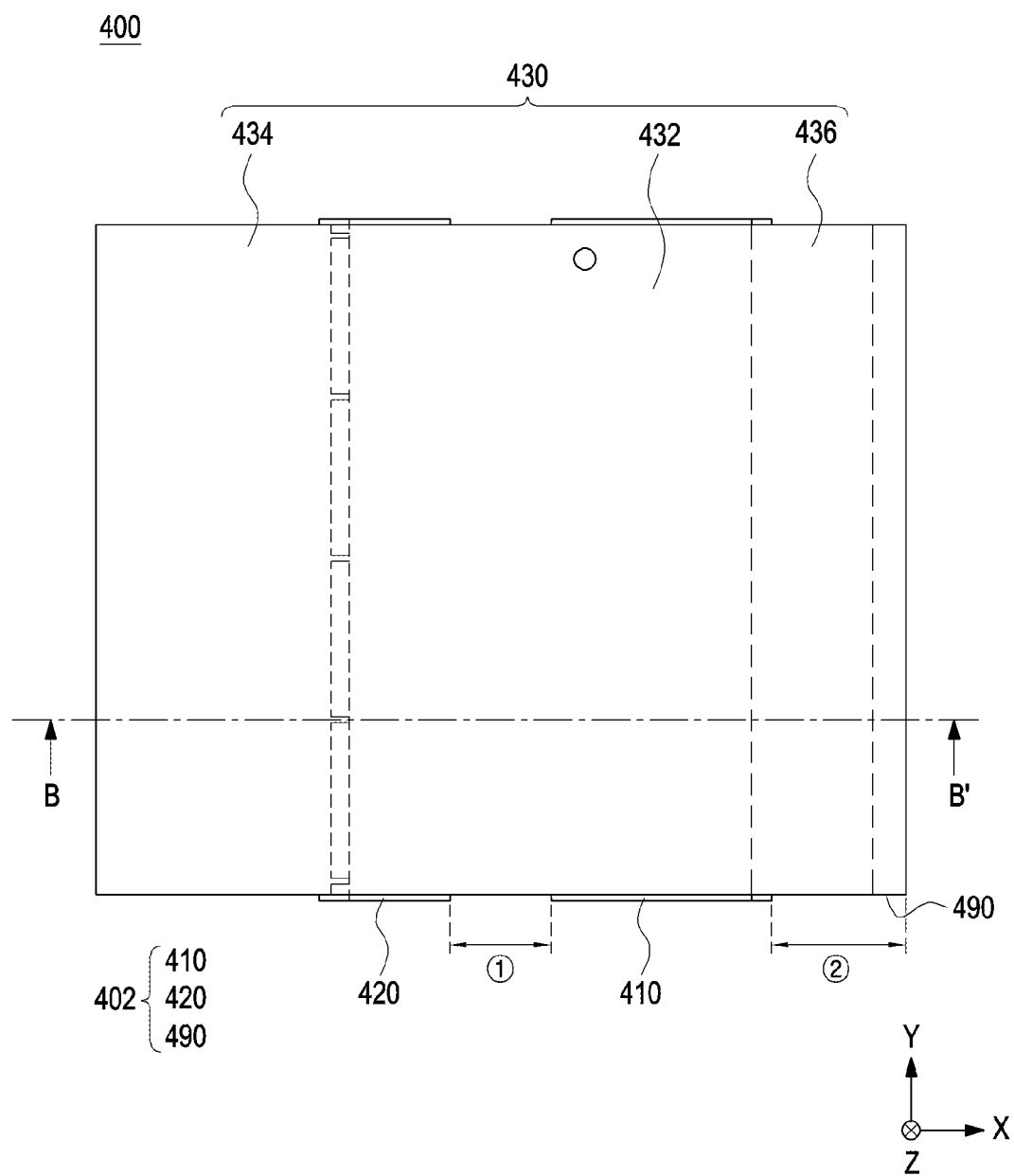
FIG. 21 is a diagram illustrating a front view of an electronic apparatus in a state in which a third housing is exposed from a first housing according to various embodiments.
Figure 22:
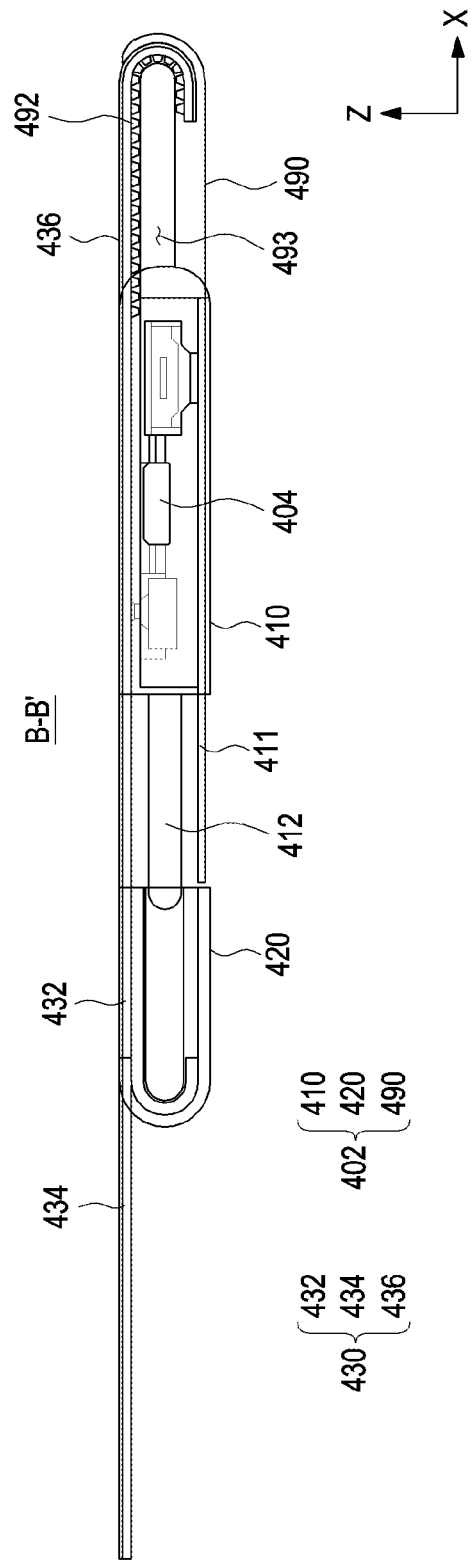
FIG. 22 is a sectional view of the electronic apparatus of FIG. 21 taken along B-B' according to various embodiments.

FIG. 19 is a diagram illustrating a rear view of an electronic apparatus in a state in which a third housing is received in a first housing according to various embodiments. FIG. 20 is a sectional view of the electronic apparatus of FIG. 19 taken along A-A' according to various embodiments. FIG. 21 is a diagram illustrating a front view of an electronic apparatus in a state in which a third housing is exposed from a first housing according to various embodiments. FIG. 22 is a sectional view of the electronic apparatus of FIG. 21 taken along B-B' according to various embodiments.

The state shown in FIG. 19 and FIG. 20 may be referred to as a state in which a third housing 490 is closed with respect to a first housing 410, and the state shown in FIG. 21 and FIG. 22 may be referred to as a state in which the third structure 490 is opened with respect to the first structure 410. According to an embodiment, a "closed state" or a "opened state" may be referred to as a state in which an electronic apparatus is closed or opened. Although, the state in which the second housing 420 is opened with respect to the first housing 410 is described in FIG. 19 to FIG. 22 for convenience of explanation, as shown in FIG. 2 to FIG. 15, the second housing 420 may be closed or opened with respect to the first housing 410.

Referring to FIG. 19 to FIG. 22, the electronic apparatus 400 may include a housing 402 including a first housing 410, a second housing 420, and a third housing 490, and a display 430 including a first display area 432, a second display area 434, and a third display area 436. The configuration of the electronic apparatus 400, the first housing 410, the second housing 420, the first display area 432, and the second display area 434 of FIG. 19 to FIG. 22 may be entirely or partially identical to that of the electronic apparatus 200, the first housing 210, the second housing 220, the first display area 232, and the second display area 234 of FIG. 2 and FIG. 3. For example, the configuration of a main circuit board 404, a rear plate 411, a first connection area 412, a first reception groove 422, and a rear camera module 484 may be entirely or partially identical to the configuration of the main circuit board 204, the rear plate 211, the first connection area 212, the first reception groove 222, and the rear camera module 284 in FIG. 2 to FIG. 4.

According to an embodiment, the third housing 490 may be referred to as a third structure, a rolling part, or a rolling housing, and may be disposed to be capable of reciprocating with respect to the first housing 410. According to an embodiment, the third housing 490 may be received (e.g., a slide-in operation) in the inside of the first housing 410 or exposed (e.g., a slide-out operation) to the outside of the first housing 410. According to an embodiment, the first housing 410 may be disposed between the second housing 420 and the third housing 490. For example, the second housing 420 may be disposed on one side of the first housing 410 to be slidable with respect to the first housing 410 and the third housing 490 may be disposed on the other side to be slidable with respect to the first housing 410.

According to an embodiment, slide movement of the second housing 420 with respect to the first housing 410 may independently occur from slide movement of the third housing 490 with respect to the first housing 410. For example, the second housing 420 may be disposed to be capable of reciprocating by a predetermined distance in a described direction (e.g., a direction indicated by arrow 11) with reference to the first housing 410 and the third housing 490 may be disposed to be capable of reciprocating by a predetermined distance in a described direction (e.g., a direction indicated by arrow C)) with reference to the first housing 410.

According to an embodiment, the display 430 may include the third display area 436 extending from the first display area 432. According to an embodiment, the third display area 436 may be disposed on at least a portion of the first housing 410 and/or the third housing 490. For example, in a state in which the third housing 490 is closed with respect to the first housing 410 (e.g., FIG. 19 and FIG. 20), the third display area 436 may be located in the inside (e.g., between the first housing 410 and the third housing 490) of the electronic apparatus 400. In a state in which the third housing 490 is opened with respect to the first housing 410 (e.g., FIG. 21 and FIG. 22), the third display area 436 may be located on the third housing 490 and the electronic apparatus 400 may be exposed to the outside. According to an embodiment, the first display area 432 and the third display are 436 may be integrally formed. For example, an area of the first display area 432 facing the third housing 490 may be referred to as the third display area 436.

Figure 23:
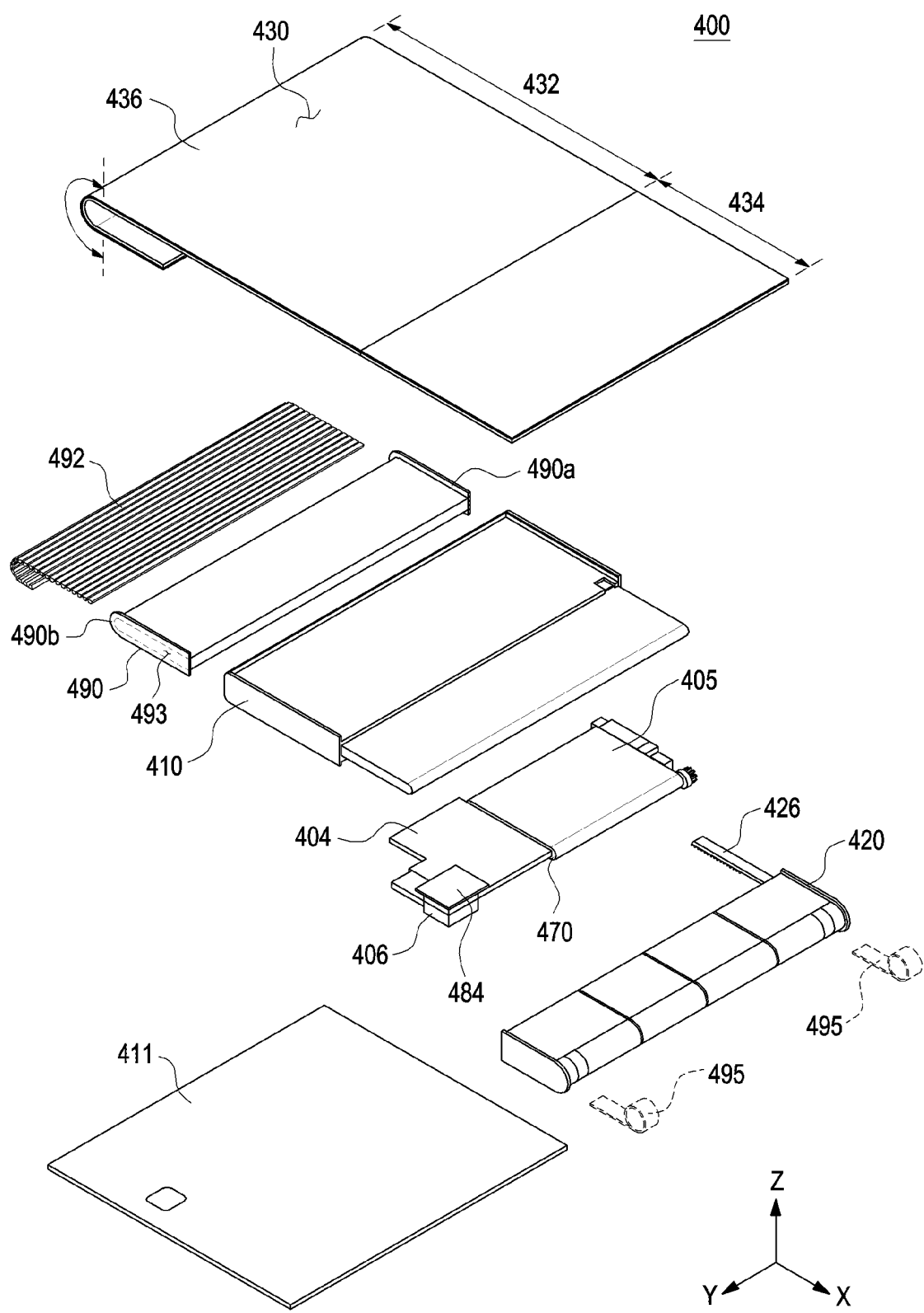
FIG. 23 is an exploded perspective view of an electronic apparatus including a third housing according to various embodiments.
Figure 24:
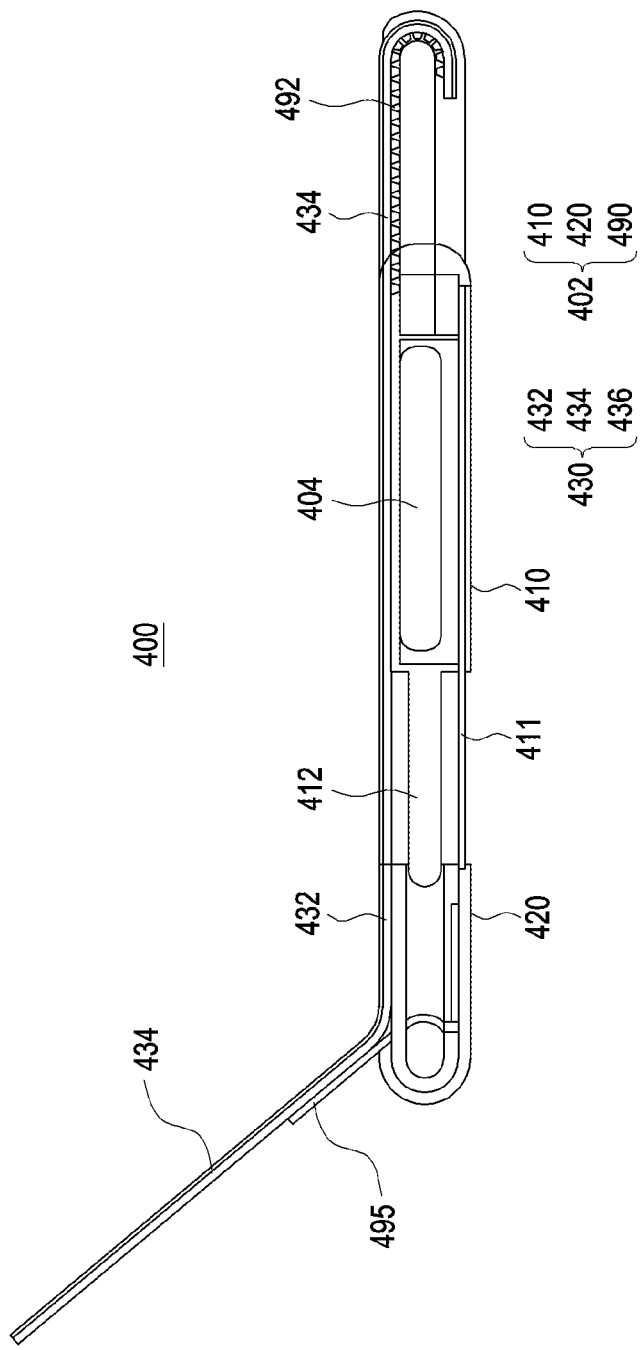
FIG. 24 is a diagram illustrating a section of an electronic apparatus including a third housing according to various embodiments.

FIG. 23 is an exploded perspective view of an electronic apparatus including a third housing according to various embodiments. FIG. 24 is a sectional view illustrating a section of an electronic apparatus including a third housing according to various embodiments.

Referring to FIG. 23 and FIG. 24, the electronic apparatus 400 may include a first housing 410, a second housing 420, a third housing 490, a display 430, a multi joint hinge structure 492, and a third rotation member 495. The configuration of the first housing 410, the second housing 420, the third housing 490, and the display 430 of FIG. 23 and FIG. 24 may be entirely or partially identical to that of the first housing 410, the second housing 420, the third housing 490, and the display 430 of FIG. 19 to FIG. 22.

According to an embodiment, the third housing 490 may be a component configured to be slidable with respect to first housing 410. According to an embodiment, the third housing 490 may receive a portion of the first housing 410. For example, the third housing 490 may include a sixth reception groove 493 configured to receive at least a portion of the first housing 410 in a closed state (e.g., FIG. 19 and FIG. 20). According to an embodiment, the first housing 410 may receive at least a portion of the third housing 490. For example, in a state in which a lateral wall 490*a* or 490*b* of the third housing 490 is inserted into the first housing 410, the third housing 490 may slide with respect to the first housing 410.

According to an embodiment, the multi joint hinge structure 492 may guide movement of the third display area 436. According to an embodiment, the multi joint hinge structure 492 may be connected to the third display area 436 of the display 430. For example, as the third housing 490 slides, the third display area 436 and the multi joint hinge structure 492 may move with respect to the third housing 490. In a closed state (e.g., FIG. 19 and FIG. 20), the multi joint hinge structure 492 may be substantially located between the first housing 410 and the third housing 490 and received in the first housing 410.

According to an embodiment, the multi joint hinge structure 492 may include multiple bars or rods. The multiple bars or rods of the multi joint hinge structure 492 may extend in a straight line along a lengthwise direction (e.g., the Y-axis direction) of the electronic apparatus 400 and may be arranged along a direction perpendicular to a slide direction of the third housing 490.

According to an embodiment, the electronic apparatus 400 may include a third rotation member 495 capable of supporting a portion (e.g., the second display area 434) of the display 430. According to an embodiment, the third rotation member 495 may be rotatably connected to the second housing 420. For example, the third rotation member 495 may include a flat spring and the third rotation member 495 may be rotatably disposed at an end part of the second housing 420.

According to an embodiment, the electronic apparatus 400 may include a main circuit board 404 received in the first housing 410. According to an embodiment, at least one of a processor (e.g., the processor 120 in FIG. 1), a battery 405 (e.g., the battery 189 in FIG. 1), a connector 406 (e.g., the connection terminal 178 in FIG. 1), a camera module 484 (e.g., the rear camera module 284 in FIG. 2), or a motor module 470 capable of transmitting driving power to a rack gear 426 of the second housing 420 may be mounted on or connected to the main circuit board 404.

According to an embodiment of the disclosure, an electronic apparatus (e.g., the electronic apparatus 200 in FIG. 5) may include a first housing (e.g., the first housing 210 in FIG. 4), a second housing (e.g., the second housing 220 in FIG. 4) configured to slide with respect to the first housing, a display (e.g., the display 230 in FIG. 4) including a first display area (e.g., the first display area 232 in FIG. 4) located on the first housing and the second housing and a second display area (e.g., the second display area 234 in FIG. 4) extending from the first display area, and a rotation support (e.g., the rotation member 250 in FIG. 7) which is rotatably connected to the second housing and configured to support the display.

According to an embodiment, the second housing may include at least one first reception groove (e.g., the first reception groove 222 in FIG. 4) and the electronic apparatus may further include at least one pin (e.g., the pin structure 240 in FIG. 4) disposed under the first display area and configured to move along the at least one first reception groove.

According to an embodiment, the rotation support may include at least one second reception groove (e.g., the second reception groove 252 in FIG. 8A) configured to receive at least one pin, and the at least one second reception groove may be arranged to correspond to the at least one first reception groove.

According to an embodiment, the display may further include a display support (e.g., the display support member 260 in FIG. 9) including a flexible area (e.g., the flexible area 261 in FIG. 9) configured to support the first display area and a rigid area (e.g., the rigid area 262 in FIG. 9) configured to support the second display area, and the at least one pin may be coupled to the flexible area.

According to an embodiment, the display support member may include a protrusion (e.g., the protrusion structure 264 in FIG. 7) extending from the rigid area, and the rotation support may include a third reception groove (e.g., the third reception groove 254 in FIG. 7) configured to receive the protrusion.

According to an embodiment, the flexible area may include multiple bars (e.g., the bar 265 in FIG. 11A) or multiple through-holes (e.g., the through-hole 266 in FIG. 11B).

According to an embodiment, the first housing may include a first surface (e.g., the first surface 210*a* in FIG. 5) facing the second housing and a connection area (e.g., the connection area 212 in FIG. 4) protruding from the first surface, and the second housing may include a fourth reception groove (e.g., the fourth reception groove 224 in FIG. 14) configured to receive the connection area.

Figure 6A:
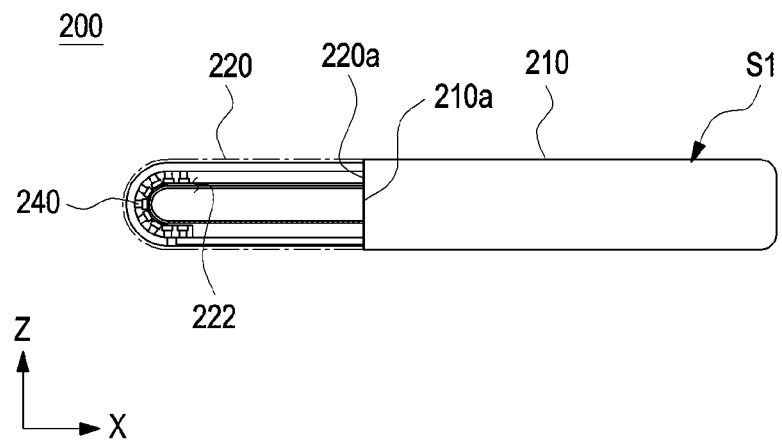
FIG. 6A, FIG. 6B, FIG. 6C, FIG. 6D, and FIG. 6E are diagrams of an electronic apparatus illustrating movement of a second housing and a display according to various embodiments.
Figure 6B:
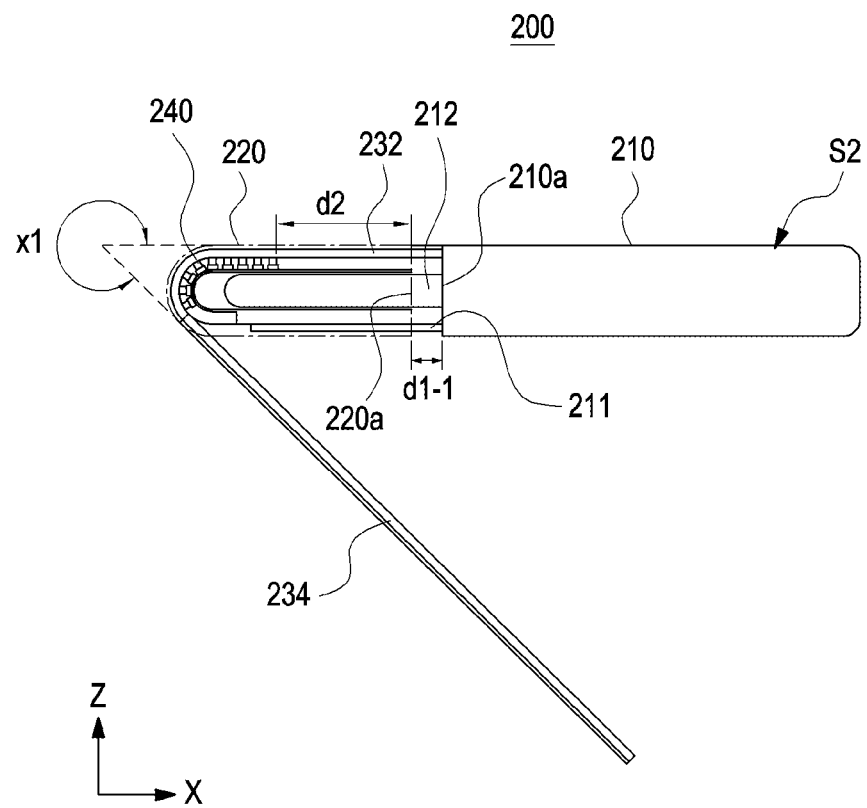
Figure 6C:
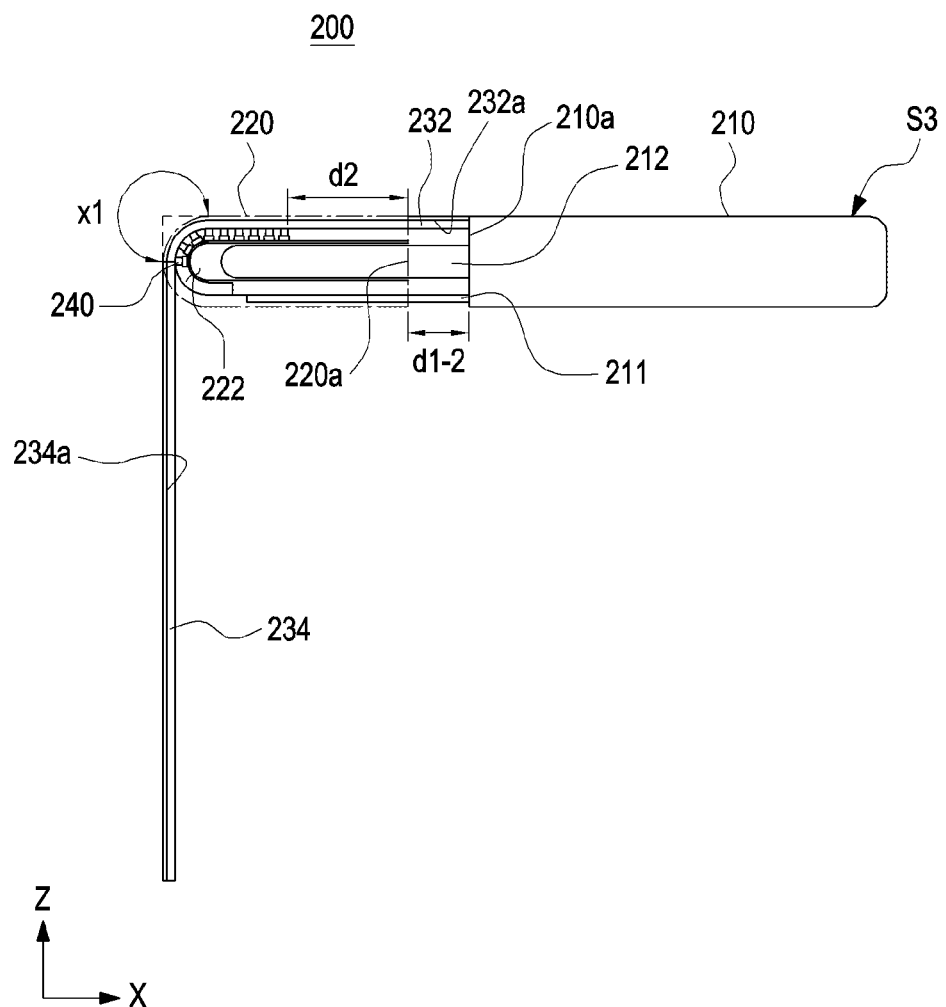
Figure 6D:
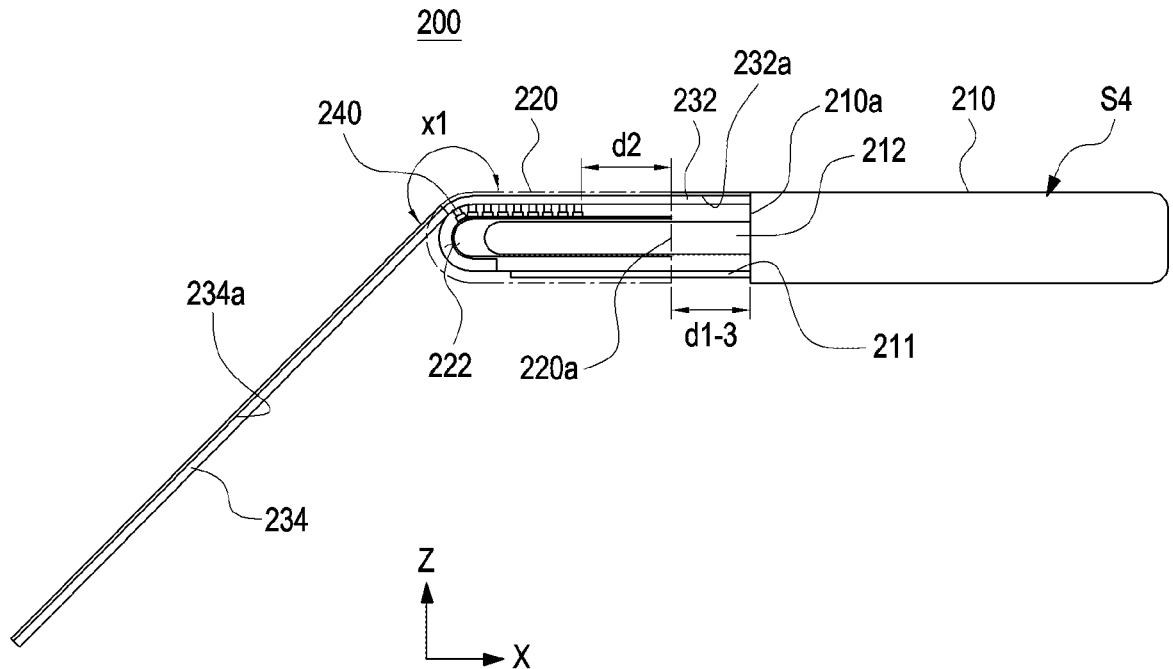
Figure 6E:
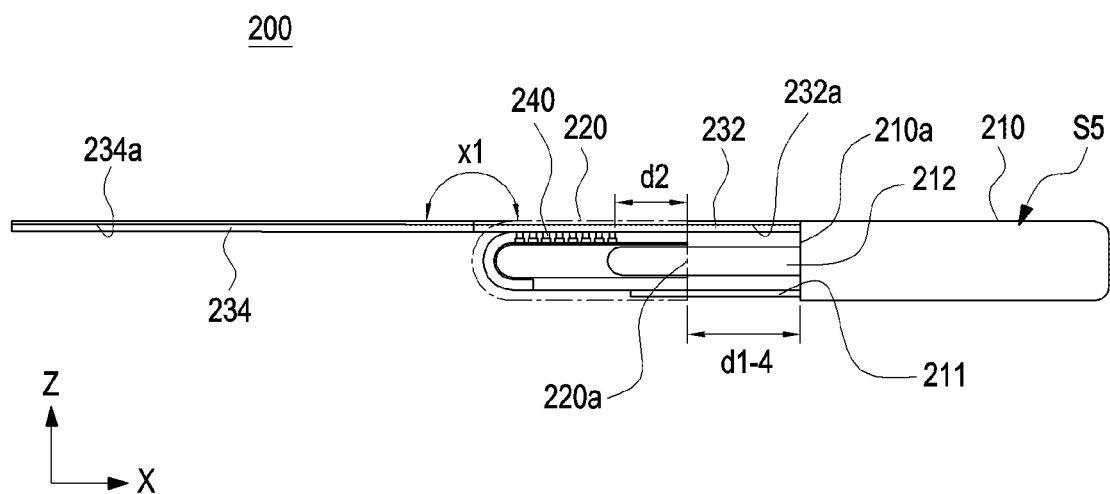

According to an embodiment, the second housing may include a second surface (e.g., the second surface 220*a* in FIG. 5) facing the first surface, and a second distance (e.g., the second distance d2 in FIG. 6B) between the at least one pin and the second surface may be reduced based on a first distance (e.g., the (1-1)th distance d1-1 in FIG. 6B, the (1-2)th distance d1-2 in FIG. 6C, the (1-3)th distance d1-3 in FIG. 6D, or the (1-4)th distance d1-4 in FIG. 6E) between the first surface and the second surface being increased.

According to an embodiment, a size of a first angle (e.g., the first angle xl in FIG. 6B) between the second display area and the first display area may be reduced based on the second distance is reduced.

According to an embodiment, the electronic apparatus may further include a motor module (e.g., the motor module 270 in FIG. 4) including a motor configured to generate driving power for slide movement of the second housing, and the second housing may include a rack gear (e.g., the rack gear 226 in FIG. 4) connected to the motor module.

According to an embodiment, the second housing may include a hook (e.g., the second hook structure 227 in FIG. 14) extending from the rack gear, and the first housing may include a first hook (e.g., the first hook structure 214 in FIG. 15) to be connected to the second hook.

According to an embodiment, the electronic device may comprise a camera module (e.g., the camera module 284 in FIG. 2) including at least one camera, and the second display area may be configured to cover the camera module.

According to an embodiment, the second housing may include a fifth reception groove (e.g., the fifth reception groove 228 in FIG. 14) configured to receive the rotation support.

According to an embodiment, the rotation support (e.g., the second rotation member 350 in FIG. 16) may be disposed between first reception grooves (e.g., the first reception groove 322 in FIG. 16), and the rotation support may be spaced apart from the pin (e.g., the pin structure 340 in FIG. 16).

According to an embodiment, an electronic apparatus (e.g., the electronic apparatus 400 in FIG. 21) may further include a third housing (e.g., the third housing 490 in FIG. 22) configured to slide with respect to the first housing, the first housing may be located between the second housing and the third housing, and the display may include a third display area (e.g., the third display area 436 in FIG. 21) extending from the first display area and disposed on the third housing.

According to an embodiment, the electronic apparatus may further include a multi joint hinge structure (e.g., the multi joint hinge structure 492 in FIG. 23) located between the third housing and the third display area and configured to guide movement of the third display area.

According to an embodiment, an electronic apparatus may include a first housing (e.g., the first housing 210 in FIG. 4), a second housing (e.g., the second housing 220 in FIG. 4) including at least one first reception groove (e.g., the first reception groove 222 in FIG. 4) and configured to slide with respect to the first housing, a display (e.g., the display 230 in FIG. 4) including a first display area (e.g., the first display area 232 in FIG. 4) disposed on the first housing and the second housing, a second display area (e.g., the second display area 234 in FIG. 4) extending from the first display area, and a display support (e.g., the display support member 260 in FIG. 9) including a flexible area (e.g., the flexible area 261 in FIG. 9) configured to support the first display area and a rigid area (e.g., the rigid area 262 in FIG. 9) configured to support the second display area, at least one pin (e.g., the pin structure 240 in FIG. 4) disposed under the flexible area and configured to slide along the at least one first reception groove, and a rotation support (e.g., the rotation member 250 in FIG. 7) rotatably connected to the second housing and aligned to correspond to the at least one first reception groove, and wherein the rotation support includes at least one second groove (e.g., the reception groove 282 in FIG. 8a) configured to receive the at least one pin.

According to an embodiment, the display support may include a protrusion (e.g., the protrusion structure 264 in FIG. 7) extending from the rigid area, and the rotation support may include a third reception groove (e.g., the third reception groove 254 in FIG. 7) configured to receive the protrusion.

According to an embodiment, the first housing may include a first surface (e.g., the first surface 210a in FIG. 7) facing the second housing and a connection area (e.g., the connection area 212 in FIG. 7) protruding from the first surface, and the second housing may include a fourth reception groove (e.g., the fourth reception groove 224 in FIG. 14) configured to receive the connection area.

According to an embodiment, the electronic apparatus may further include a motor module (e.g., the motor module 270 in FIG. 4) including a motor configured to generate driving power for slide movement of the second housing, and the second housing may include a rack gear (e.g., the rack gear 226 in FIG. 4) connected to the motor module.

According to an embodiment, an electronic apparatus (e.g., the electronic apparatus 400 in FIG. 19) may further include a third housing (e.g., the third housing 490 in FIG. 20) configured to slide with respect to a first housing (e.g., the first housing 410 in FIG. 20), and the first housing may be located between a second housing (e.g., the second housing 420 in FIG. 19) and the third housing.

Figure 25:
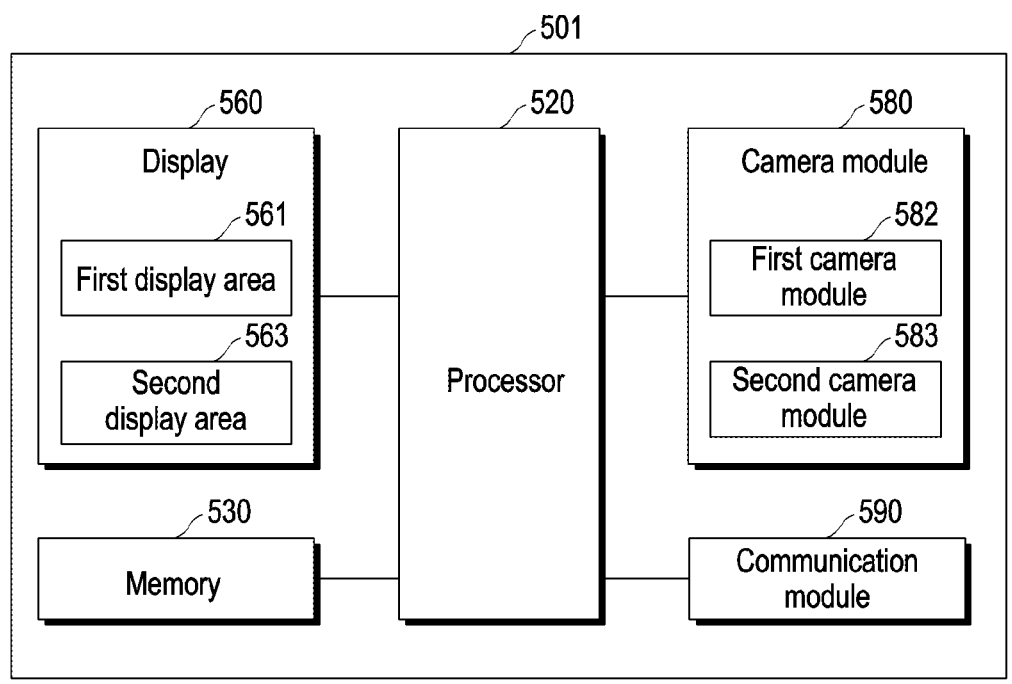
FIG. 25 is a block diagram illustrating an example configuration of an electronic apparatus according to various embodiments.

FIG. 25 is a block diagram illustrating an example configuration of an electronic apparatus according to various embodiments.

Referring to FIG. 25, the electronic apparatus 501 (e.g., the electronic apparatus 101 in FIG. 1) may include a processor (e.g., including processing circuitry) 520, a memory 530, a display 560, a camera module (e.g., including a camera) 580, and/or a communication module (e.g., including communication circuitry) 590.

According to an embodiment, the processor 520 may include various processing circuitry and control the overall operation of the electronic apparatus 501 and may be the same as or similar to the processor 120 in FIG. 1 or perform at least one function or operation performed by the processor 120.

According to an embodiment, the processor 520 may variously use a transparent second display area 563 (e.g., the second display area 234 in FIG. 2) of the display 560 according to a function being executed in the electronic apparatus or a type of an application.

According to an embodiment, the processor 520 may adjust an electrical signal with respect to at least a partial area of the transparent second display area 563 (e.g., the second display area 234 in FIG. 2) included in the display 560 to change a property of the second display area 563 (e.g., the second display area 234 in FIG. 2).

According to an embodiment, the processor 520 may adjust, when a camera application is executed, an electrical signal of the transparent second display area 563 (e.g., the second display area 234 in FIG. 2) included in the display 560 (e.g., the display 230 in FIG. 2) to change a property of the second display area 563 and reflect the changed property of the second display area on an image received through the camera module 580 to be displayed on the display 560.

According to an embodiment, in a first state (e.g., the first state s1 in FIG. 6A) in which the second display area 563 (e.g., the second display area 234 in FIG. 2) of the display 560 covers a first camera module 581 (e.g., the rear camera module 284 in FIG. 2) of the camera module 580, the processor 520 may execute the camera application. In case that an electrical signal with respect to a first transparent area of the second display area 563 in contact with the first camera module 581 is adjusted in the first state so that a property of the first transparent area is changed, the processor 520 may reflect the changed property of the first transparent area on an image received from the first camera module 581 to be displayed on a second transparent area of the second display area 563 or the first display area 561 (e.g., the first display area 232 in FIG. 2).

According to an embodiment, in case that the camera application is executed, the processor 520 may adjust an electrical signal with respect to the first transparent area of the second display area 563 to correspond to a filter type selected by a user among multiple filter types so as to change a property of the first transparent area and reflect a filter effect corresponding to the selected filter type on an image received from the second camera module 583 to be displayed on a second transparent area of the second display area 563 or the first display area 561.

According to an embodiment, the filter type which may be provided by adjusting an electrical signal with respect to the first transparent area of the second display area 563 may include an ultraviolet filter (UV filter), a neutral density filter (ND filter), a circular polarizing filter (CPL filter), a cross filter, and a polarizing filter.

According to an embodiment, the processor may express a color in software on a first transparent area of the second display area 563 and provide various color filters and/or gradation filters while light is input to the first camera module 583.

According to an embodiment, in case that the camera application is executed in the first state (e.g., the first state s1 in FIG. 6A), the processor 520 may activate a first camera interface (e.g., a preview mode for general photographing) configured to display an image received through the first camera module 581 on the first display area 561 (e.g., the first display area 232 in FIG. 2).

According to an embodiment, in case that in the first camera interface, an electrical signal with respect to a first transparent area of the second display area 563 is adjusted to correspond to a filter type selected by a user among multiple filter types so that a property of the first transparent area is changed, the processor 520 may reflect a filter effect corresponding to the selected filter type on an image received through the first camera module 581 to be displayed on the first display area 561.

According to an embodiment, the processor 520 may display multiple filter types which may be selected by a user on the first display area 561.

According to an embodiment, the processor 520 may display information on the filter type which is currently applied on the first display area 561.

According to an embodiment, in case that the camera application is executed in the first state (e.g., the first state s1 in FIG. 6A), the processor 520 may activate a second camera interface (e.g., a preview mode for selfie photographing) configured to display an image received through the first camera module 581 on a first transparent area of the second display area 561 (e.g., the display area 234 in FIG. 2).

According to an embodiment, the second camera interface (e.g., a preview mode for selfie photographing) may represent a camera interface configured to display an image received through the first camera module 581 which is a main camera module of the electronic apparatus 501 and a rear camera module, on the second display area 561 (e.g., the display area 234 in FIG. 2) which is a transparent rear display area.

According to an embodiment, in case that a camera application is activated and an image received through the first camera module 581 is selected to be displayed on a first transparent area of the second display area 561 (e.g., the second display area 234 in FIG. 2), the processor 520 may activate the second camera interface.

According to an embodiment, the processor 520 may display a UI for activating the second user interface on the first display area 561 in the first camera interface configured to display an image on the first display area 561 (e.g., the front display area) and activate the second camera interface in case the UI is selected.

According to an embodiment, the processor 520 may distinguish a first transparent area in contact with the first camera module 581 and a second transparent area for displaying an image received through the first camera module 581 in the second camera interface, and in case that an electrical signal with respect to the first transparent area of the second display area 563 is adjusted to correspond to a filter type selected by a user among multiple filter types so that a property of the first transparent area is changed, reflect a filter effect corresponding to the selected filter type on an image received through the first camera module 581 to be displayed on the first transparent area of the second display area 562.

According to an embodiment, the processor 520 may display multiple filter types which may be selected by a user on the second transparent area of the second display area 563.

According to an embodiment, the processor 520 may display information on a filter which is currently applied on the second transparent area of the second display area 563.

According to an embodiment, in case that the second camera interface is activated, the processor 520 may differently adjust electrical signals with respect to a first transparent area in contact with the first camera module 581 and a second transparent area for displaying an image received through the first camera module 581 in the second camera interface.

According to an embodiment, the processor 520 may divide the second transparent area into a first area for displaying an image and a second area for not displaying an image in the second camera interface and adjust electrical signals with respect to the first area and the second area to be different from each other to provide different transparencies, respectively. For example, the processor 520 may provide a selfie photographing effect by applying a lowest transparency value to the first area for displaying an image received from the first camera module 561 and applying a lowest transparency value to the second area for not displaying an image in the second camera interface.

According to an embodiment, in a state in which the second display area 563 (e.g., the second display area 234 in FIG. 2) of the display 560 (e.g., the display 230 in FIG. 2) is opened (e.g., one of the second state s2 to the fifth state s5 in FIG. 6B to FIG. 6E, and the sixth state s6 to the ninth state s9 in FIG. 8A to FIG. 8D), the processor 520 may photograph, through the camera module 580, an image corresponding to a document seen through the transparent second display area 563, extract and translate text from the photographed image, and then display the translated text on the second display area 563.

According to an embodiment, in case that the second display area 563 is located on a document so that the document is seen through the transparent second display area 563, and the rotatable camera module 580 photographs an image corresponding to the document seen through the second display area 563 in a state in which the second display area 563 is opened, the processor 520 may detect text from the photographed image, translate the text into a language selected by a user, and display the translated text on the second display area 563. The processor 520 may display the translated text having the same inclination as that of text included in the document seen through the second display area 563.

According to an embodiment, in a state in which the second display area 563 (e.g., the second display area 234 in FIG. 2) of the display 560 (e.g., the display 230 in FIG. 2) is opened (e.g., the fifth state s5 in FIG. 6E), the processor 520 may receive, through the first camera module 581 (e.g., the rear camera module 284 in FIG. 2), an external object seen through the transparent second display area 563 and display information on the received external object on the first display area 561 (e.g., the first display area 232 in FIG. 2).

According to an embodiment, in a state in which the second display area 563 is opened (e.g., the fifth state s5 in FIG. 6E), the processor 520 may search information on a first external object received through the first camera module 581 of the at least one external object seen through the transparent display area 563 through the memory 530 and/or the Internet and display the information on the first external object on the first display area 561.

According to an embodiment, in case that a location-related application is executed on the first display area 561 (e.g., the first display area 232 in FIG. 2) in a state in which the second display area 563 (e.g., the second display area 234 in FIG. 2) of the display 560 (e.g., the display 230 in FIG. 2) is opened (e.g., the fifth state s5 in FIG. 6E), the processor 520 may display direction information related to location information displayed on the first display area 561 through augmented reality (AR) in the transparent second display area 563.

According to an embodiment, in case that the processor 520 displays location information indicating guiding to a destination input by a user by executing a location-related application (e.g., a navigation application) on the first display area 561 in a state in which the second display area 563 is opened (e.g., the fifth state s5 in FIG. 6E), the processor 520 may recognize a current location (e.g., a real street) seen through the transparent second display area 563 through the first camera module 581 (e.g., the rear camera module 284 in FIG. 2) and detect a current location of the electronic apparatus 501 and a travel direction from the current location to a destination using a sensor module (e.g., the sensor module 176 in FIG. 1) provided in the electronic apparatus 501. During displaying location information indicating guiding to a destination input by a user by executing a location-related application (e.g., a navigation application) on the first display area 561, the processor 520 may display direction information to a destination from a current location (e.g., a real street) through augmented reality (AR) in the second display area 563.

According to an embodiment, in case that a predetermined area is drawn by a touch input on the second display area 563 in a state in which the second display area 563 (e.g., the second display area 234 in FIG. 2) of the display 560 (e.g., the display 230 in FIG. 2) covers the first display area 581 (e.g., the first display area 231 in FIG. 2), the processor 520 may capture a partial image or an entire image corresponding to the predetermined area of an image displayed on the first display area 561 and in case the second display area 563 is opened, display the captured partial image or entire image on the second display area 563.

According to an embodiment, during displaying an image on the first display area 561 in a first state in which the second display area 563 covers the first camera module 581 (e.g., the rear camera module 284 in FIG. 2), the processor 520 may detect a state in which the second display area 563 is opened to cover the first display area. In case that a predetermined area is selected through a touch input on the second display area 563 covering the first display area 561 displaying the image, the processor 520 may capture a partial image or an entire image corresponding to the predetermined area of the image being displayed on the first display area 561. In case that the second display area 563 is in an opened state (e.g., one of the first state s1 to fifth state s5 and the sixth state s6 to the ninth state s9 in FIG. 2) while the second display area 563 covers the first display area 561, the processor 520 may display the captured partial image or entire image on a location corresponding to a predetermined area in which the touch input is detected in the second display area 563.

According to an embodiment, in case that the second display area 563 is in a state of covering the first display area 561 during displaying the captured partial image or entire image on the second display area 563 in an opened state (e.g., one of the first state s1 to the fifth state s5 and the sixth state s6 to the ninth state s9 in FIG. 2) of the second display area 563, the processor 520 may copy a partial image having been displayed on the second display area 563 and display the copied image on the first display area 561.

For example, during displaying a first image on the first display area 561, the processor 520 may capture the first image and display the captured image on the second display area 563 through an operation of converting from a state in which the second display area 563 covers the first display area 561 to an opened state. During executing and displaying a text application or a messenger application on the first display area 561, in case that the second display area 563 is converted to be in a state of covering the first display area 561, the processor 520 may transmit the first image having been displayed on the second display area 563 to a counterpart selected through the text application or a counterpart who conducting a conversation with the messenger application.

According to an embodiment, in a first state (e.g., the first state s1 in FIG. 6A) in which the second display area 563 (e.g., the second display area 234 in FIG. 2) of the display 560 (e.g., the display 230 in FIG. 2) covers the first camera module 581 (e.g., the rear camera module 284 in FIG. 2), the processor 520 may realize a digital CMF (color, material, finish) image on the second display area 563.

According to an embodiment, the processor 520 may generate and display a first CMF image on a portion of the second display area 563 and generate and display a second CMF image on another portion of the second display area 563. For example, the processor 520 may generate and display a first CMF image corresponding to a fish tank image on a portion of the second display area 563 and generate and display a second CMF image for making another portion of the second display area 563 to be opaque.

According to an embodiment, in a state in which the second display area 563 (e.g., the second display area 234 in FIG. 2) of the display 560 (e.g., the display 230 in FIG. 2) is opened (e.g., the sixth state s6 in FIG. 8A), the processor 520 may perform a dual screen function by which the first display area 561 and the second display area 563 are used as one screen area.

According to an embodiment, in a state in which the second display area 563 (e.g., the second display area 234 in FIG. 2) of the display 560 (e.g., the display 230 in FIG. 2) is opened (e.g., the second state s2 in FIG. 6B or the third state s3 in FIG. 6C), the processor 520 may display the same or different videos or images on each of the first display area 561 and the second display area 563.

According to an embodiment, while the electronic apparatus 501 in a state in which the second display area 563 is opened (e.g., the second state s2 in FIG. 6B or the third state s3 in FIG. 6C) stands in a self-standing state, the processor 520 may display the same or different videos or images on each of the first display area 561 and the second display area 563.

According to an embodiment, in case that an image is drawn on the second display area 563 by a touch input and the second display area 563 is converted to be in a state of covering the first display area 561 in a state in which the second display area 563 (e.g., the second display area 234 in FIG. 2) of the display 560 (e.g., the display 230 in FIG. 2) is opened (e.g., the fifth state s5 in FIG. 6E), the processor 520 may store the image drawn on the second display area in a file format. In case that the second display area 563 is converted to be in an opened state (e.g., the fifth state s5 in FIG. 6E), the processor 520 may transmit the image drawn by a touch input on the second display area 563 to a counterpart input through a text application executed on the first display area 561 or a counterpart conducting conversation through a messenger application executed.

According to an embodiment, in a state in which the second display area 563 (e.g., the second display area 234 in FIG. 2) of the display 560 (e.g., the display 230 in FIG. 2) is opened (e.g., the fifth state s5 in FIG. 6E), the processor 520 may concurrently execute different applications on the first display area 561 (e.g., the first display area 232 in FIG. 2) and the second display area 563, respectively.

According to an embodiment, in case that the display area 560 further includes a slidable third display area (e.g., the third display area 436 in FIG. 19 to FIG. 24), in a state in which the second display area 563 and the third display area are opened, the processor 520 may concurrently execute different applications on the first display area 561, the second display area 563, and the third display area, respectively.

According to an embodiment, the processor 520 may adjust a size of an icon displayed on the transparent display area 563 (e.g., the second display area 234 in FIG. 2) of the display 560 (e.g., the display 230 in FIG. 2) according to a distance between a user and the electronic apparatus 501.

According to an embodiment, the processor 520 may display an icon displayed on the second display area 563 in a small size to correspond to a distance between the user and the electronic apparatus 501 in case that the distance between the user and the electronic apparatus 501 is short so as to improve usability.

According to an embodiment, the processor 520 may display an icon displayed on the second display area 563 in a large size to correspond to a distance between the user and the electronic apparatus 501 in case that the distance between the user and the electronic apparatus 501 is long so as to improve usability.

According to an embodiment, the processor 520 may measure a distance between a user and the electronic apparatus using a distance-recognizable sensor (e.g., a proximity sensor) of a sensor module (e.g., the sensor module 170 in FIG. 1) included in the electronic apparatus 501 or a ToF camera module.

According to an embodiment, the memory 530 may be implemented substantially identical or similar to the memory 130 in FIG. 1.

According to an embodiment, the display 560 may be implemented substantially identical or similar to the display module 160 in FIG. 1.

According to an embodiment, the display 560 (e.g., the display 230 in FIG. 2) may be a flexible display including a first display area 561 (e.g., the first display area 232 in FIG. 2) and a transparent second display area 563 (e.g., the second display area 234 in FIG. 2).

According to an embodiment, the second display area 563 may extend from the first display area 561.

According to an embodiment, the display 560 may be a flexible display including the first display area 561, the transparent second display area 563, and a third display area (e.g., the third display area 436 in FIG. 19 to FIG. 24).

According to an embodiment, the camera module 580 may be implemented substantially identical or similar to the camera module 180 in FIG. 1.

According to an embodiment, the camera module 580 may include a camera and include a first camera module 581 (e.g., the rear camera module 284 in FIG. 2) and a second camera module 583 (e.g., the front camera module 282).

According to an embodiment, the camera 580 may include a rotatable camera module.

According to an embodiment, the communication module 590 may include various communication circuitry and be implemented substantially identical or similar to the communication module 190 in FIG. 1, and may include multiple communication circuits using different communication technologies including the communication module 290.

According to an embodiment, the communication module 590 may include a UWB communication module capable of transmitting/receiving a UWB signal to/from an external electronic apparatus using multiple antennas for UWB communication.

According to an embodiment, the communication module 590 may include at least one of a wireless LAN module (not shown) and a near field communication module (not shown), and include a Wi-Fi communication module, an NFC communication module, a Bluetooth legacy communication module, and/or a BLE communication module as the near field communication module (not shown).

According to an example embodiment, an electronic apparatus (e.g., the electronic apparatus 101 in FIG. 1, the electronic apparatus 200 in FIG. 2, the electronic apparatus 200 in FIG. 3, the electronic apparatus 400 in FIG. 4, or the electronic apparatus 501 in FIG. 25) may include: a flexible display (e.g., the display area 230 in FIG. 2 or the display area 560 in FIG. 25) including a first display area (e.g., the first display area 232 in FIG. 2 or the first display area 561 in FIG. 25) and a transparent second display area (e.g., the second display area 234 in FIG. 2 or the second display area 563 in FIG. 25), a camera module including at least one camera (e.g., the camera module 160 in FIG. 1 or the camera module 580 in FIG. 25) including a first camera module (e.g., the rear camera module 284 in FIG. 2 or the first camera module 581 in FIG. 25) and a second camera module (e.g., the front camera module 282 in FIG. 2 or the second camera module 583 in FIG. 25), and a processor (e.g., the processor 120 in FIG. 1 or the processor 520 in FIG. 25), wherein the processor may be configured to: execute a camera module application in a first state in which the second display area covers the first camera module; and, based on a property of a first transparent area being changed by adjusting an electrical signal with respect to the first transparent area of the second display area abutting the first camera module, reflect a changed property of the first transparent area on an image received from the first camera module to display the image on a second transparent area of the second display area or the first display area.

According to an example embodiment, the second display area may extend from the first display area.

According to an example embodiment, the first camera module may include a rear camera module and the second camera module may include a front camera module.

According to an example embodiment, based on an electrical signal with respect to the first transparent area being adjusted to correspond to a filter type selected among multiple filter types so that a property of the first transparent area is changed, the processor may be configured to reflect a filter effect corresponding to the selected filter type on an image received through the first camera module to be displayed on the first display area or the second transparent area.

According to an example embodiment, the processor may be configured to reflect the changed property of the first transparent area on the image received from the first camera module to be displayed on the first display area in a first camera interface for displaying the image received from the first camera module on the first display area.

According to an example embodiment, the processor may be configured to reflect the changed property of the first transparent area on the image received from the first camera module to be displayed on the second transparent area in a second camera interface for displaying the image received from the first camera module on the second transparent area of the second display area.

According to an example embodiment, based on a camera application being executed and an image received from the first camera module is selected to be displayed on the second transparent area of the second display area, the processor may be configured to activate the second camera interface.

According to an example embodiment, the processor may be configured to display a user interface (UI) for activating the second camera interface on a first display area in a first camera interface.

According to an example embodiment, the processor may be configured to adjust electrical signals with respect to the first transparent area and the second transparent area to be different from each other in the second camera interface.

According to an example embodiment, the processor may be configured to provide different transparencies for the first transparent area and the second transparent area in the second camera interface.

Figure 26:
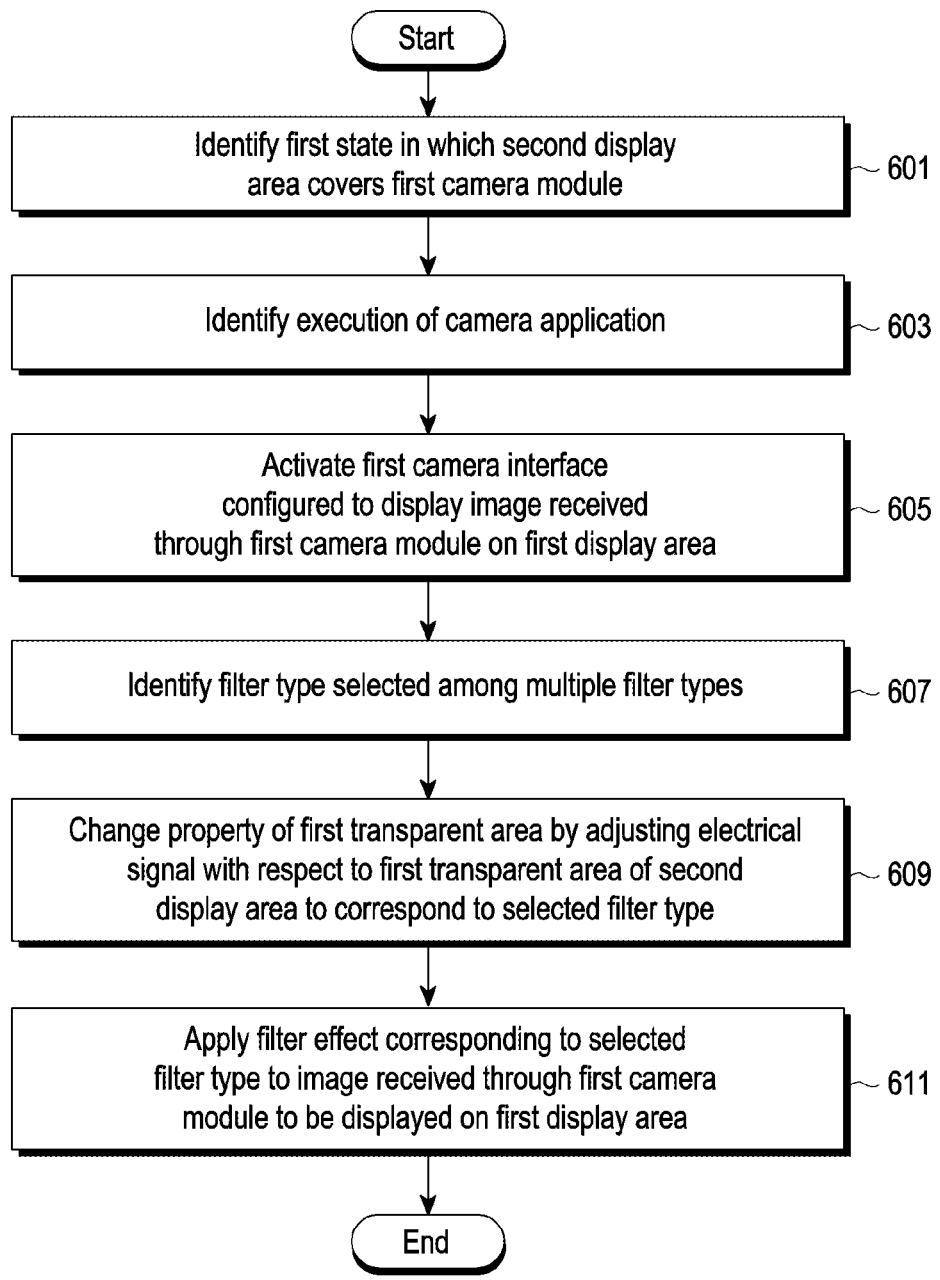
FIG. 26 is a flowchart illustrating an example operation of using a transparent display in an electronic apparatus according to various embodiments.

FIG. 26 is a flowchart illustrating an example operation of using a transparent display in an electronic apparatus according to various embodiments. The operation of using the transparent display may include operation 601 to operation 611. According to an embodiment, at least one of operation 601 to operation 611 may be omitted, the order of some operations may be changed, or another operation may be added.

In operation 601, an electronic apparatus (e.g., the electronic apparatus 101 in FIG. 1, the electronic apparatus 200 in FIG. 2, or the electronic apparatus 501 in FIG. 25) may identify a first state in which a second display area 563 (e.g., the second display area 234 in FIG. 2) covers a first camera module 581 (e.g., the rear camera module 284 in FIG. 2).

According to an embodiment, the electronic apparatus may identify a first state (e.g., the first state s1 in FIG. 2) in which the transparent second display area 563 of the display 560 covers the first camera module 581.

In operation 603, an electronic apparatus (e.g., the electronic apparatus 101 in FIG. 1, the electronic apparatus 200 in FIG. 2, or the electronic apparatus 501 in FIG. 25) may identify execution of a camera application.

In operation 605, an electronic apparatus (e.g., the electronic apparatus 101 in FIG. 1, the electronic apparatus 200 in FIG. 2, or the electronic apparatus 501 in FIG. 25) may activate a first camera interface (e.g., a preview mode for general photographing) for displaying an image received through a first camera module 581 (e.g., the rear camera module 284 in FIG. 2) on a first display area 561 (e.g., the first display area 232 in FIG. 2).

In operation 607, an electronic apparatus (e.g., the electronic apparatus 101 in FIG. 1, the electronic apparatus 200 in FIG. 2, or the electronic apparatus 501 in FIG. 25) may identify selection of a first filter type among multiple filter types.

According to an embodiment, the electronic apparatus may display multiple filter types according to a user request on the first camera interface and identify a filter type selected by the user among the multiple filter types.

In operation 609, an electronic apparatus (e.g., the electronic apparatus 101 in FIG. 1, the electronic apparatus 200 in FIG. 2, or the electronic apparatus 501 in FIG. 25) may adjust an electrical signal with respect to a first transparent area of a second display area 563 (e.g., the second display area 234 in FIG. 2) to correspond to the selected filter type so as to change a property of the first transparent area.

In operation 611, an electronic apparatus (e.g., the electronic apparatus 101 in FIG. 1, the electronic apparatus 200 in FIG. 2, or the electronic apparatus 501 in FIG. 25) may apply a filter effect corresponding to the selected filter type to an image received through a first camera module 581 (e.g., the rear camera module 284 in FIG. 2) and the image to which the filter effect is applied on a first display area 561 (e.g., the first display area 232 in FIG. 2).

According to an embodiment, the filter type which may be provided by adjusting an electrical signal with respect to the first transparent area of the second display area 563 may include an ultraviolet filter (UV filter), a neutral density filter (ND filter), a circular polarizing filter (CPL filter), a cross filter, and a polarizing filter.

According to an embodiment, the electronic apparatus may express a color in software on the first transparent area of the second display area 563 and provide various color filters and/or gradation filters while light is input to the first camera module 583.

Figure 27:
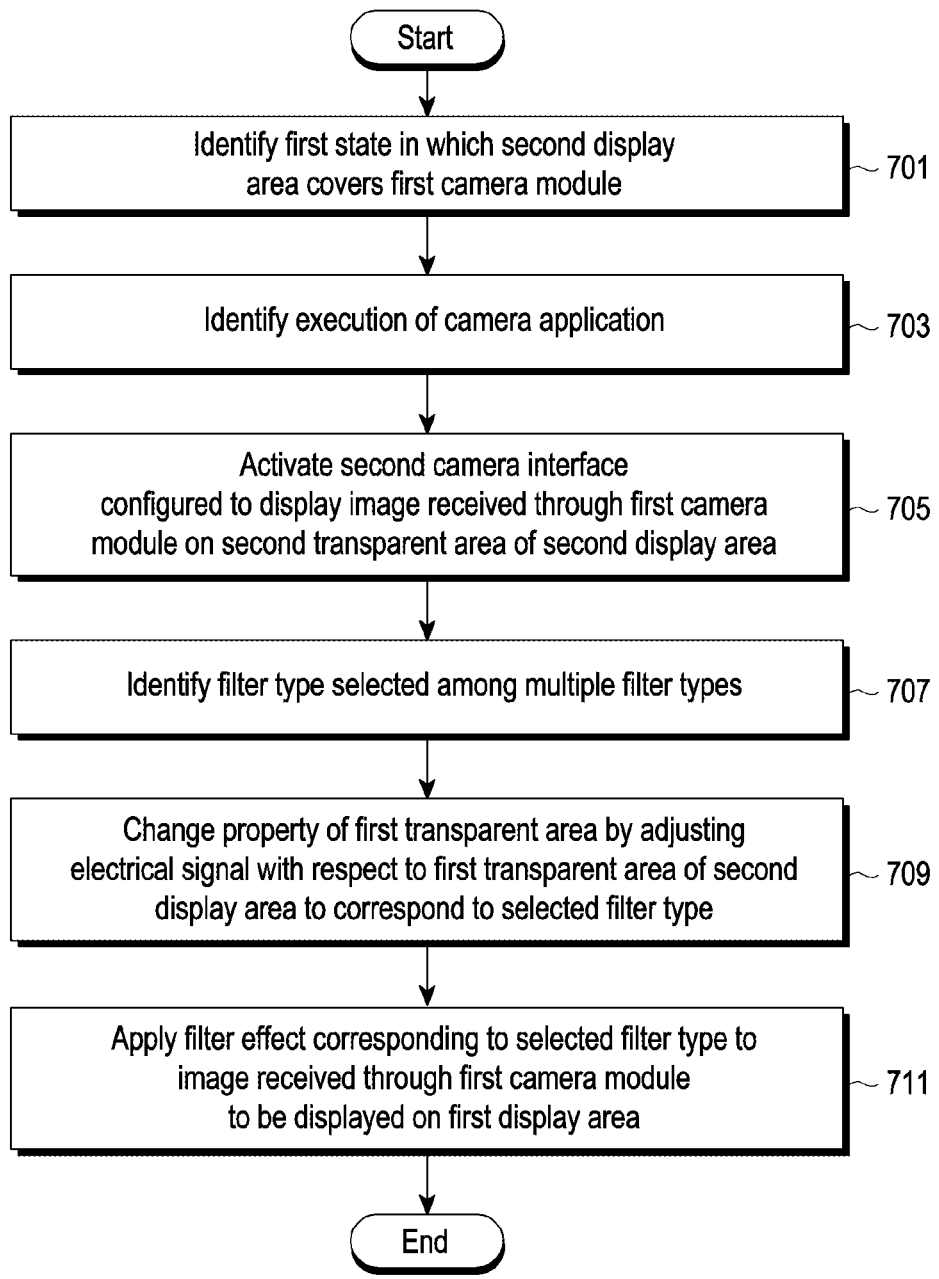
FIG. 27 is a flowchart illustrating an example operation of using a transparent display in an electronic apparatus according to various embodiments.

FIG. 27 is a flowchart illustrating an example operation of using a transparent display in an electronic apparatus according to various embodiments. The operation of using the transparent display may include operation 701 to operation 711. According to an embodiment, at least one of operation 701 to operation 711 may be omitted, the order of some operations may be changed, or another operation may be added.

In operation 701, an electronic apparatus (e.g., the electronic apparatus 101 in FIG. 1, the electronic apparatus 200 in FIG. 2, or the electronic apparatus 501 in FIG. 25) may identify a first state in which a second display area 563 (e.g., the second display area 234 in FIG. 2) covers a first camera module 581 (e.g., the rear camera module 284 in FIG. 2).

According to an embodiment, the electronic apparatus may identify a first state (e.g., the first state s1 in FIG. 2) in which the transparent second display area 563 of the display 560 covers the first camera module 581.

In operation 703, an electronic apparatus (e.g., the electronic apparatus 101 in FIG. 1, the electronic apparatus 200 in FIG. 2, or the electronic apparatus 501 in FIG. 25) may identify execution of a camera application.

In operation 705, an electronic apparatus (e.g., the electronic apparatus 101 in FIG. 1, the electronic apparatus 200 in FIG. 2, or the electronic apparatus 501 in FIG. 25) may activate a second camera interface (e.g., a preview mode for selfie photographing) for displaying an image received through a first camera module 581 (e.g., the rear camera module 284 in FIG. 2) on a second transparent area of a second display area 563 (e.g., the second display area 234 in FIG. 2).

According to an embodiment, the electronic apparatus may display a UI for activating the second user interface on the first display area 561 in the first camera interface configured to display an image on the first display area 561 (e.g., the first display area 232 in FIG. 2) and activate the second camera interface in case the UI is selected.

In operation 707, an electronic apparatus (e.g., the electronic apparatus 101 in FIG. 1, the electronic apparatus 200 in FIG. 2, or the electronic apparatus 501 in FIG. 25) may identify selection of a first filter type among multiple filter types.

According to an embodiment, the electronic apparatus may display multiple filter types according to a user request on the second camera interface and identify a filter type selected by the user among the multiple filter types.

In operation 709, an electronic apparatus (e.g., the electronic apparatus 101 in FIG. 1, the electronic apparatus 200 in FIG. 2, or the electronic apparatus 501 in FIG. 25) may adjust an electrical signal with respect to a first transparent area of a second display area 563 (e.g., the second display area 234 in FIG. 2) to correspond to the selected filter type so as to change a property of the first transparent area.

In operation 711, an electronic apparatus (e.g., the electronic apparatus 101 in FIG. 1, the electronic apparatus 200 in FIG. 2, or the electronic apparatus 501 in FIG. 25) may apply a filter effect corresponding to the selected filter type to an image received through a first camera module 581 (e.g., the rear camera module 284 in FIG. 2) and the image to which the filter effect is applied on a second transparent area of a second display area 563 (e.g., the second display area 234 in FIG. 2).

According to an embodiment, the filter type which may be provided by adjusting an electrical signal with respect to the first transparent area of the second display area 563 may include an ultraviolet filter (UV filter), a neutral density filter (ND filter), a circular polarizing filter (CPL filter), a cross filter, and a polarizing filter.

According to an embodiment, the electronic apparatus may express a color in software on the first transparent area of the second display area 563 and provide various color filters and/or gradation filters while light is input to the first camera module 583.

Figure 28A:
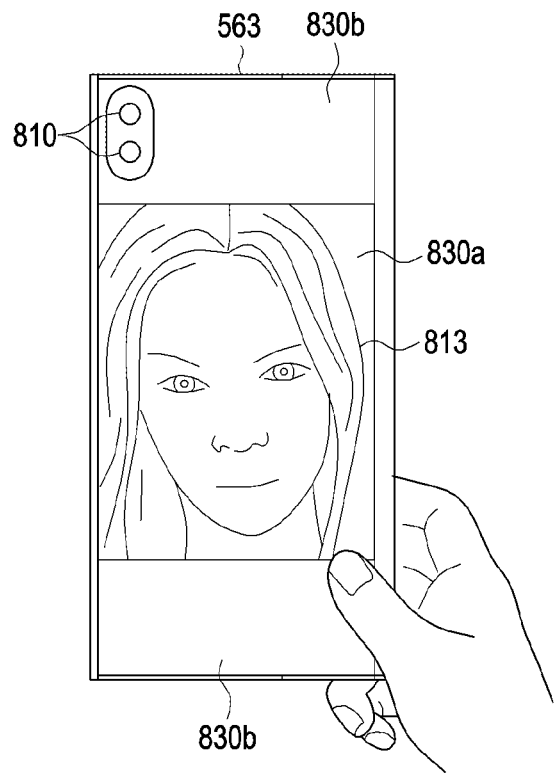
FIG. 28A, FIG. 28B and FIG. 28C are diagrams illustrating an example operation of using a transparent display in an electronic apparatus according to various embodiments.
Figure 28B:
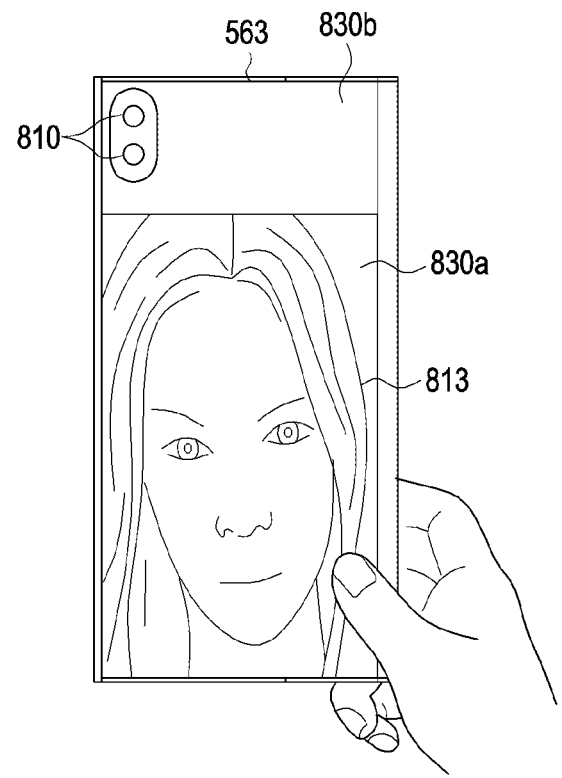
Figure 28C:
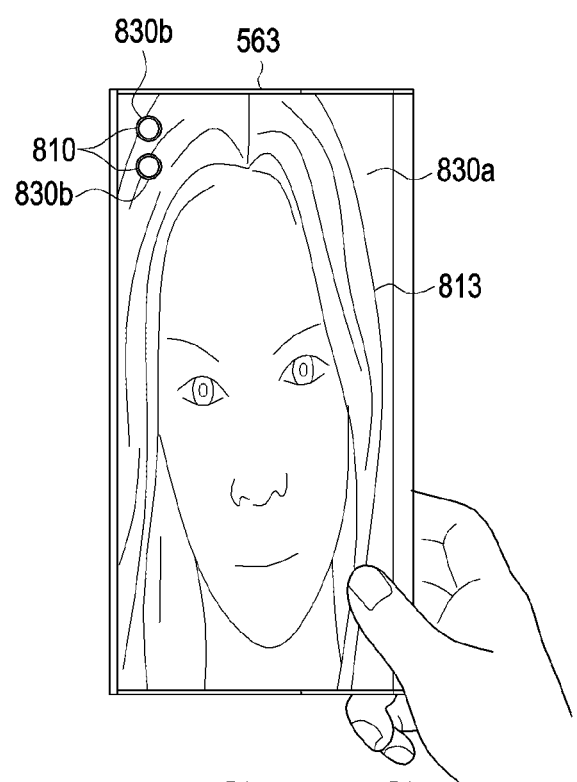

FIG. 28A, FIG. 28B and FIG. 28C are diagrams illustrating an example operation of using a transparent display in an electronic apparatus according to various embodiments.

As shown in FIG. 28A, in case that a second camera interface (e.g., a preview mode for selfie photographing) is activated, an electronic apparatus (e.g., the electronic apparatus 101 in FIG. 1, the electronic apparatus 200 in FIG. 2, or the electronic apparatus 501 in FIG. 25) may divide a second display area 563 (e.g., the second display area 234 in FIG. 2) configured to cover a first camera module 581 (e.g., the rear camera module 284 in FIG. 2) into a first transparent area 810 abutting to the first camera module 581 and a second transparent area 830a or 830b for displaying an image 813 received from the first camera module 581. The electronic apparatus may divide the second transparent area into a first area 830a for displaying an image and a second area 830b for not displaying an image and display an image. The electronic apparatus may include a predetermined area of an upper end and a predetermined area of a lower end of the second display area 563 as the second area 830b. The electronic apparatus may reflect a lowest transparency value to the first area 830a and display an image 813, and may reflect a highest transparency value to the second area 830b and display various icons corresponding to various functions used for a second camera interface.

As shown in FIG. 28B, in case that a second camera interface (e.g., a preview mode for selfie photographing) is activated, an electronic apparatus (e.g., the electronic apparatus 101 in FIG. 1, the electronic apparatus 200 in FIG. 2, or the electronic apparatus 501 in FIG. 25) may divide a second display area 563 (e.g., the second display area 234 in FIG. 2) configured to cover a first camera module 581 (e.g., the rear camera module 284 in FIG. 2) into a first transparent area 810 abutting to the first camera module 581 and a second transparent area 830a or 830b for displaying an image 813 received from the first camera module 581. The electronic apparatus may divide the second transparent area into a first area 830a for displaying an image and a second area 830b for not displaying an image and display an image. The electronic apparatus may include a predetermined area of an upper end of the second display area 563 as the second area 830b. The electronic apparatus may reflect a lowest transparency value to the first area 830a and display an image 813, and may reflect a highest transparency value to the second area 830b and display various icons corresponding to various functions used for a second camera interface.

As shown in FIG. 28C, in case that a second camera interface (e.g., a preview mode for selfie photographing) is activated, an electronic apparatus (e.g., the electronic apparatus 101 in FIG. 1, the electronic apparatus 200 in FIG. 2, or the electronic apparatus 501 in FIG. 25) may divide a second display area 563 (e.g., the second display area 234 in FIG. 2) configured to cover a first camera module 581 (e.g., the rear camera module 284 in FIG. 2) into a first transparent area 810 abutting to the first camera module 581 and a second transparent area 830a or 830b for displaying an image 813 received from the first camera module 581. The electronic apparatus may divide the second transparent area into a first area 830a for displaying an image and a second area 830b for not displaying an image and display an image. The electronic apparatus may include a predetermined area surrounding the first camera module 581 as the second area 830b. The electronic apparatus may reflect a lowest transparency value to the first area 830a and display an image 813, and may reflect a highest transparency value to the second area 830b for displaying.

Figure 29:
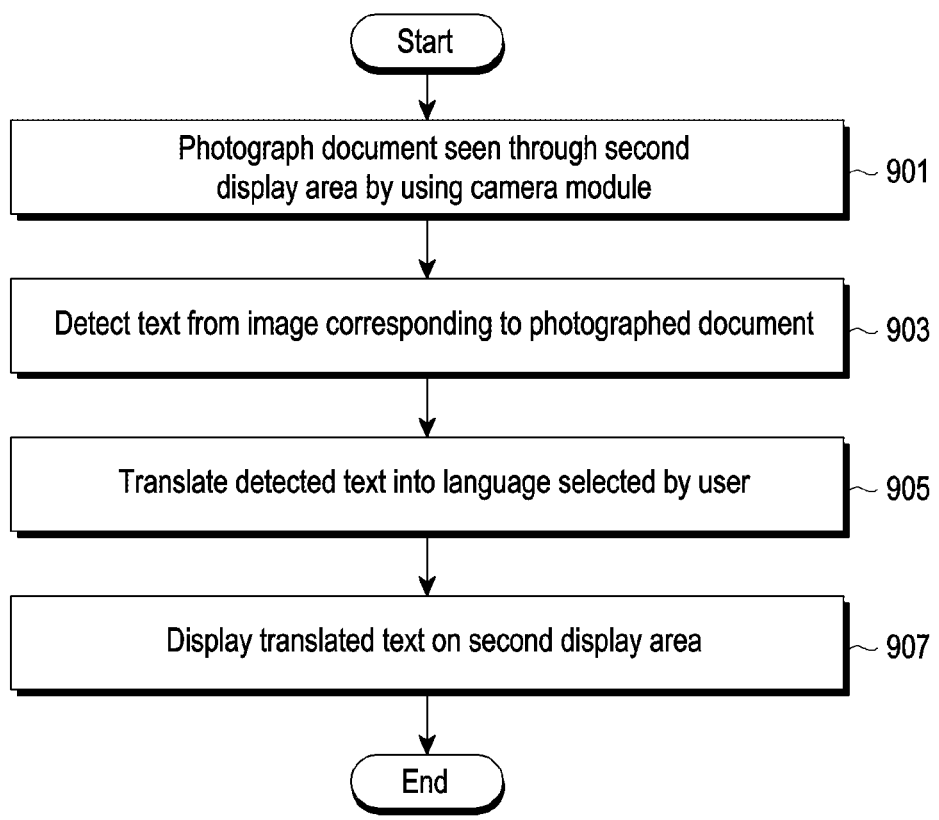
FIG. 29 is a flowchart illustrating an example operation of using a transparent display in an electronic apparatus according to various embodiments.

FIG. 29 is a flowchart illustrating an example operation of using a transparent display in an electronic apparatus according to a second embodiment among an embodiment of the disclosure. The operation of using the transparent display may include operation 901 to operation 907. According to an embodiment, at least one of operation 901 to operation 907 may be omitted, the order of some operations may be changed, or another operation may be added.

In operation 901, an electronic apparatus (e.g., the electronic apparatus 101 in FIG. 1, the electronic apparatus 200 in FIG. 2, or the electronic apparatus 501 in FIG. 25) may photograph a document displayed on the second display area 563 (e.g., the second display area 234 in FIG. 2) using the camera module 580.

According to an embodiment, in a state in which the second display area 563 of the display 230 is opened (e.g., one of the second state s2 to the fifth state s5 in FIG. 6B to FIG. 6E, and the sixth state s6 to the ninth state s9 in FIG. 8A to FIG. 8D), the electronic apparatus may photograph an image corresponding a document seen through the transparent second display area 563 through the camera module 580.

According to an embodiment, the electronic apparatus may use a rotatable camera module which may be additionally included in the camera module 580 and photograph an image corresponding to a document seen through the transparent second display area 563 through the camera module in a state in which the camera module is rotated to face the second display area 563.

In operation 903, an electronic apparatus (e.g., the electronic apparatus 101 in FIG. 1, the electronic apparatus 200 in FIG. 2, or the electronic apparatus 501 in FIG. 25) may detect text from an image corresponding to the photographed document.

According to an embodiment, the electronic apparatus may detect the text from the image corresponding to the photographed document using a text detection algorithm.

In operation 905, an electronic apparatus (e.g., the electronic apparatus 101 in FIG. 1, the electronic apparatus 200 in FIG. 2, or the electronic apparatus 501 in FIG. 25) may translate the detected text into a language selected by a user.

According to an embodiment, the electronic apparatus may translate the detected text into a language selected by a user using a translation algorithm.

According to an embodiment, the electronic apparatus may display, on the first display area 561 (e.g., the first display area 232 in FIG. 2), language types which may be selected by a user.

In operation 907, an electronic apparatus (e.g., the electronic apparatus 101 in FIG. 1, the electronic apparatus 200 in FIG. 2, or the electronic apparatus 501 in FIG. 25) may display the translated text on the second display area 563 (e.g., the second display area 234 in FIG. 2).

According to an embodiment, the translated text may be displayed on the second display area 563 to have an inclination identical to that of text included in the document seen through the second display area 563.

Figure 30:
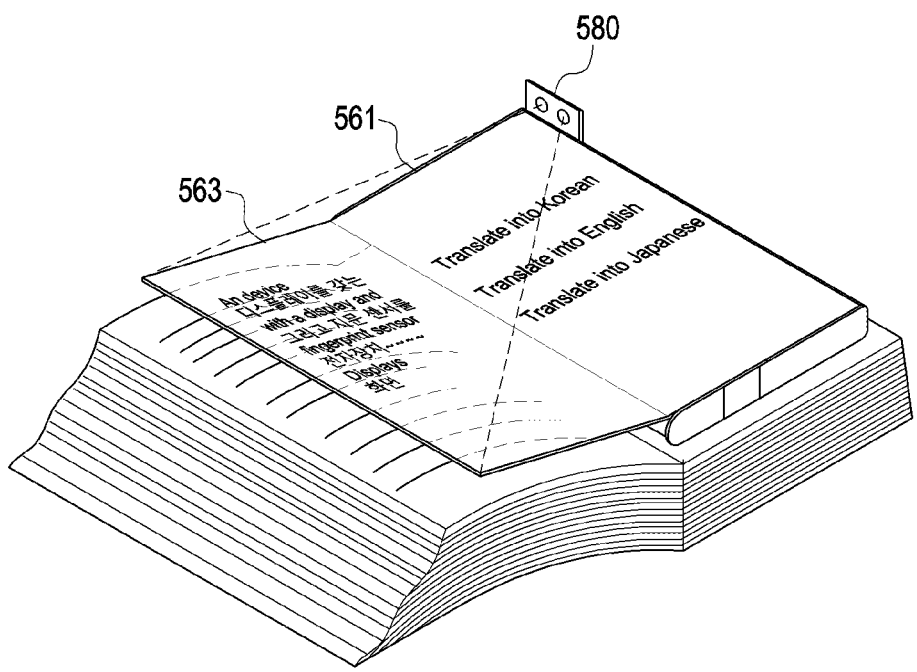
FIG. 30 is a perspective view illustrating an example operation of using a transparent display in an electronic apparatus according to various embodiments.

FIG. 30 is a diagram illustrating an example operation of using a transparent display in an electronic apparatus according to various embodiments.

Referring to FIG. 30, in case that an electronic apparatus (e.g., the electronic apparatus 101 in FIG. 1, the electronic apparatus 200 in FIG. 2, or the electronic apparatus 501 in FIG. 25) in a state in which the second display area 563 (e.g., the second display area 234 in FIG. 2) is opened (e.g., one of the second state s2 to the fifth state s5 in FIG. 6B to FIG. 6E, and the sixth state s6 to the ninth state s9 in FIG. 8A to FIG. 8D) is located on a specific page of a book, the electronic apparatus may photograph an image corresponding to a specific page seen through the second display area 563 through the rotatable camera module 580 facing the second display area 563. The electronic apparatus may detect text from an image corresponding to the photographed specific page and translate the text (e.g., English) into a language (e.g., Korean) selected by a user among languages displayed on the first display area 561 (e.g., the first display area 232 in FIG. 2). The electronic apparatus may display the translated text (e.g., English) on the second display area 563.

Figure 31:
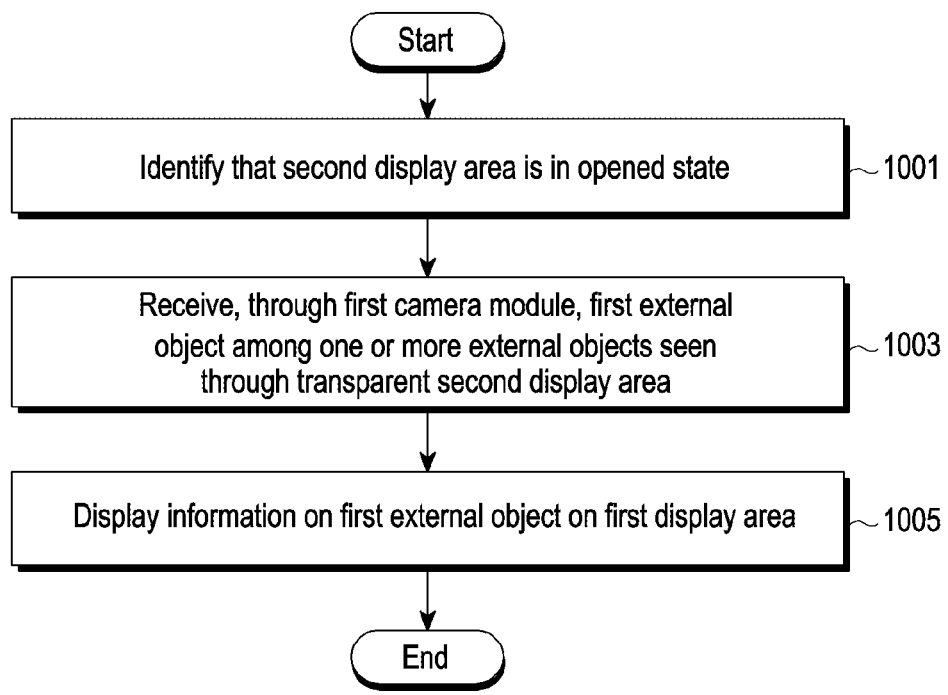
FIG. 31 is a flowchart illustrating an example operation of using a transparent display in an electronic apparatus according to various embodiments.

FIG. 31 is a flowchart illustrating an example operation of using a transparent display in an electronic apparatus according to various embodiments. The operation of using the transparent display may include operation 1001 to operation 1005. According to an embodiment, at least one of an operation 1001 to an operation 1005 may be omitted, the order of some operations may be changed, or another operation may be added.

In operation 1001, an electronic apparatus (e.g., the electronic apparatus 101 in FIG. 1, the electronic apparatus 200 in FIG. 2, or the electronic apparatus 501 in FIG. 25) may identify a state in which the second display area 563 (e.g., the second display area 234 in FIG. 2) is opened (e.g., the fifth state s5 in FIG. 6E).

In operation 1003, an electronic apparatus (e.g., the electronic apparatus 101 in FIG. 1, the electronic apparatus 200 in FIG. 2, or the electronic apparatus 501 in FIG. 25) may receive a first external object through a first camera module 581 (e.g., the rear camera module 284 in FIG. 2) among one or more external objects seen through the transparent second display area 563.

In operation 1005, an electronic apparatus (e.g., the electronic apparatus 101 in FIG. 1, the electronic apparatus 200 in FIG. 2, or the electronic apparatus 501 in FIG. 25) may display information on the first external object on the first display area 561 (e.g., the first display area 232 in FIG. 2).

According to an embodiment, the electronic apparatus may display, on the first display area 561, information on the first external object received through the first camera module 581 from among one or more external objects seen through the transparent second display area 563 while displaying at least one external object on the second display area 563.

According to an embodiment, the electronic apparatus may search for information on the first external object by searching through the memory 530 or/and the Internet, etc.

Figure 32:
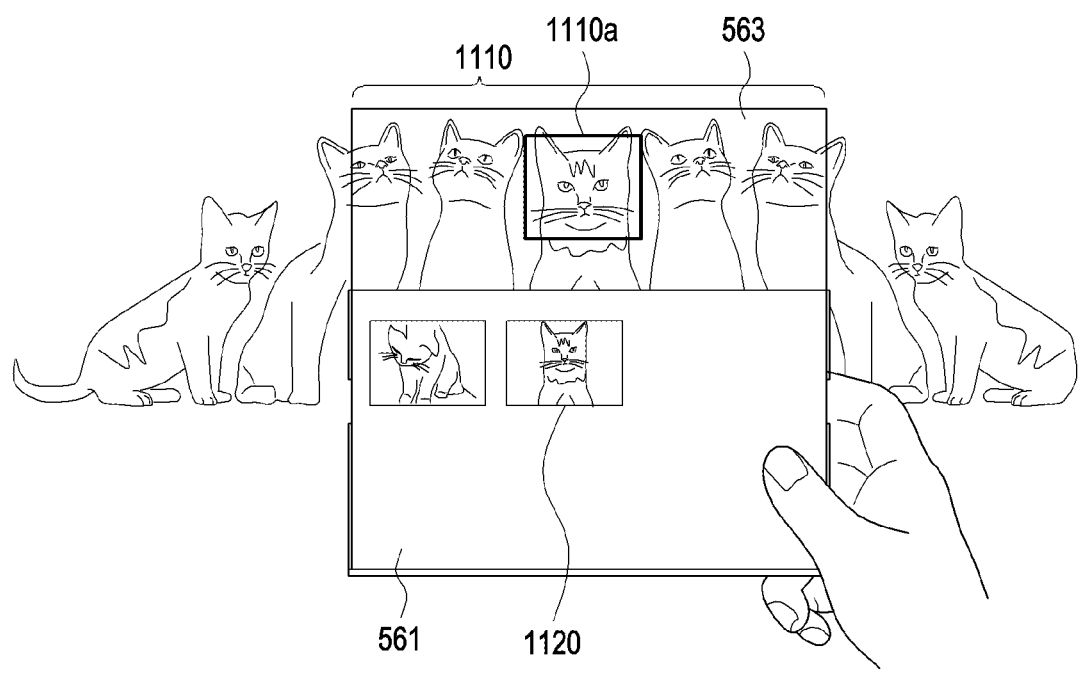
FIG. 32 is a diagram illustrating an example operation of using a transparent display in an electronic apparatus according to various embodiments.

FIG. 32 is a diagram illustrating an example operation of using a transparent display in an electronic apparatus according to various embodiments.

Referring to FIG. 32, in a state in which a second display area 563 (e.g., the second display area 234 in FIG. 2) is opened (e.g., the fifth state s5 in FIG. 6E), an electronic apparatus (e.g., the electronic apparatus 101 in FIG. 1, the electronic apparatus 200 in FIG. 2, or the electronic apparatus 501 in FIG. 25) may display at least one external object 1110 (e.g., a cat) seen through the transparent second display area 563. The electronic apparatus may receive a first external object 1110a through the first camera module 581 (e.g., the rear camera module 284 in FIG. 2) from among one or more external objects 1110 seen through the transparent second display area 563. The electronic apparatus may display information 1120 on the first external object received through the first camera module 581 on the first display area 561 (e.g., the first display area 232 in FIG. 2) while display at least one external object 1110 seen through the transparent second display area 563.

Figure 33:
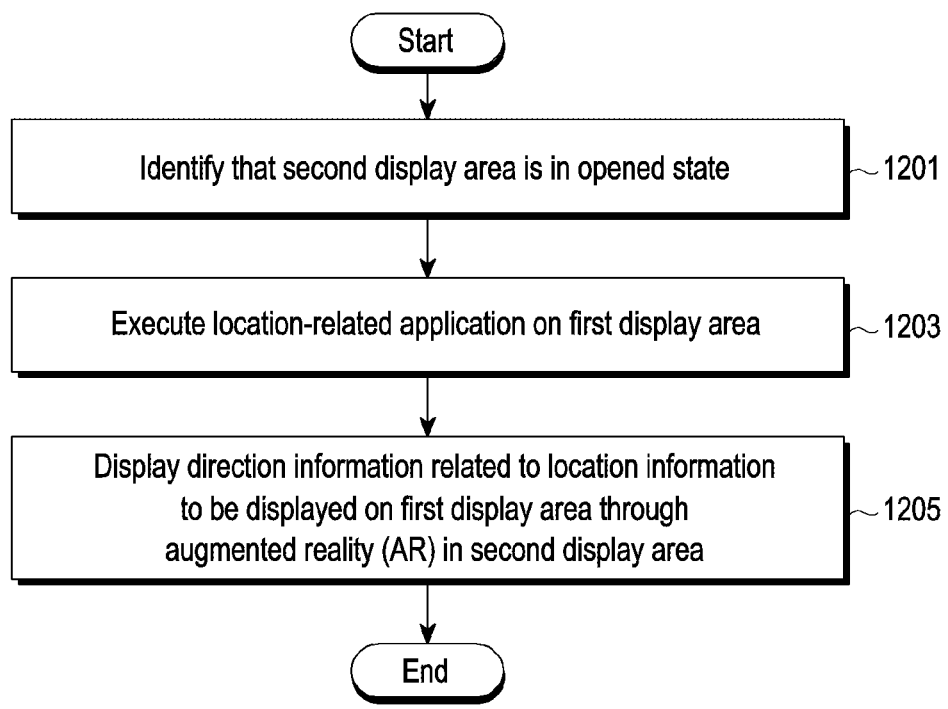
FIG. 33 is a flowchart illustrating an example operation of using a transparent display in an electronic apparatus according to various embodiments.

FIG. 33 is a flowchart illustrating an example operation of using a transparent display in an electronic apparatus according to various embodiments. The operation of using the transparent display may include operation 1201 to operation 1205. According to an embodiment, at least one of an operation 1201 to an operation 1205 may be omitted, the order of some operations may be changed, or another operation may be added.

In operation 1201, an electronic apparatus (e.g., the electronic apparatus 101 in FIG. 1, the electronic apparatus 200 in FIG. 2, or the electronic apparatus 501 in FIG. 25)

may identify a state in which the second display area 563 (e.g., the second display area 234 in FIG. 2) is opened (e.g., the fifth state s5 in FIG. 6E).

In operation 1203, an electronic apparatus (e.g., the electronic apparatus 101 in FIG. 1, the electronic apparatus 200 in FIG. 2, or the electronic apparatus 501 in FIG. 25) may execute a location-related application on the first display area 561 (e.g., the first display area 232 in FIG. 2).

According to an embodiment, in a state in which the second display area 563 is opened (e.g., the fifth state s5 in FIG. 6E), the electronic apparatus may display location information indicating a guide to a destination selected by a user while displaying a location-related application (e.g., a navigation application) on the first display area 561.

In operation 1205, an electronic apparatus (e.g., the electronic apparatus 101 in FIG. 1, the electronic apparatus 200 in FIG. 2, or the electronic apparatus 501 in FIG. 25) may display direction information related to the location information displayed on the first display area 561 (e.g., the first display area 232 in FIG. 2) through augmented reality (AR) in the second display area 563 (e.g., the second display area 234 in FIG. 2).

According to an embodiment, the electronic apparatus may recognize, through the first camera module 581 (e.g., the rear camera module 284 in FIG. 2), a current place (e.g., an actual street) seen through the transparent second display area 563 and detect a current location of an electronic apparatus 501 and a travel direction from the current location to a destination using a sensor module (e.g., the sensor module 176 in FIG. 1) included in the electronic apparatus. During displaying location information indicating guiding to a destination input by a user by executing a location-related application (e.g., a navigation application) on the first display area 561, the electronic apparatus may display direction information to a destination from a current location (e.g., a real street) through augmented reality (AR) in the second display area 563.

Figure 34:
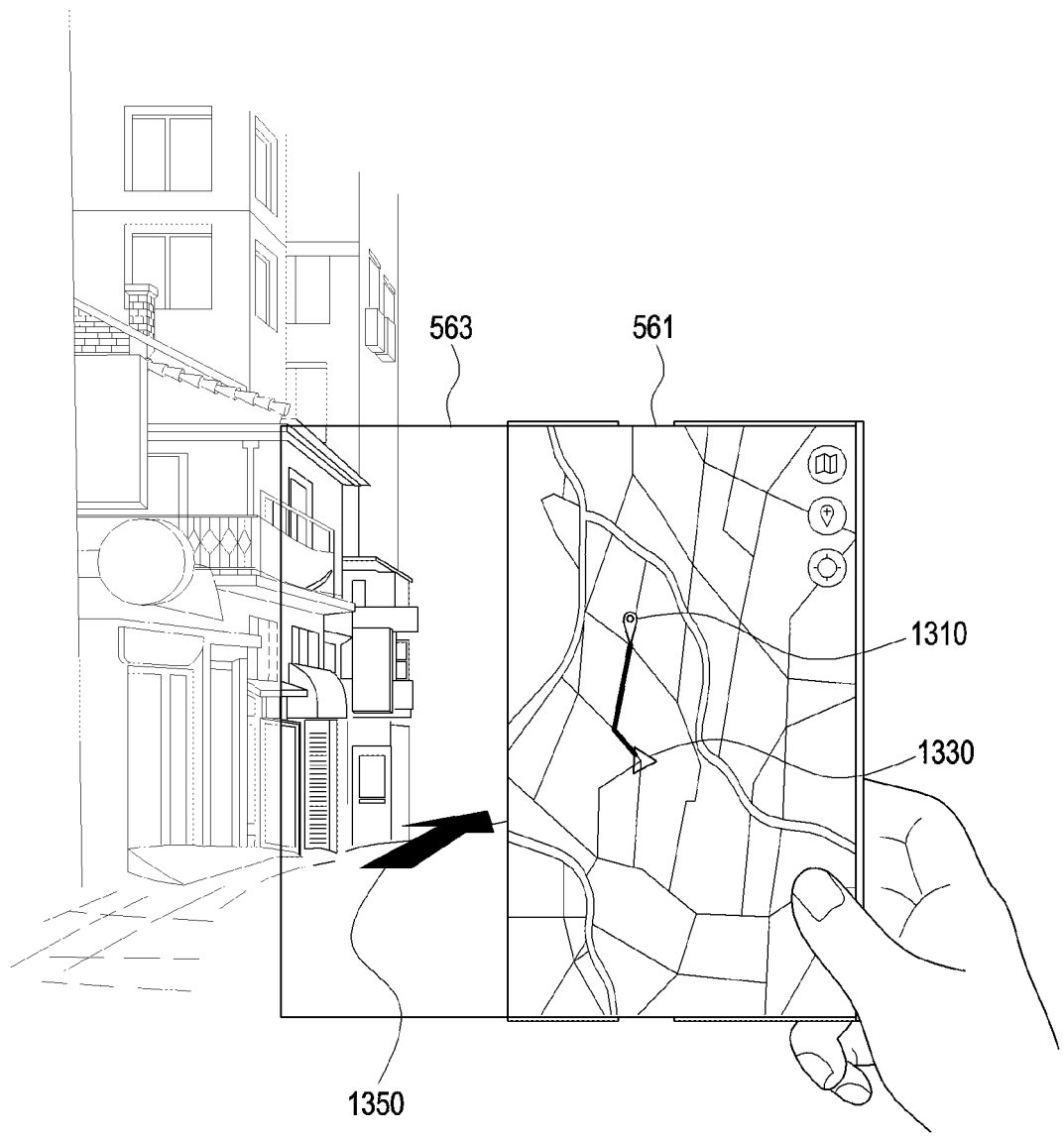
FIG. 34 is a diagram illustrating an example operation of using a transparent display in an electronic apparatus according to various embodiments.

FIG. 34 is a view illustrating an operation of using a transparent display in an electronic apparatus according to a fourth embodiment among an embodiment of the disclosure.

Referring to FIG. 34, while displaying location information 1330 indicating a guide to a destination 1310 input by a user by executing a location-related application (e.g., a navigation application) on the first display area 561 (e.g., the first display area 232 in FIG. 2) in a state in which the second display area 563 (e.g., the second display area 234 in FIG. 2) is opened (e.g., the fifth state s5 in FIG. 6E), an electronic apparatus (e.g., the electronic apparatus 101 in FIG. 1, the electronic apparatus 200 in FIG. 2, or the electronic apparatus 501 in FIG. 25) may display direction information 1350 to guide to a destination 1310 in a current place (e.g., an actual street) through augmented reality (AR) on the second display area 563.

Figure 35:
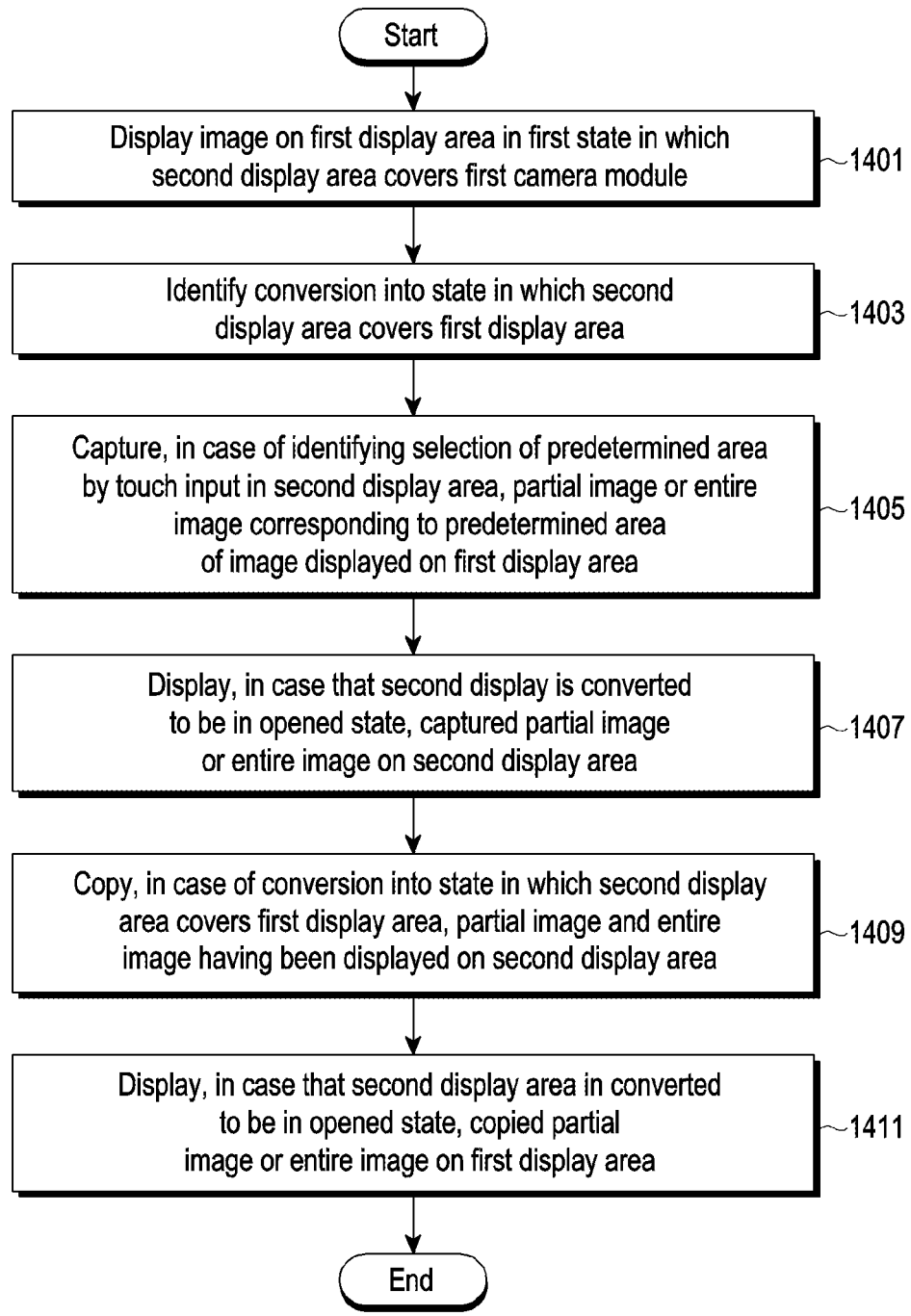
FIG. 35 is a flowchart illustrating an example operation of using a transparent display in an electronic apparatus according to various embodiments.

FIG. 35 is a flowchart illustrating an example operation of using a transparent display in an electronic apparatus according to various embodiments. The operation of using the transparent display may include operation 1401 to operation 1411. According to an embodiment, at least one of an operation 1401 to an operation 1411 may be omitted, the order of some operations may be changed, or another operation may be added.

In operation 1401, an electronic apparatus (e.g., the electronic apparatus 101 in FIG. 1, the electronic apparatus 200 in FIG. 2, or the electronic apparatus 501 in FIG. 25) may display an image (e.g., a photograph image or a video) on the first display area 561 (e.g., the first display area 232 in FIG. 2) in a first state (e.g., the first state s1 in FIG. 6A) in which the second display area 563 (e.g., the second display area 234 in FIG. 2) covers a first camera module (e.g., the rear camera module 234 in FIG. 2).

In operation 1403, an electronic apparatus (e.g., the electronic apparatus 101 in FIG. 1, the electronic apparatus 200 in FIG. 2, or the electronic apparatus 501 in FIG. 25) may identify conversion into a state in which a second display area 563 (e.g., the second display area 234 in FIG. 2) covers a first display area 581 (e.g., the first display area 231 in FIG. 2).

In operation 1405, in case of identifying that a predetermined area on the second display area 563 (e.g., the second display area 234 in FIG. 2) is selected by a touch input, an electronic apparatus (e.g., the electronic apparatus 101 in FIG. 1, the electronic apparatus 200 in FIG. 2, or the electronic apparatus 501 in FIG. 25) may capture a partial image or entire image corresponding to the predetermined area of an image displayed on the first display area 581 (e.g., the first display area 231 in FIG. 2).

In operation 1407, in case that the second display area 563 (e.g., the second display area 234 in FIG. 2) is converted to be in an opened state (e.g., one of the first state s1 to the fifth state s5 and the sixth state s6 to the ninth state s9 in FIG. 2), an electronic apparatus (e.g., the electronic apparatus 101 in FIG. 1, the electronic apparatus 200 in FIG. 2, or the electronic apparatus 501 in FIG. 25) may display the captured partial image or entire image on the second display area.

In operation 1409, in case that a second display area 563 (e.g., the second display area 234 in FIG. 2) is converted to be in a state of covering a first display area 581 (e.g., the first display area 231 in FIG. 2), an electronic apparatus (e.g., the electronic apparatus 101 in FIG. 1, the electronic apparatus 200 in FIG. 2, or the electronic apparatus 501 in FIG. 25) may copy the partial image or entire image being displayed on the second display area.

In operation 1411, in case that the second display area 563 (e.g., the second display area 234 in FIG. 2) is converted to be in an opened state (e.g., one of the first state s1 to the fifth state s5 and the sixth state s6 to the ninth state s9 in FIG. 2), an electronic apparatus (e.g., the electronic apparatus 101 in FIG. 1, the electronic apparatus 200 in FIG. 2, or the electronic apparatus 501 in FIG. 25) may display the copied partial image or entire image on the first display area 581 (e.g., the first display area 231 in FIG. 2).

Figure 36A:
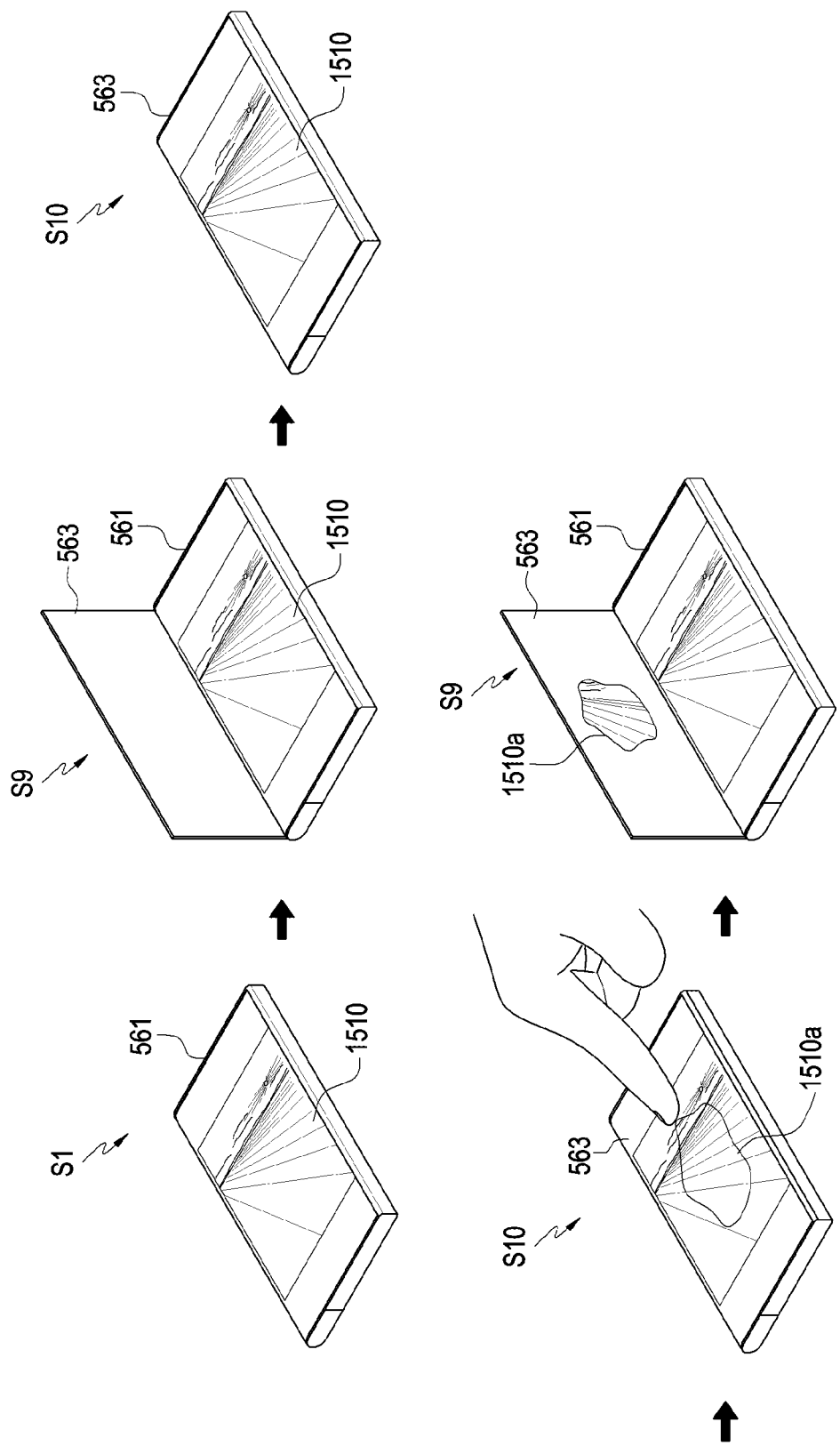
FIG. 36A and FIG. 36B are perspective views illustrating an example operation of using a transparent display in an electronic apparatus according to various embodiments.
Figure 36B:
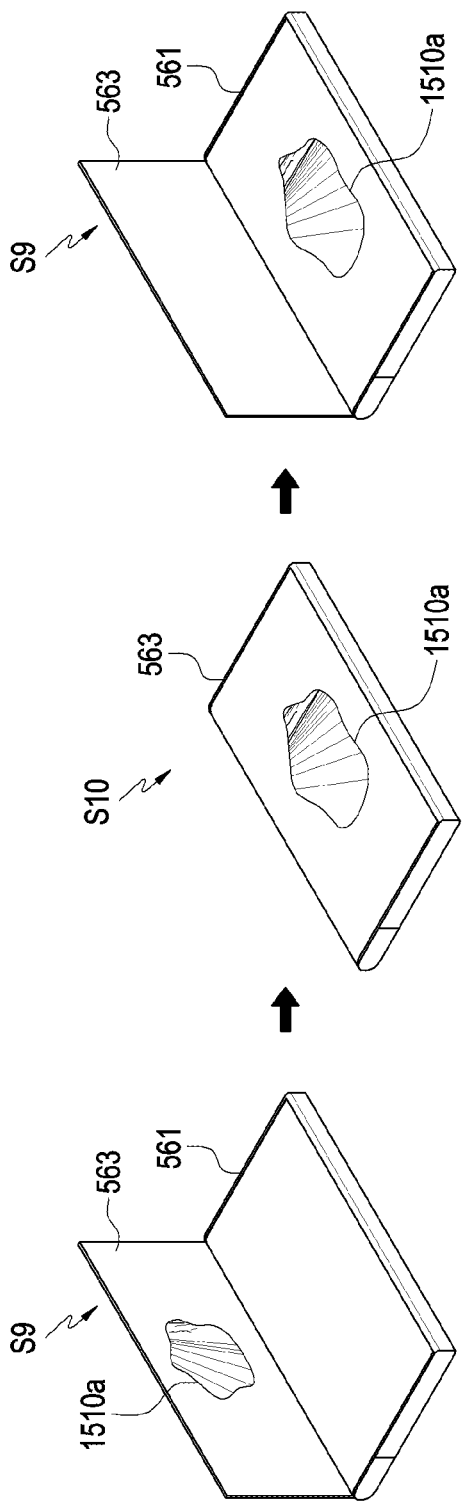

FIG. 36A and FIG. 36B are various perspective views illustrating an example operation of using a transparent display in an electronic apparatus according to various embodiments.

Figure 8A:
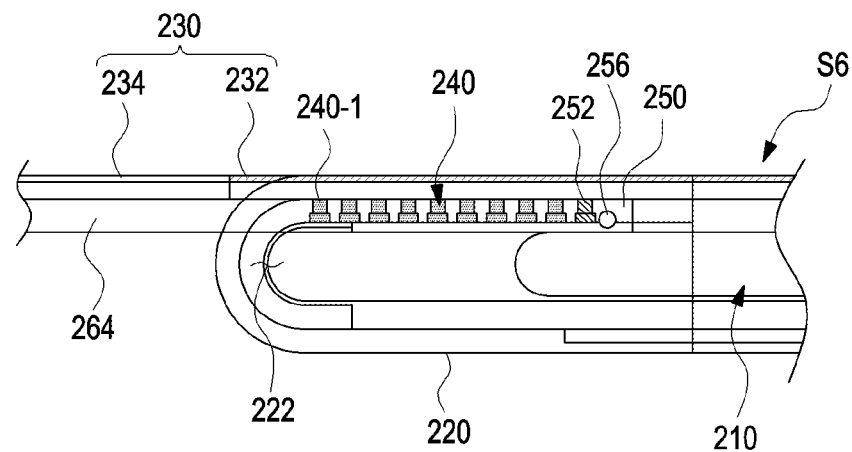
FIG. 8A, FIG. 8B, FIG. 8C, and FIG. 8D are diagrams illustrating an operation in which a second display area is tilted based on slide movement of a second housing according to various embodiments.
Figure 8B:
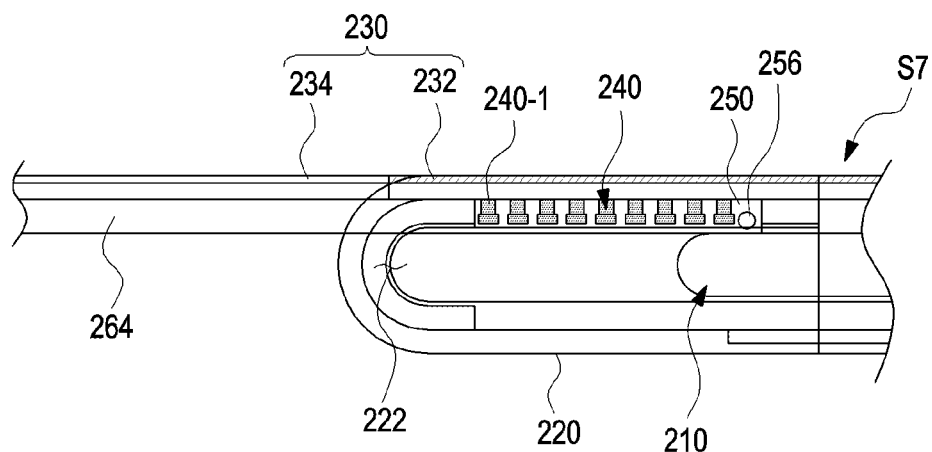
Figure 8C:
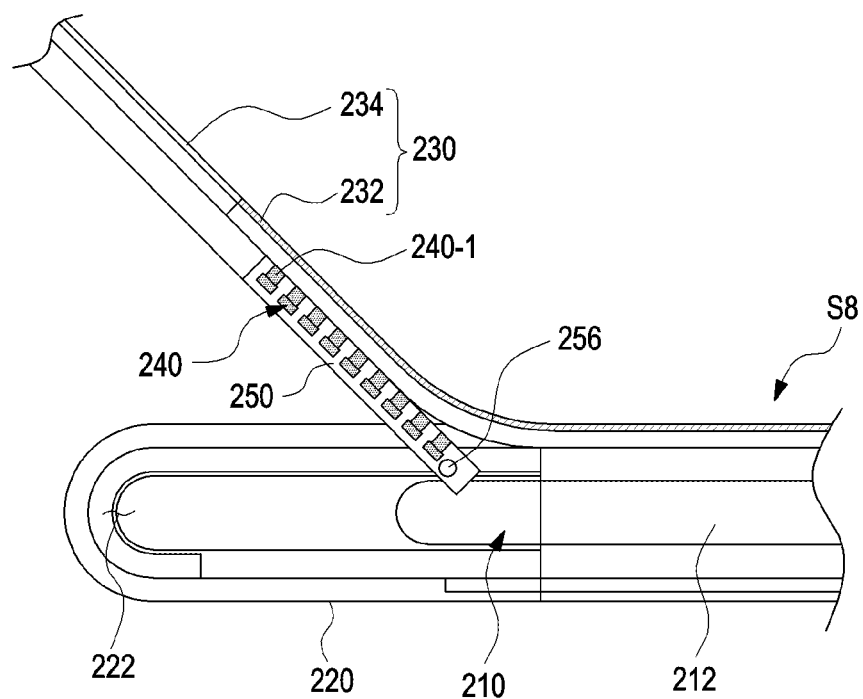
Figure 8D:
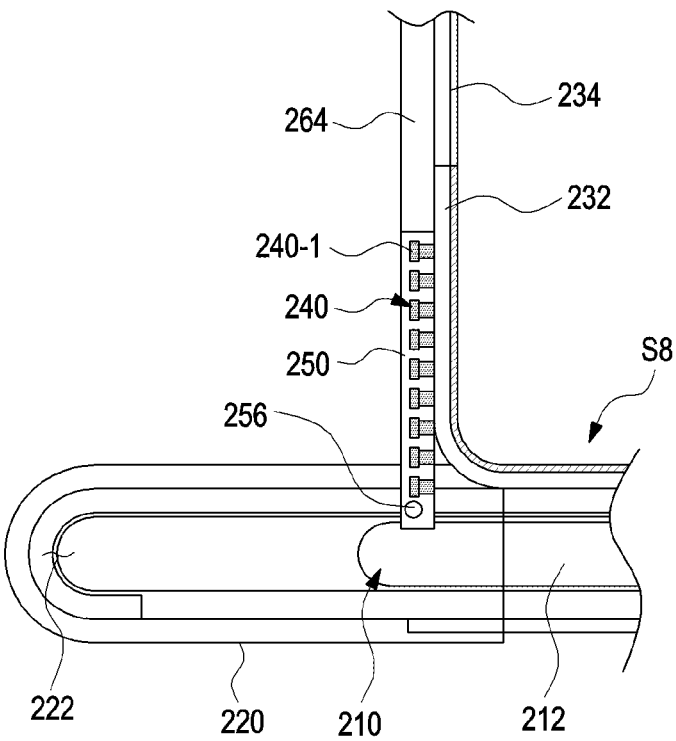

As shown in FIG. 36A, while displaying an image 1510 on the first display area 561 (e.g., the first display area 232 in FIG. 2) in a first state s1 (e.g., the first state s1 in FIG. 6A) in which the second display area 563 (e.g., the second display area 234 in FIG. 2) covers a first camera module (e.g., the rear camera module 234 in FIG. 2), an electronic apparatus (e.g., the electronic apparatus 101 in FIG. 1, the electronic apparatus 200 in FIG. 2, or the electronic apparatus 501 in FIG. 25) may identify conversion into a state s10 in which the second display area 563 covers the first display area 561 through a state s9 in which the second display area 563 is opened (e.g., the ninth state s9 in FIG. 8D). While an image 1510 displayed on the first display area 561 is seen through the transparent second display area 563 in a state s10 in which the second display area 563 covers the first display area 561, in case that a predetermined area is drawn through a touch input on the second display area 563, the electronic apparatus may capture a partial image 1510a corresponding to the predetermined area of the image 1510. In case that the second display area 563 is converted to be in an opened state s9 (e.g., the ninth state s9 in FIG. 8D), the electronic apparatus may display the captured partial image 1510*a* on the second display area 563.

Referring to FIG. 36B, in case that the second display area 563 is converted to be in a state s10 of covering the first display area 561 while displaying the partial image 1510*a* on the second display area 563, the electronic apparatus may copy the partial image 1510*a* displayed on the second display area 563. In case that the second display area 563 is converted to be in an opened state s9 (e.g., the ninth state s9 in FIG. 8D), the electronic apparatus may display the copied partial image 1510*a* on the first display area 561. During executing and displaying a text application or a messenger application on the first display area 561, in case that the second display area 563 is converted to be in a state s10 of covering the first display area 561, the electronic apparatus may transmit the partial image 1510*a* having been displayed on the second display area 563 to a counterpart selected through the text application or a counterpart conducting a conversation with the messenger application.

Figure 37A:
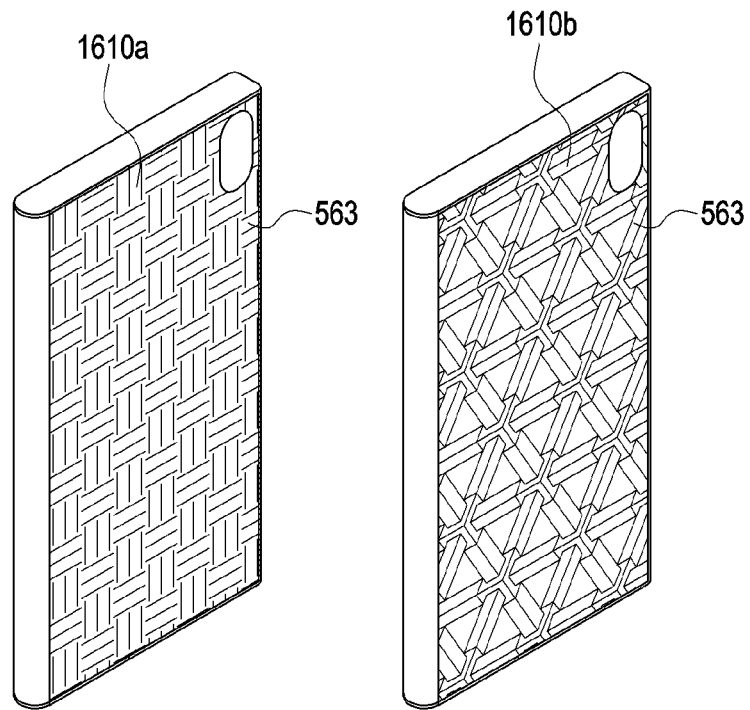
FIG. 37A and FIG. 37B are diagrams illustrating an example operation of using a transparent display in an electronic apparatus according to various embodiments.
Figure 37B:
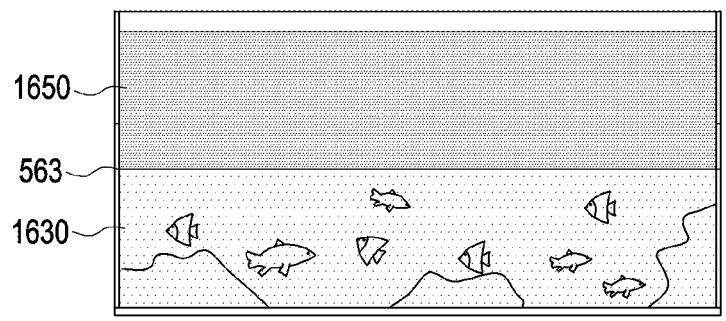

FIG. 37A and FIG. 37B are diagrams of various views illustrating an example operation of using a transparent display in an electronic apparatus according to various embodiments.

Referring to FIG. 37A, in case that a first state (e.g., the first state s1 in FIG. 6A) in which the second display area 563 (e.g., the second display area 234 in FIG. 2) covers a first camera module 581 (e.g., the rear camera module 284 in FIG. 2) is set to be a basic state, an electronic apparatus (e.g., the electronic apparatus 101 in FIG. 1, the electronic apparatus 200 in FIG. 2, or the electronic apparatus 501 in FIG. 25) may generate and display CMF (color, material, finish) image 1610*a* or 1610*b* on the second display area 563.

Referring to FIG. 37B, the electronic apparatus may generate and display a first CMF image 1630 corresponding to a fish tank image on a portion of the second display area 563 and generate and display a second CMF image 1650 for making another portion of the second display area 563 to be opaque.

Figure 38:
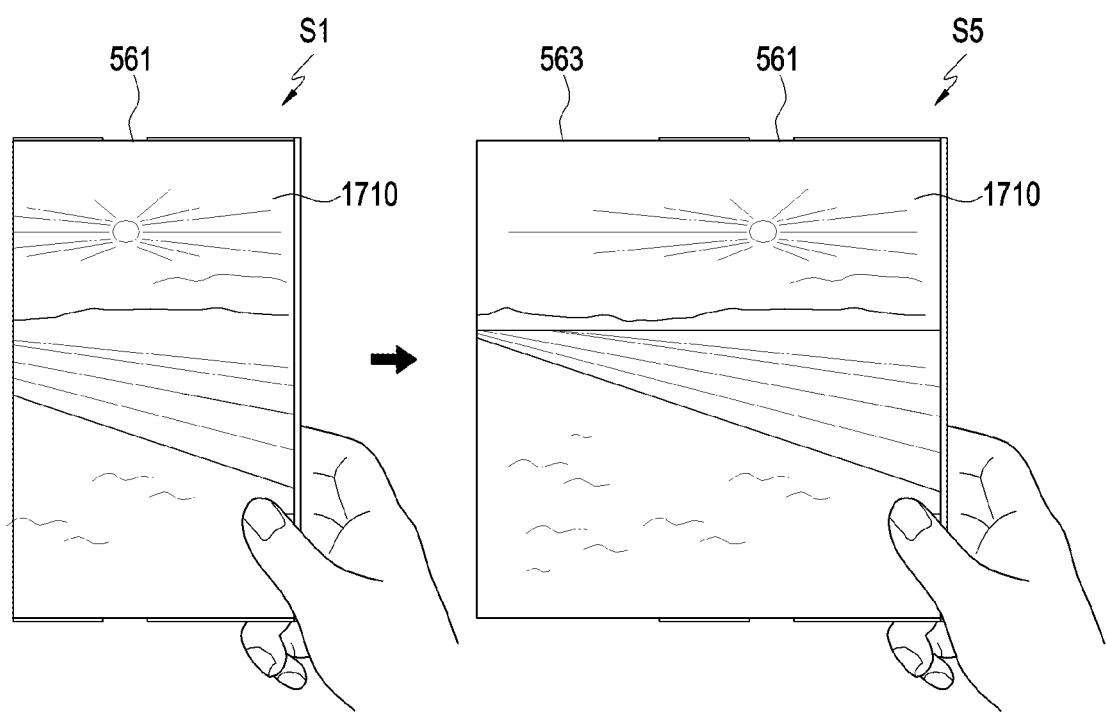
FIG. 38 is a diagram illustrating an example operation of using a transparent display in an electronic apparatus according to various embodiments.

FIG. 38 is a diagram illustrating an example operation of using a transparent display in an electronic apparatus according to various embodiments.

Referring to FIG. 38, while displaying an image 1710 in a first state s1 (e.g., the first state s1 in FIG. 6A) in which the second display area 563 (e.g., the second display area 234 in FIG. 2) covers a first camera module 581 (e.g., the rear camera module 284 in FIG. 2), in case that the second display area 563 is converted be in an opened state s5 (e.g., the fifth state s5 in FIG. 2), an electronic apparatus (e.g., the electronic apparatus 101 in FIG. 1, the electronic apparatus 200 in FIG. 2, or the electronic apparatus 501 in FIG. 25) may display an image 1710 on the first display area 561 and the second display area 234 by performing a dual screen function which is used as one screen area. The electronic apparatus may display an image 1710 enlarged to correspond to a size of the first display area 561 and second display area 234.

Figure 39:
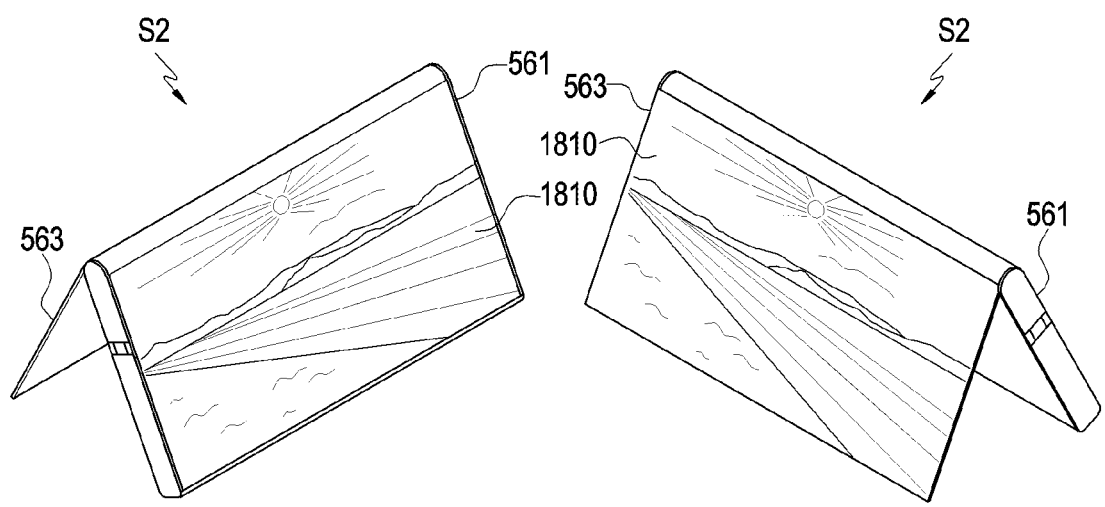
FIG. 39 includes perspective views illustrating an example operation of using a transparent display in an electronic apparatus according to various embodiments.

FIG. 39 is a diagram illustrating an example operation of using a transparent display in an electronic apparatus according to various embodiments.

Referring to FIG. 39, an electronic apparatus (e.g., the electronic apparatus 101 in FIG. 1, the electronic apparatus 200 in FIG. 2, or the electronic apparatus 501 in FIG. 25) may reproduce the same video 1810 on each of the first display area 561 (e.g., the first display area 232 in FIG. 2) and the second display area 563 in a state where the electronic apparatus 501 which is in a state s2 (e.g., the second state s2 in FIG. 6B) in which the second display area 563 (e.g., the second display area 234 in FIG. 2) is opened is erected in a self-standing state.

Figure 40:
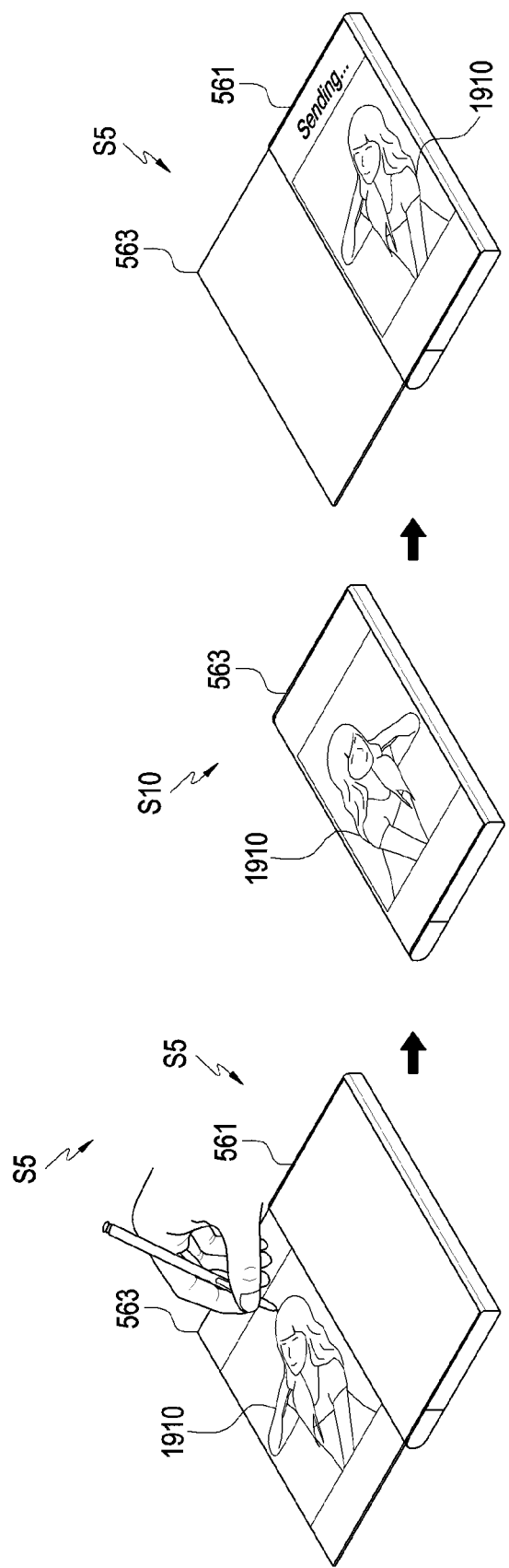
FIG. 40 is a perspective view illustrating an example operation of using a transparent display in an electronic apparatus according to various embodiments.

FIG. 40 is a series of perspective views illustrating an example operation of using a transparent display in an electronic apparatus according to various embodiments.

Referring to FIG. 40, in a state s5 in which a second display area 563 (e.g., the second display area 234 in FIG. 2) is opened (e.g., the fifth state s5 in FIG. 6E), an electronic apparatus (e.g., the electronic apparatus 101 in FIG. 1, the electronic apparatus 200 in FIG. 2, or the electronic apparatus 501 in FIG. 25) may identify that an image 1910 is drawn on the second display area 563 by a touch input. The electronic apparatus may store the image 1910 drawn on the second display area 563 in a file form in case that the second display area 563 is converted to be in a state s10 of covering the first display area 561, and transmit the image 1910 drawn on the second display 563 by a touch input to a counterpart conducting conversation through a messenger application or a counterpart input through a text application executed on the first display area 561 in case that the second display area 563 is converted to be in an opened state s5 (e.g., the fifth state s5 in FIG. 6E).

Figure 41A:
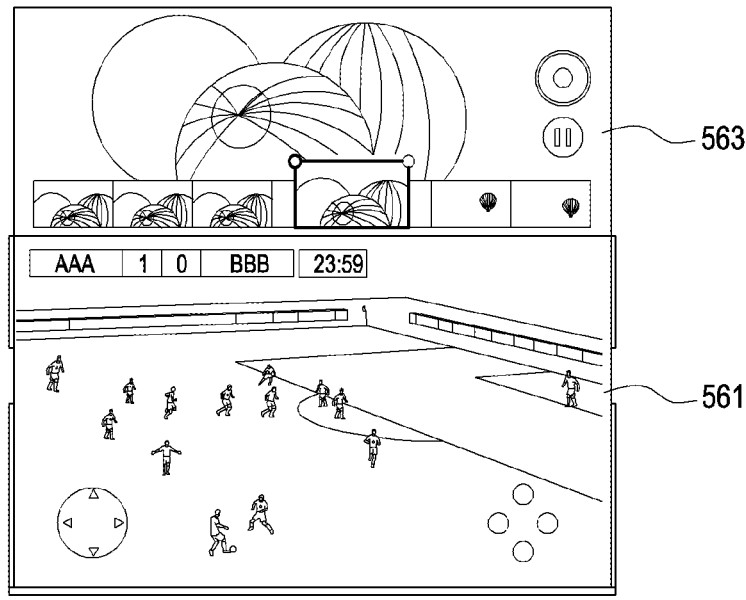
FIG. 41A and FIG. 41B are diagrams illustrating an example operation of using a transparent display in an electronic apparatus according to various embodiments.
Figure 41B:
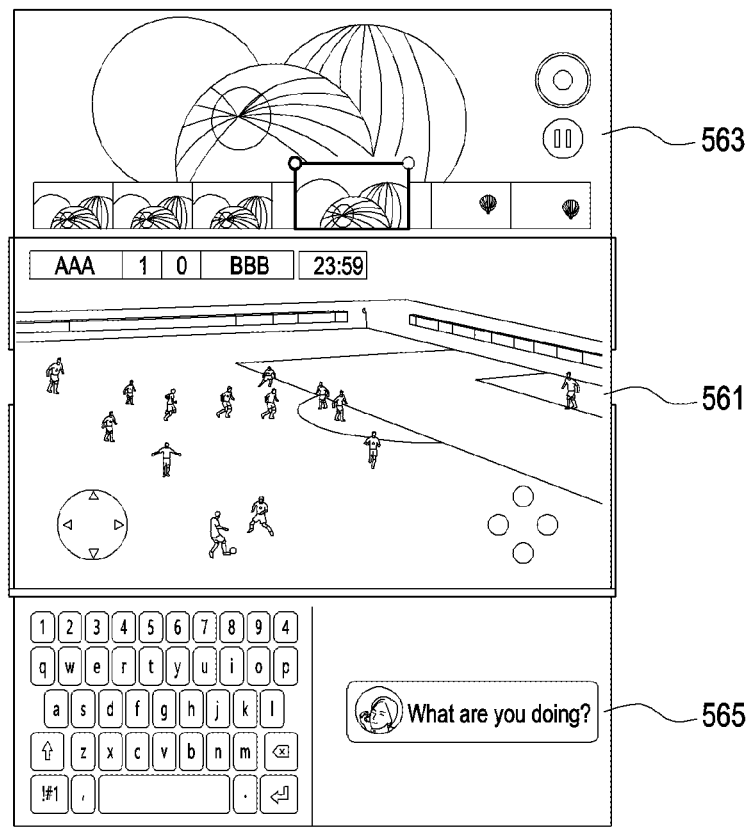

FIG. 41A and FIG. 41B are diagrams illustrating an example operation of using a transparent display in an electronic apparatus according to various embodiments.

Referring to FIG. 41A, an electronic apparatus (e.g., the electronic apparatus 101 in FIG. 1, the electronic apparatus 200 in FIG. 2, or the electronic apparatus 501 in FIG. 25) may execute a game application on the first display area 561 (e.g., the first display area 232 in FIG. 2) and reproduce a video on the second display area 563 in a state (e.g., the fifth state s5 in FIG. 6E) in which the second display area 563 (e.g., the second display area 234 in FIG. 2) is opened.

Referring to FIG. 41A, in case that the display module 560 includes a first display area 561, a second display area 563, and a third display area 565, an electronic apparatus (e.g., the electronic apparatus 101 in FIG. 1, the electronic apparatus 200 in FIG. 2, or the electronic apparatus 501 in FIG. 25) may display execution of a game application on the first display area 561, reproduce a video on the second display area 563, and display execution of a text application on the third display area 565 in a state in which the second display area 563 and the third display area 565 are opened.

Figure 42A:
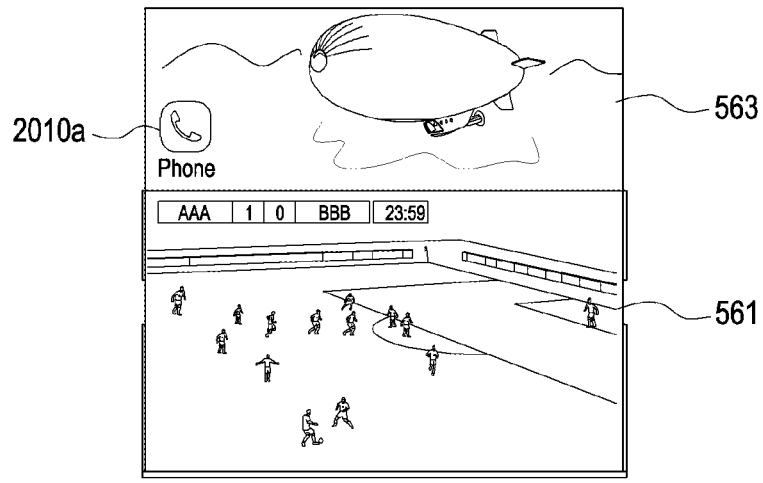
FIG. 42A and FIG. 42B are diagrams illustrating an example operation of using a transparent display in an electronic apparatus according to an eleventh embodiment among various embodiments.
Figure 42B:
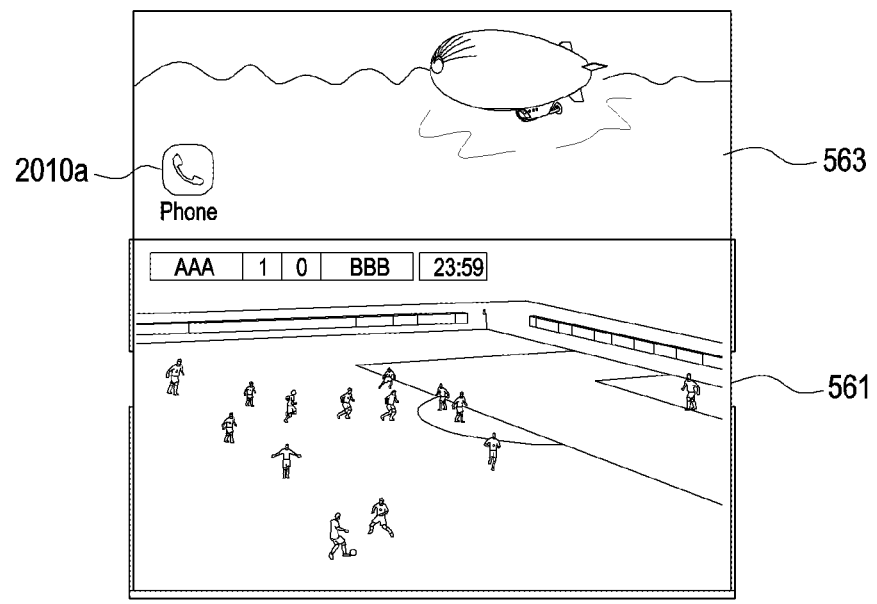

FIG. 42A and FIG. 42B are views illustrating an operation of using a transparent display in an electronic apparatus according to an eleventh embodiment among an embodiment of the disclosure.

Referring to FIG. 42A and FIG. 42B, an electronic apparatus (e.g., the electronic apparatus 101 in FIG. 1, the electronic apparatus 200 in FIG. 2, or the electronic apparatus 501 in FIG. 25) may display an icon 2010*a* related to calling while displaying execution of a game application on the first display area 561 (e.g., the first display area 232 in FIG. 2) and display a standby mode on the second display area 563 in a state (e.g., the fifth state s5 in FIG. 6E) in which the second display area 563 (e.g., the second display area 234 in FIG. 2) is opened.

As shown in FIG. 42A, in case of determining that a distance between a user and the electronic apparatus is long with reference to a threshold value, the electronic apparatus may adjust the icon 2010*a* related to calling displayed on the second display area 563 to correspond to a distance between the user and the electronic apparatus and display the icon in a large size.

As shown in FIG. 42B, in case of determining that a distance between a user and the electronic apparatus is short with reference to a threshold value, the electronic apparatus may adjust the icon 2010a related to calling displayed on the second display area 563 to correspond to a distance between the user and the electronic apparatus and display the icon in a small size.

According to an example embodiment of the disclosure, a method for using a transparent display in an electronic apparatus, in a flexible display including a first display and a transparent second display area, may comprise: executing a camera module application in a first state in which the second display area covers a first camera module of a camera module, and, based on a property of a first transparent area being changed by adjusting an electrical signal with respect to the first transparent area of the second display area abutting the first camera module; and reflecting a changed property of the first transparent area on an image received from the first camera module to display the image on a second transparent area of the second display area or the first display area.

According to an example embodiment, the second display area may extend from the first display area.

According to an example embodiment, the first camera module may include a front camera module and the second camera module may include a rear camera module.

According to an example embodiment, based on an electrical signal with respect to the first transparent area being adjusted to correspond to a filter type selected among multiple filter types so that a property of the first transparent area is changed, the method may further include: reflecting a filter effect corresponding to the selected filter type on an image received through the first camera module to be displayed on the first display area or the second transparent area.

According to an example embodiment, the method may further include: reflecting the changed property of the first transparent area on the image received from the first camera module to be displayed on the first display area in a first camera interface for displaying the image received from the first camera module on the first display area.

According to an example embodiment, the method may further include: reflecting the changed property of the first transparent area on the image received from the first camera module to be displayed on the second transparent area in a second camera interface for displaying the image received from the first camera module on the second transparent area of the second display area.

According to an example embodiment, based on a camera application being executed and an image received from the second camera module is selected to be displayed on the second transparent area of the second display area, the method may further include activating the second camera interface.

According to an example embodiment, the method may further include: displaying a user interface (UI) for activating the second camera interface on a first display area in a first camera interface.

According to an example embodiment, the method may further include: adjusting electrical signals with respect to the first transparent area and the second transparent area to be different from each other in the second camera interface.

According to an example embodiment, the method may further include: providing different transparencies for the first transparent area and the second transparent area in the second camera interface.

The electronic apparatus according to an embodiment may be one of various types of electronic apparatuses. The electronic apparatuses may include, for example, a portable communication device (e.g., a smartphone), a computer device, a portable multimedia device, a portable medical device, a camera, a wearable device, a home appliance, or the like. According to an embodiment of the disclosure, the electronic apparatuses are not limited to those described above.

It should be appreciated that an embodiment of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C", may include any one of, or all possible combinations of the items enumerated together in a corresponding one of the phrases. As used herein, such terms as "1st" and "2nd", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), the element may be coupled with the other element directly (e.g., wiredly), wirelessly, or via a third element.

As used in connection with an embodiment of the disclosure, the term "module" may include a unit implemented in hardware, software, or firmware, or any combination thereof, and may interchangeably be used with other terms, for example, "logic", "logic block", "part", or "circuitry". A module may be a single integral component, or a minimum unit or part thereof, adapted to perform one or more functions. For example, according to an embodiment, the module may be implemented in a form of an application-specific integrated circuit (ASIC).

According to an embodiment, each component (e.g., a module or a program) of the above-described components may include a single entity or multiple entities, and some of the multiple entities may be separately disposed in different components. According to an embodiment, one or more of the above-described components or operations may be omitted, or one or more other components or operations may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. According to an embodiment, operations performed by the module, the program, or another component may be carried out sequentially, in parallel, repeatedly, or heuristically, or one or more of the operations may be executed in a different order or omitted, or one or more other operations may be added.

The above-described various slidable electronic apparatuses and the method for using a transparent display in the electronic apparatuses are not limited to the embodiments and the drawings described above and it will be clear to those skilled in the art to which the disclosure pertains that various substitutions, modifications, and changes are possible within the technical scope of the disclosure. It will also be understood that any of the embodiment(s) described herein may be used in conjunction with any other embodiment(s) described herein.

What is claimed is:

1. An electronic apparatus comprising:
a first housing;
a second housing configured to slide with respect to the first housing, wherein the second housing comprises at least one first reception groove;
a display comprising a first display area which is a flexible display area and is located on the first housing and the second housing and a second display area extending from the first display area;
a rotation support disposed on the second housing and configured to rotate with respect to the second housing, the rotation support supporting a rear surface of the display; and
at least one pin coupled to the rear surface of the display and configured to move along the at least one first reception groove according to the second housing sliding with respect to the first housing.

2. The electronic apparatus of claim 1, wherein the rotation support comprises at least one second reception groove configured to receive the at least one pin, and
the at least one second reception groove is arranged to correspond to the at least one first reception groove.

3. The electronic apparatus of claim 1, wherein the display further comprises a display support comprising a flexible area configured to support the first display area and a rigid area configured to support the second display area, and
wherein the at least one pin is coupled to the flexible area.

4. The electronic apparatus of claim 3, wherein the display comprises a protrusion extending from the rigid area, and
the rotation support comprises a third reception groove configured to receive the protrusion.

5. The electronic apparatus of claim 3, wherein the flexible area comprises multiple bars or multiple through-holes.

6. The electronic apparatus of claim 1, wherein the first housing comprises a first surface facing the second housing and a connection area protruding from the first surface, and
the second housing comprises a fourth reception groove configured to receive the connection area.

7. The electronic apparatus of claim 6, wherein the second housing comprises a second surface facing the first surface, and
a second distance between the at least one pin and the second surface is reduced based on a first distance between the first surface and the second surface being increased.

8. The electronic apparatus of claim 7, wherein a size of a first angle between the second display area and the first display area is reduced based on the second distance being reduced.

9. The electronic apparatus of claim 1, further comprising a motor module including a motor configured to generate driving power for sliding movement of the second housing,
wherein the second housing comprises a rack gear connected to the motor module.

10. The electronic apparatus of claim 9, wherein the second housing comprises a second hook extending from the rack gear, and
the first housing comprises a first hook configured to be connected to the second hook.

11. The electronic apparatus of claim 1, further comprising a camera module including at least one camera,
wherein the second display area is configured to cover the camera module.

12. The electronic apparatus of claim 1, wherein the second housing comprises a fifth reception groove configured to receive the rotation support.

13. The electronic apparatus of claim 1, further comprising a third housing configured to slide with respect to the first housing,
wherein the first housing is located between at least the second housing and the third housing, and
the display comprises a third display area extending from the first display area and disposed on the third housing.

14. The electronic apparatus of claim 13, further comprising a multi joint hinge located between the third housing and the third display area and configured to guide movement of the third display area.

15. An electronic apparatus comprising:
a first housing;
a second housing including at least one first reception groove and configured to slide with respect to the first housing;
a display comprising a first display area disposed on the first housing and/or the second housing, a second display area extending from the first display area and a display support, wherein the display support comprises a flexible area configured to support the first display area and a rigid area configured to support the second display area;
at least one pin coupled to a rear surface of the display and configured to slide along the at least one first reception groove according to the second housing sliding with respect to the first housing; and
a rotation support disposed on the second housing and configured to rotate with respect to the second housing and arranged to correspond to the at least one first reception groove, wherein a rotation support supports the rear surface of the display and includes at least one second reception groove configured to receive the at least one pin.

16. The electronic apparatus of claim 15, wherein the display support comprises a protrusion extending from the rigid area, and
the rotation support comprises a third reception groove configured to receive the protrusion.

17. The electronic apparatus of claim 15, wherein the first housing comprises a first surface facing the second housing and a connection area protruding from the first surface, and
wherein the second housing comprises a fourth reception groove configured to receive the connection area.

18. The electronic apparatus of claim 15, further comprising a motor module including a motor configured to generate driving power for sliding movement of the second housing,
wherein the second housing comprises a rack gear connected to the motor module.

19. The electronic apparatus of claim 15, further comprising a third housing configured to slide with respect to the first housing, wherein the first housing is located between the second housing and the third housing.

\* \* \* \* \*